United States Patent [19]

Nakamura et al.

[11] Patent Number: 5,429,730
[45] Date of Patent: Jul. 4, 1995

[54] METHOD OF REPAIRING DEFECT OF STRUCTURE

[75] Inventors: Hiroko Nakamura; Haruki Komano, both of Yokohama; Kazuyoshi Sugihara, Yokosuka; Keiji Horioka, Yokohama; Mitsuyo Kariya, Tokyo; Soichi Inoue; Ichiro Mori, both of Yokohama, all of Japan; Katsuya Okumura, Poughkeepsie, N.Y.; Tadahiro Takigawa, Kawasaki, Japan; Toru Watanabe, Hopewell Junction, N.Y.; Motosuke Miyoshi, Tokyo, Japan; Yuichiro Yamazaki, Tokyo, Japan; Haruo Okano, Tokyo, Japan

[73] Assignee: Kabushiki Kaisha Toshiba, Kawasaki, Japan

[21] Appl. No.: 144,414

[22] Filed: Nov. 2, 1993

[30] Foreign Application Priority Data

Nov. 2, 1992 [JP] Japan .................................. 4-294536
Mar. 3, 1993 [JP] Japan .................................. 5-042834
Apr. 13, 1993 [JP] Japan .................................. 5-086370

[51] Int. Cl.⁶ .......................... C23C 14/34; B05D 3/06; B44C 1/22
[52] U.S. Cl. .............................. 204/192.34; 427/497; 427/534; 427/561; 427/526; 219/121.6; 250/492.1; 216/66; 216/67; 216/79
[58] Field of Search ....................... 204/192.11, 192.36, 204/192.34, 192.33, 192.37; 156/643, 646, 662; 250/492.1, 492.2, 492.3; 427/497, 525, 526, 527, 531, 561, 534; 219/121.6

[56] References Cited

U.S. PATENT DOCUMENTS

| | | | |
|---|---|---|---|
| 4,851,097 | 7/1989 | Hattori et al. | 204/298.36 X |
| 4,868,068 | 9/1989 | Yamaguchi et al. | |
| 4,874,460 | 10/1989 | Nadagawa et al. | 204/298.36 X |
| 4,936,968 | 6/1990 | Ohnishi et al. | 204/298.36 X |
| 4,952,421 | 8/1990 | Morimoto et al. | 427/531 X |
| 5,104,684 | 4/1992 | Tao et al. | 427/531 X |

FOREIGN PATENT DOCUMENTS

| | | |
|---|---|---|
| 58-106750 | 6/1983 | Japan . |
| 61-55943 | 3/1986 | Japan . |
| 3-16127 | 1/1991 | Japan . |
| 4-26846 | 1/1992 | Japan . |
| 4-50844 | 2/1992 | Japan . |
| 5-142756 | 6/1993 | Japan . |

OTHER PUBLICATIONS

Jpn. J. Appl. Phys., vol. 31, 1992, pp. 4468–4473, Part 1, No. 12B, Dec. 1992, Kunihiro Hosono, et al., "Novel Technique for Phase-Shifting-Mask Repair Using Focused-Ion-Beam Etch-Back Process".

K. Hosono, et al., Digest of the 5th International Micro Process Conference, Kawasaki, 1992, p. 198.

K. Hosono, et al., Extended Abstracts of the 53rd Autumn Meeting of the Japan Society of Applie 1992, 16p-L-14, Sep. 16, 1992.

*Primary Examiner*—Nam Nguyen
*Attorney, Agent, or Firm*—Oblon, Spivak, McClelland, Maier & Neustadt

[57] ABSTRACT

According to this invention, there is provided a method of repairing a bump defect of a structure obtained by forming a predetermined pattern on a substrate, having the steps of forming a first thin film consisting of a material different from that of the substrate on the substrate around the bump defect or close to the bump defect, forming a second thin film on the bump defect and the first thin film to flatten an upper surface of the second thin film, performing simultaneous removal of the bump defect and the thin films on an upper portion of the projecting defect and around the bump defect using a charged particle beam, and performing removal of the thin films left in the step of performing simultaneous removal.

54 Claims, 22 Drawing Sheets

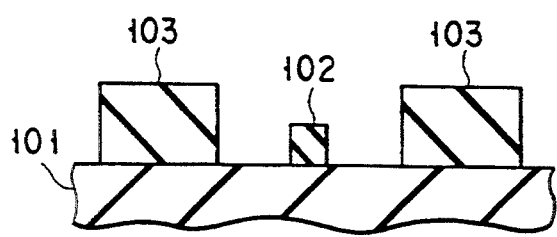
F I G. 2A-1
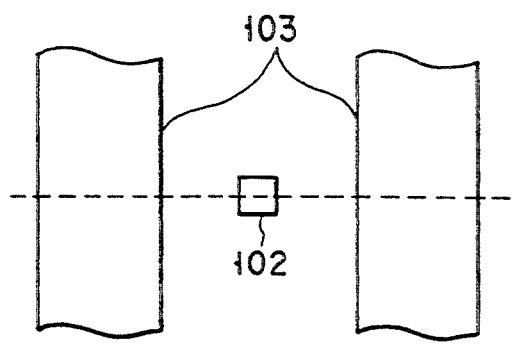
F I G. 2B-1
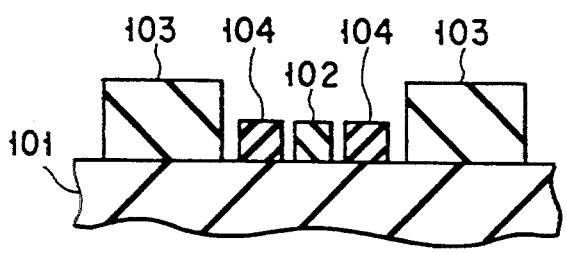
F I G. 2A-2
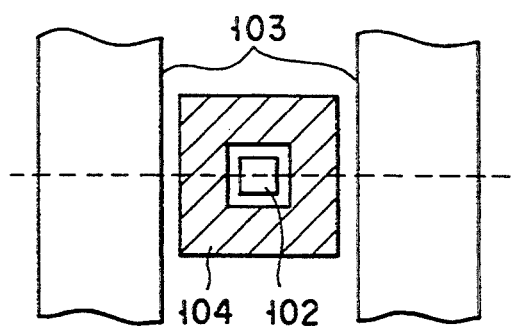
F I G. 2B-2
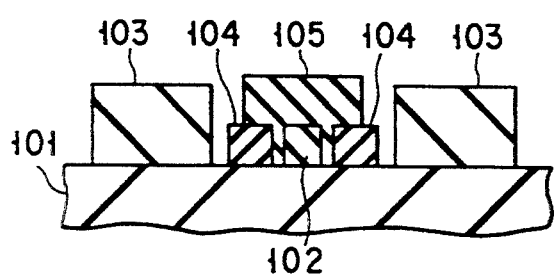
F I G. 2A-3
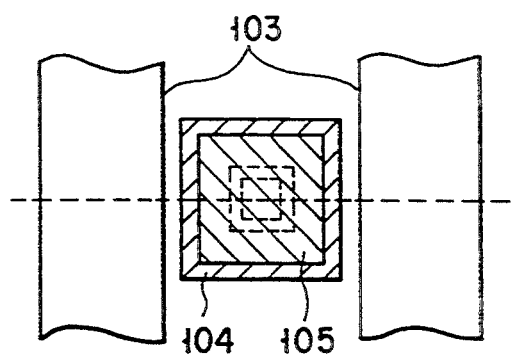
F I G. 2B-3

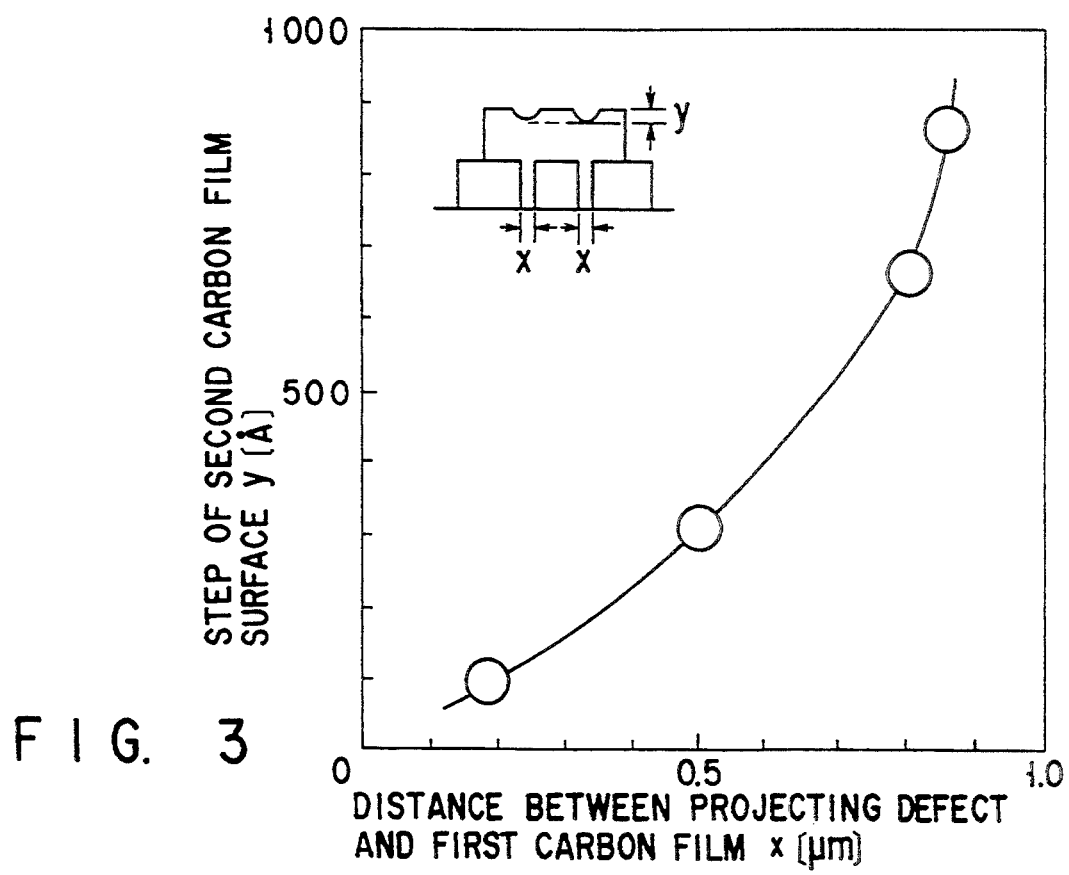
F I G. 3
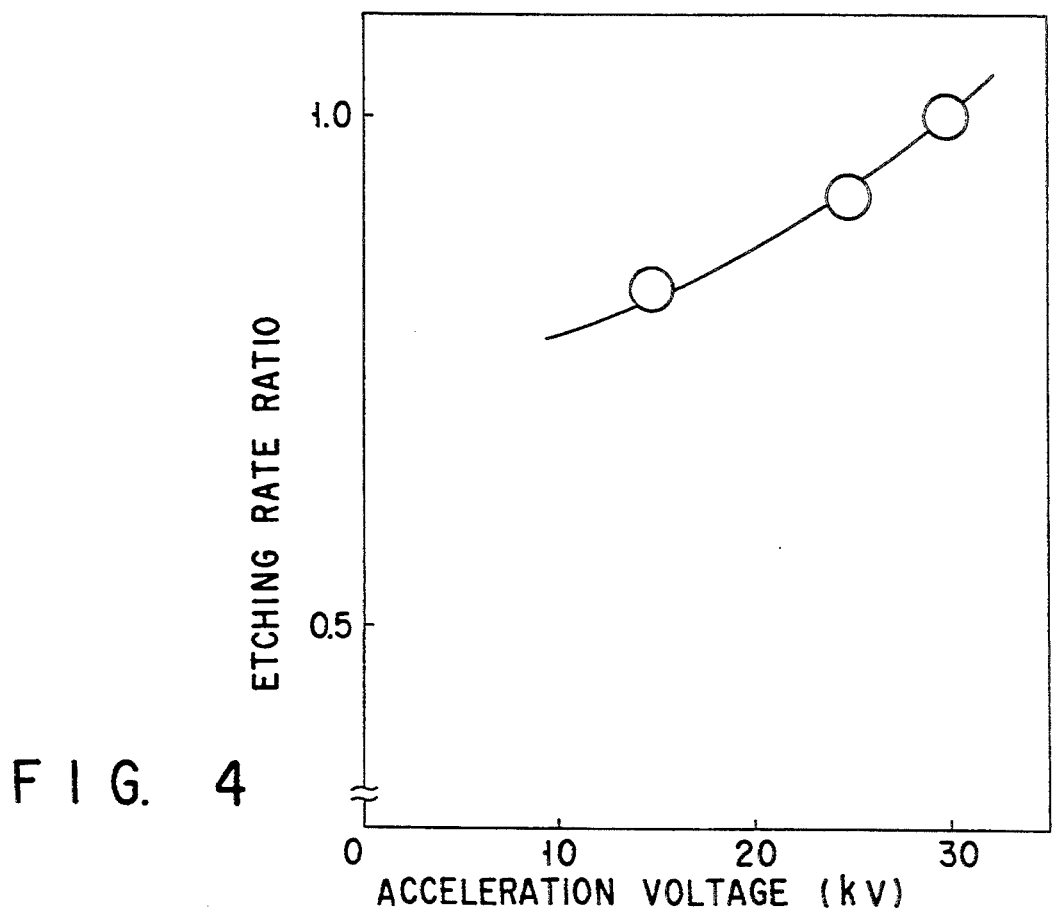
F I G. 4

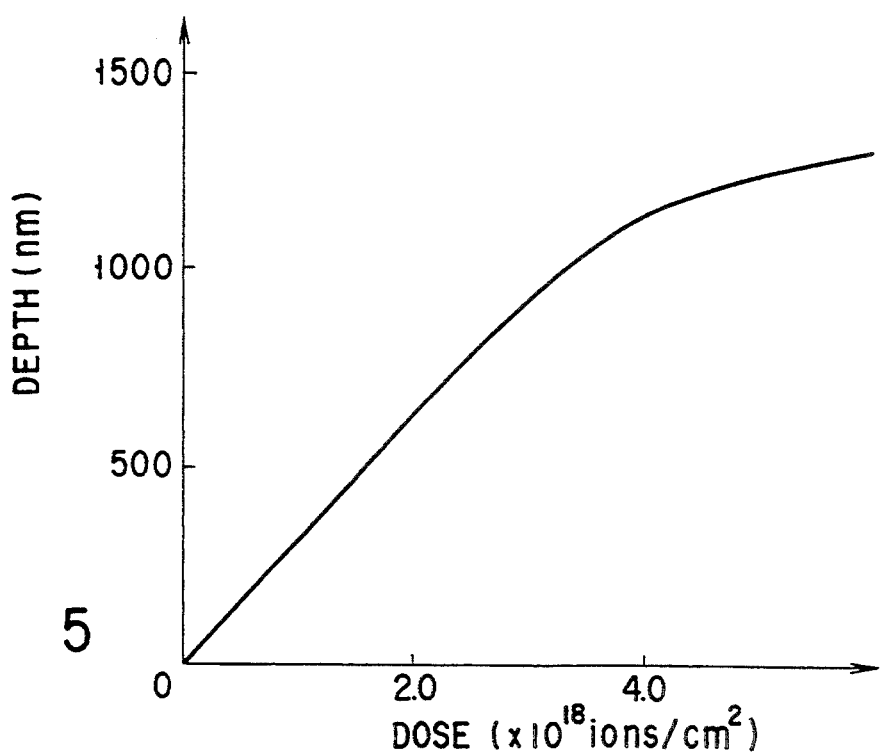
F I G. 5
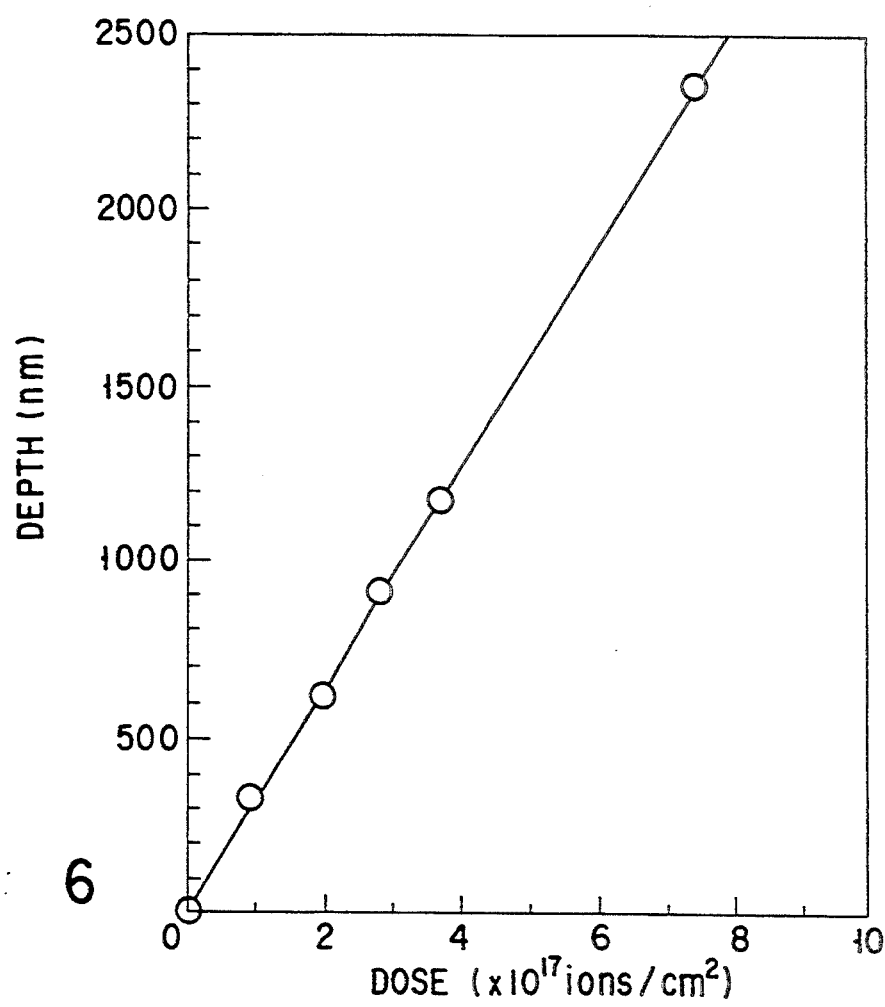
F I G. 6

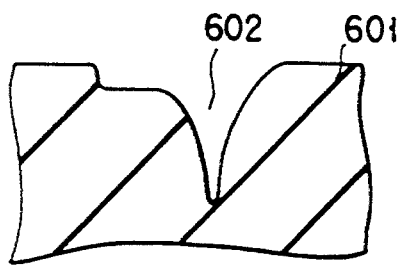
F I G. 15A
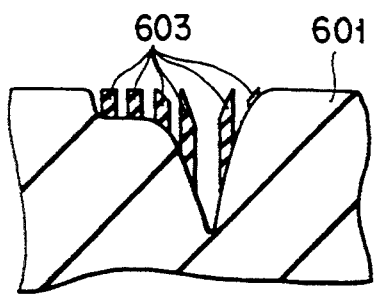
F I G. 15B
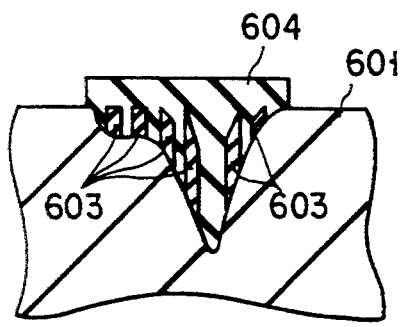
F I G. 15C
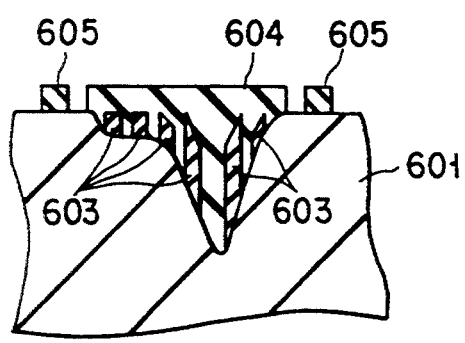
F I G. 15D
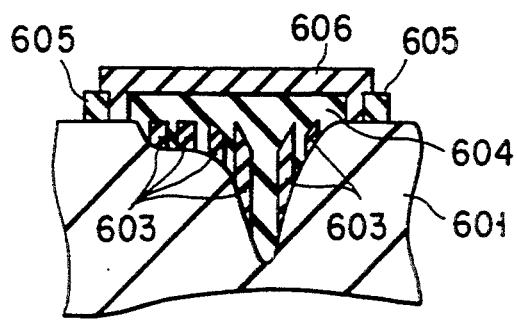
F I G. 15E
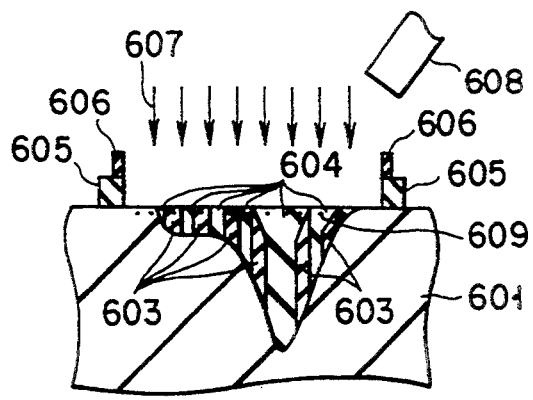
F I G. 15F
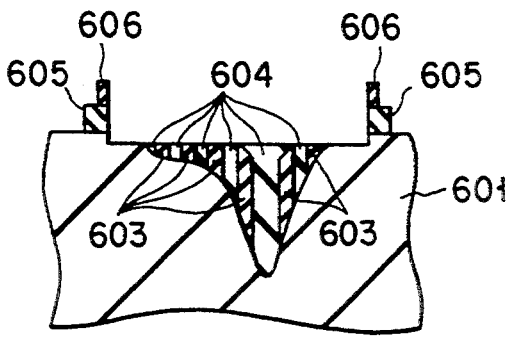
F I G. 15G
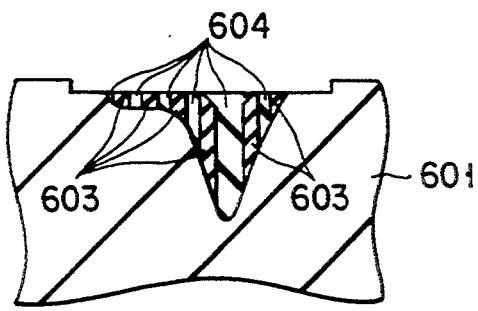
F I G. 15H

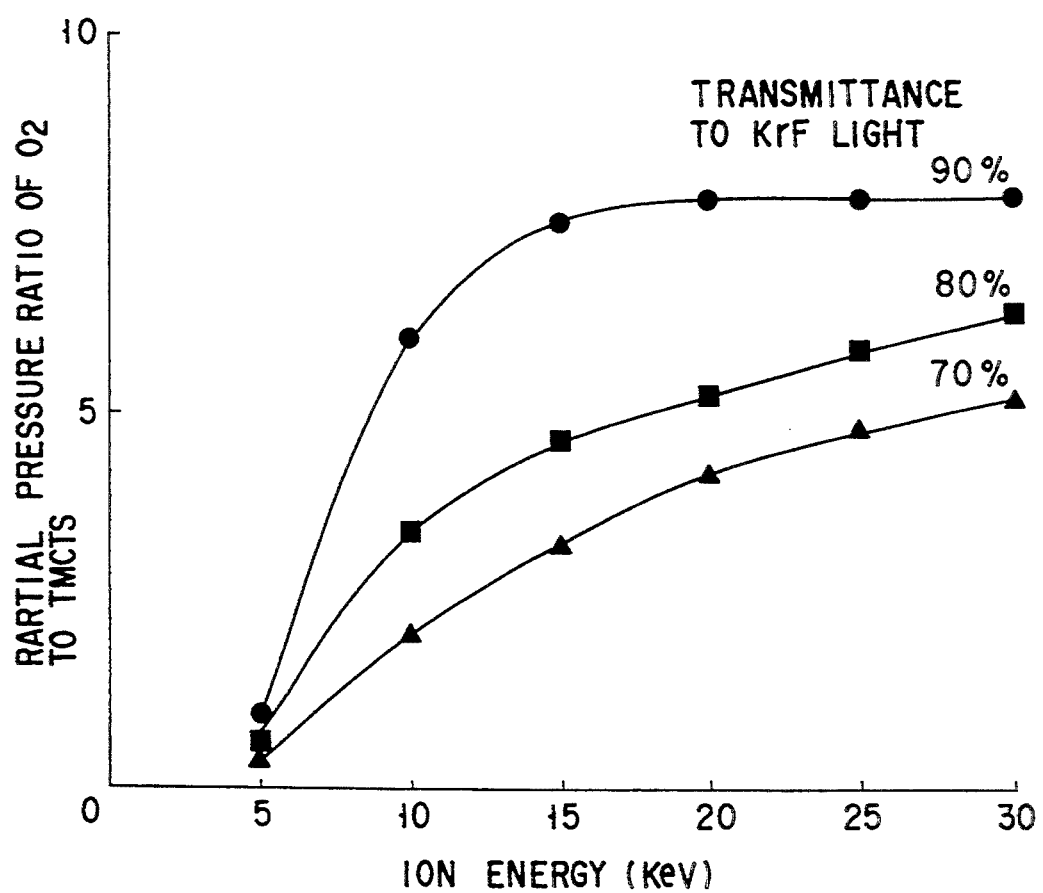
F I G. 23

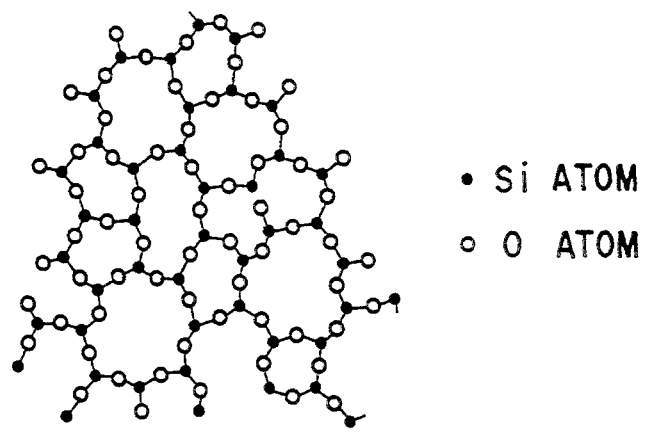
- Si ATOM
- O ATOM
F I G. 24
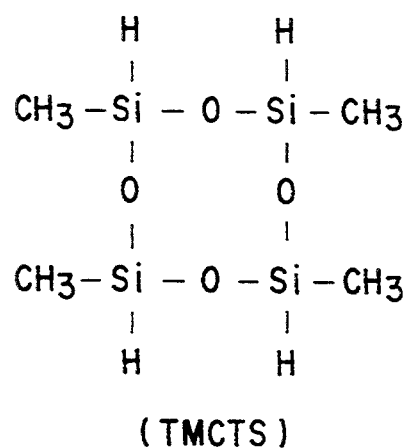
(TMCTS)
F I G. 25A
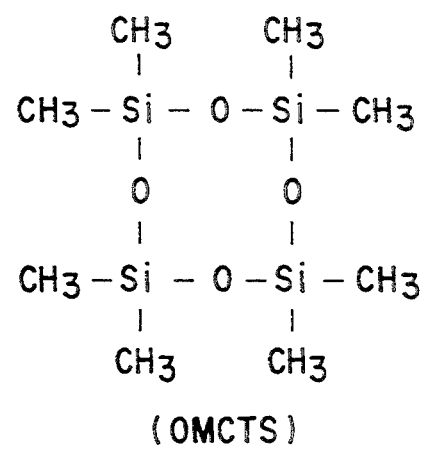
(OMCTS)
F I G. 25B

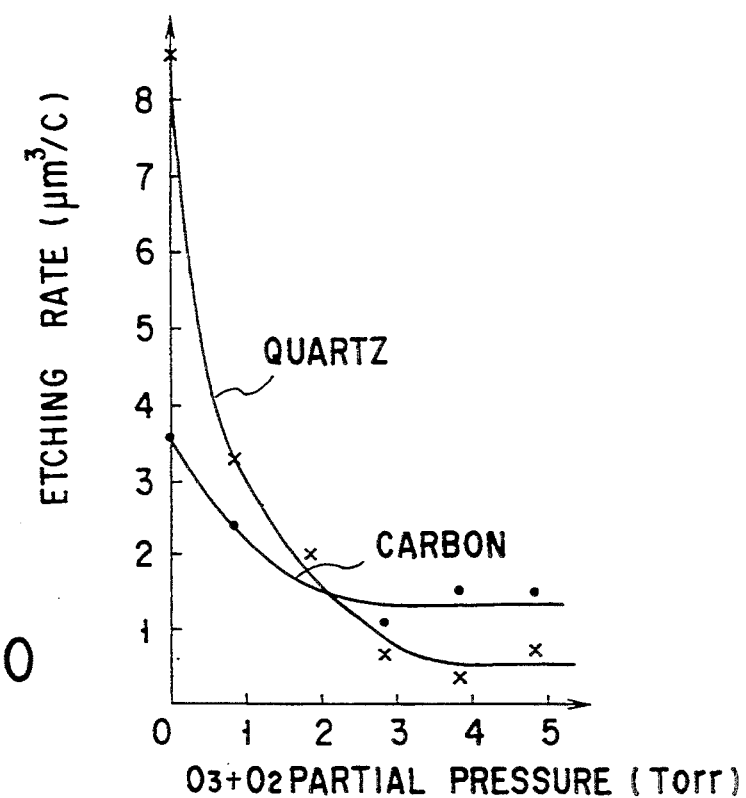
F I G. 30
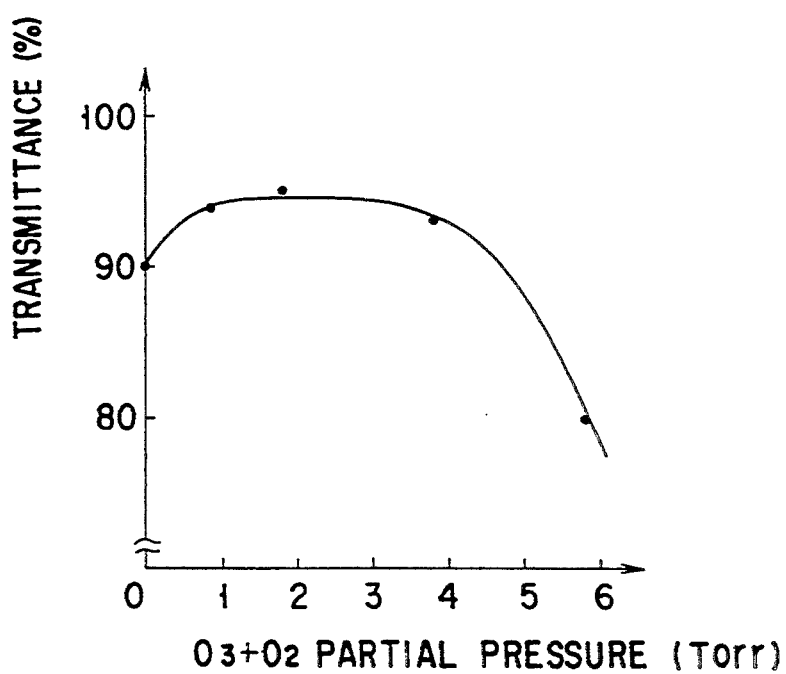
F I G. 31

METHOD OF REPAIRING DEFECT OF STRUCTURE

BACKGROUND OF THE INVENTION

1. Field of the Invention

The present invention relates to a method of repairing a bump or divot defect of a structure and, more particularly, to a method of repairing a defect of a structure, suitable for repairing a defect of a phase-shifting mask.

2. Description of the Related Art

In recent years, a phase shift mask in which a resolution is improved using a phase shift effect is used as a mask for transferring an LSI pattern to a wafer. In such a phase shift mask, when a defect occurs in a shifter, preferable pattern transfer cannot be performed. For this reason, when the defect occurs, the defect must be reliably repaired.

The following method is proposed. That is, when a bump defect is present in the shifter of a phase shift mask, and a focused ion beam is irradiated on the defect, the defect is repaired by etching the bump defect. However, since the phase shifter and a mask substrate often consist of the same material, this method cannot easily detect the end of etching of the bump defect. In addition, even if only the bump defect can be etched, the shape of the shifter after etching depends on the shape of the projecting defect.

In order to solve the above problem, the following method can be considered. That is, the projecting defect is covered with a deposition film so as to flatten the upper surface of the film, the deposition film including the bump defect is etched by a focused ion beam under a condition in which the projecting defect and deposition film are etched at the same rate, thereby removing the bump defect together with the deposition film.

In assisted deposition using the focused ion beam, however, it is difficult to deposit some types of films on the bump defect so as to flatten the upper surface of the film. When the thickness of the deposition film is increased to some extent, the size of a deposition film step at a portion where the edge of the bump defect is covered with the deposition film is decreased. However, even when a film having a thickness larger than that of a predetermined thickness is deposited, the deposition film step is not easily flattened. When the film having the step is etched, the shape of the etched structure depends on the shape of the step, and the mask surface can not be flat after removing the bump defect.

In repairing a divot defect, it is very difficult to repair the defect such that the surface of a buried portion is set on the same plane as that of the remaining shifter surface.

As described above, it is conventionally considered that the defect of a phase shift mask is repaired using a focused ion beam. Since a deposition film cannot be easily formed on the defect so as to obtain a flat surface, the defect cannot be easily repaired to be flattened at the same level as that of the substrate surface.

SUMMARY OF THE INVENTION

The present invention has been made in consideration of the above circumstances, and has as its object to provide a method of repairing a defect of a structure, in which a recessed or bump defect can be repaired to be flattened at the same level as that of a substrate surface.

In order to solve the above problem, according to the first aspect of the present invention, there is provided a method of repairing a bump defect of a structure obtained by forming a predetermined pattern on a substrate, comprising the steps of forming a first thin film consisting of a material different from that of the substrate on the substrate around the projecting defect or close to the bump defect, forming a second thin film on the bump defect and the first thin film to flatten an upper surface of the second thin film, performing simultaneous removal of the projecting defect and the thin films on an upper portion of the bump defect and around the bump defect using a charged particle beam, and performing removal of the thin films left in the step of performing the simultaneous removal.

According to the second aspect of the present invention, there is provided a method of repairing a divot defect of a structure obtained by forming a predetermined pattern on a substrate, comprising the steps of burying a material in the divot defect and forming a portion projecting from a substrate surface, covering a region including the projecting portion with a flattening film consisting of a material different from that of the substrate to flatten an upper surface of the region, performing simultaneous removal of the projecting portion and the flattening films around the projecting portion using a charged particle beam, and performing removal of the flattening films left in the step of performing the simultaneous removal.

Conditions for the preferable embodiment of the present invention are as follows.

(1) The first and second thin films consist of a material containing carbon which is subjected to assisted deposition using an FIB (Focused Ion Beam). This assisted deposition is performed using a hydrocarbon-based gas. This hydrocarbon-based gas is a methyl methacrylate gas, a 2,4,4-trimethyl-1-pentene gas, or isoprene gas.

(2) The first and second thin films consist of a material containing tungsten subjected to assisted deposition using an FIB. This assisted deposition is performed using $W(CO)_6$ or $WF_6$.

(3) A flattening film consists of a photosensitive resin or a resin which is crosslinked or decomposed by charged particles.

(4) In the step of performing the simultaneous removal, the bump defect or portion and the first and second thin films are removed at the same etching rate by controlling processing conditions.

(5) In the step of performing the simultaneous removal, the bump defect or portion and the first and second thin films are removed by sputtering using an FIB and/or assisted etching using charged particles. This assisted etching is performed using an $XeF_2$ gas and/or a gas containing an oxygen element. The gas containing an oxygen element is $O_2$, $O_3$, or $N_2O$.

(6) In the step of performing the simultaneous removal, the end point of processing the bump defect or portion and the first and second thin films is detected by measuring secondary particles discharged from the bump defect or the projecting portion and the first and second thin films.

(7) The first and second thin films left in the step of performing the simultaneous removal are removed by thermal etching using a laser beam, reactive etching using a laser beam in an $O_2$ atmosphere or an $O_3$ atmosphere, an $O_2$ plasma asher, chemical dry etching using a gas obtained by adding at least one of $CF_4$, $H_2$, $H_2O$, $N_2$, $N_2O$, and NO to an $O_2$ gas, chemical dry etching or RIE using a hydrogen gas or a gas containing hydrogen atom, or FIB assisted etching using $O_3$ or $O_2$.

(8) A photosensitive resin or a resin which is cross-linked or decomposed by charged particles remained after the step of performing the simultaneous removal is removed by using a stripping solution.

(9) After the step of performing the simultaneous removal using the charged particle beam, the damaged layer of the substrate surface is removed.

(10) After the step of performing the simultaneous removal using the charged particle beam, the damaged layer of the substrate surface is removed by assisted etching using a gas containing at least $XeF_2$ or thermal etching using a laser beam.

(11) The buried layer and the substrate consist of the same material.

(12) The material of the buried layer has the same optical characteristics as those of the substrate material, and more particularly, the same transmittance and refractive index as those of the substrate material.

(13) The divot defect is buried in two or more stages.

(14) The divot defect is buried by assisted deposition using a charged particle beam (FIB or electron beam).

(15) The gas containing an Si-O bond and/or an Si-H bond in the assisted deposition for burying the recessed defect is 1,3,5,7-tetramethylcyclotetrasiloxane. The gas containing an oxygen element is oxygen, ozone, or $N_2O$. The FIB is a Ga or Si beam.

(16) In the assisted deposition for burying the recessed defect, a gas containing an Si-N bond and/or an Si-H bond or a gas containing nitrogen as a main component is used. This gas containing a nitrogen element is nitrogen or ammonia.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A-1 to 2B-6 are views showing a shifter bump defect repairing process according to Example 1 of the present invention;

FIG. 3 is a graph showing a measurement result of a flat property obtained by two-stage film deposition;

FIG. 4 is a graph showing an FIB acceleration-voltage dependency of a ratio of the etching rate of a carbon film to the etching rate of an $SiO_2$ film;

FIG. 5 is a graph showing a processing time dependency of a sputtering yield of a quartz substrate using a Ga FIB;

FIG. 6 is a graph showing a processing time dependency of an etching yield of %he quartz substrate using FIB assisted etching;

FIGS. 10A-1 to 10B-8 are views showing a repairing process of a divot defect at a shifter edge portion of a shifter-edge type phase shift mask according to Example 3;

FIGS. 15A to 15H are sectional views showing a two-stage repairing process of an indefinite-shaped divot defect of a phase shifter according to Example 6;

FIG. 23 is a graph showing a relationship between an ion energy of each transmittance for KrF light (wavelength: 248 nm) and an $O_2$ partial pressure ratio;

FIG. 24 is a view two-dimensional illustrating the structure of $SiO_2$ in a glass state;

FIGS. 25A and 25B are views illustrating the molecule structures of TMCTS and OMCTS;

FIG. 30 is a graph showing a relationship between an etching rate and an $O_2+O_3$ partial pressure; and FIG. 31 is a graph showing a relationship between a light transmittance and an $O_2+O_3$ partial pressure.

DETAILED DESCRIPTION OF THE PREFERRED EMBODIMENTS

A bump defect repairing process according to the present invention has the following characteristic features. A flat film is deposited on a projecting defect, the deposition film and bump defect are simultaneously etched using an FIB at the same etching rate, and the inflection point of a ratio of secondary ions discharged from the deposition film and the bump defect during the etching is detected, thereby determining the end point of the processing.

In this case, when the film deposited on the bump defect is not flat, a surface shape obtained after the bump defect and the deposition film are simultaneously etched depends on the shape of the deposition film, and the bump defect cannot be repaired to be flat. For this reason, according to the present invention, when a film is to be deposited on the bump defect, a two-stage deposition is performed. That is, a first thin film is deposited on a substrate to have a predetermined interval from the projecting defect so as to easily obtain the flat upper surface of the film covering the bump defect, and a second thin film is deposited to cover the bump defect and the first thin film.

A divot defect repairing process according to the present invention has the following characteristic features. That is, a material to be buried is deposited depending on the shape of the divot defect to project slightly higher than the divot defect, and then the above bump defect repairing process can be applied.

In this manner, when the defect repairing process according to the present invention is applied, a bump or divot defect can be repaired to be flat at the same level as that of the substrate surface. The defect repairing process can be very effectively applied to defect repair of, e.g., a phase shift mask.

The details of the present invention will be described below with reference to examples shown in the accompanying drawings.

EXAMPLE 1

In Example 1, a method of repairing a projecting defect of a silicon oxide formed on a mask substrate of a phase shift mask will be described.

A bump defect repairing process has the following characteristic features. That is, a flat film is deposited on a bump defect using an FIB apparatus, the deposition film and the bump defect are simultaneously etched using an FIB at the same etching rate, and the end point of the processing is determined by detecting the inflection point of a ratio of secondary ions discharged from the bump defect to those from the deposition film during the etching. Therefore, if the film deposited on the bump defect is not flat, a surface shape obtained after the bump defect and the deposition film are simultaneously etched depends on the shape of the deposition film, so the projecting defect cannot be repaired to be flat. For this reason, it is important in the process to deposit the flattening film.

Figure 1:
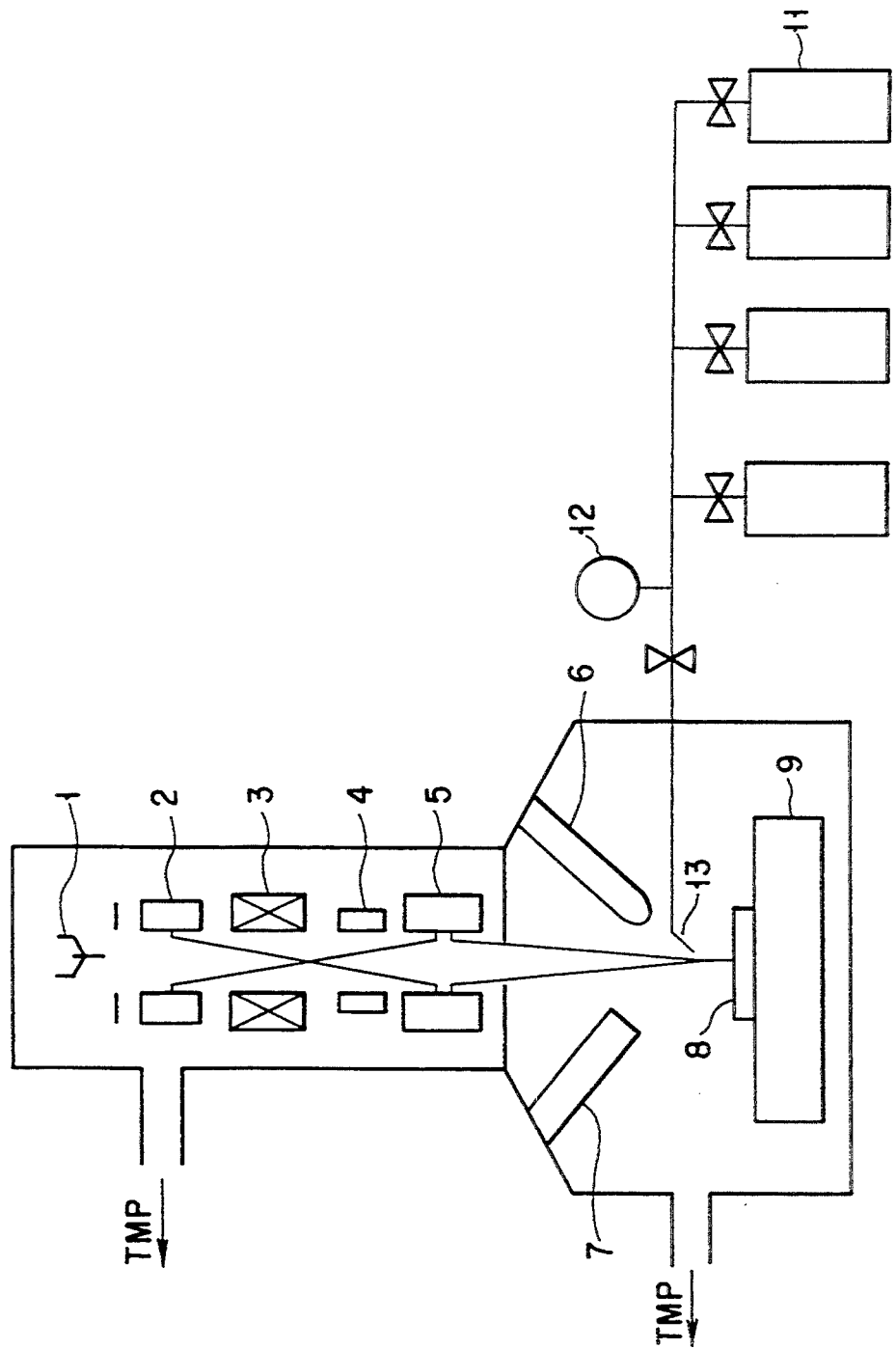
FIG. 1 is a schematic view showing the arrangement of an FIB apparatus used in a method according to an example of the present invention.

FIG. 1 shows the arrangement of the FIB apparatus used in the method according to Example 1. This apparatus has a known arrangement. That is, reference numeral 1 denotes an ion source; 2, a magnifying lens; 3, a mass separation mechanism; 4, a deflector; 5, an objective lens; 6, a charge neutralizer; 7, a secondary ion inspection system; 8, a sample; 9, a sample stage; 11, gas bombs; 12, a capacitance manometer; and 13, a nozzle.

FIGS. 2A-1 to 2B-6 and FIG. 3 show process flows for repairing a bump defect 102 of a phase shifter formed on a quartz substrate 101. FIGS. 2A-1 to 2A-6 are sectional views, and FIGS. 2B-1 to 2B-6 are plan views.

Figures 2, 2A, 3, 4:
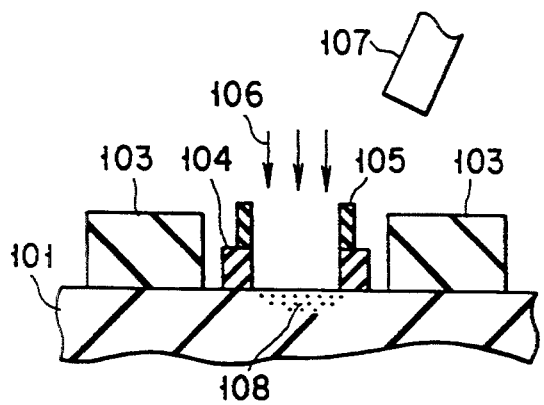
Figures 2, 2B, 3, 4:
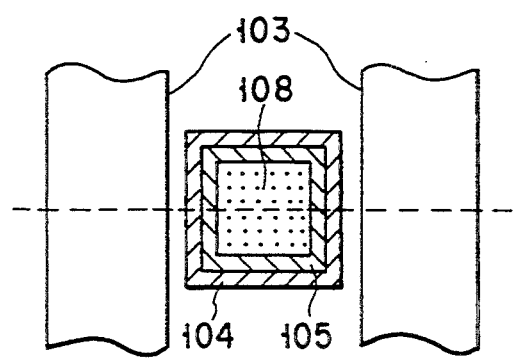

As shown in FIGS. 2A-1 and 2B-1, a phase shift mask is e.g., a transparent phase-shifting mask obtained by forming a phase shifter pattern 103 consisting of a silicon oxide on, the quartz substrate 101. A thickness t of the phase shifter for inverting a phase is an odd-number multiple of $t = \lambda/\{2(n-1)\}$ where $\lambda$ is the wavelength of an exposure light source and n is a refractive index. In this case, KrF is used as a light source ($\lambda = 248$ nm), and a silicon oxide film (n = 1.508) is used as a phase shifter. For this reason, $t = 244$ nm is set.

A defect to be repaired is recognized using the FIB apparatus shown in FIG. 1 on the basis of information such as the size, shape (projection or recess), and position of the defect obtained using a general defect inspection system. In this manner, assume that the bump defect 102 is recognized.

After the defect is recognized, as shown in FIGS. 2A-2 and 2B-2, a first thin film 104 is deposited around the bump defect 102 with a small interval to have a doughnut shape at the same level as that of the bump defect 102. For example, the first thin film 104 is formed by assisted deposition such that a pyrene gas is decomposed at room temperature (25° C.), by a Ga FIB accelerated at 20 kV to deposit carbon (C). In this case, since the first thin film 104 must be finally removed, the selection ratio of the first thin film 104 to the substrate 101 must be sufficiently high.

As shown in FIG. 2A-3 and FIG. 2B-3, a second deposition film 105 is formed in a region covering the bump defect 102 and the first thin film 104. The formation of the second deposition film 105 is performed by assisted deposition as in the formation of the first thin film 104.

In this case, an interval x between the projecting defect 102 and the first thin film 104 and a depth y of a recessed portion have a relationship shown in FIG. 3. That is, the smaller the interval x is, the smaller the depth y is because of the following reason. That is, in assisted deposition using an ion beam and a gas, since deposition is enhanced by ions and secondary electrons multiple-scattered in the narrow groove, the deposition rate in the groove becomes higher than that on the bump defect 102 or the first thin film 104 so as to decrease the depth y, thereby obtaining a flat film. Note that, in the two-stage carbon film deposition method, when a bump defect is small, or a pattern is close to a defect to be repaired, only one-stage carbon film deposition may be performed.

As shown in FIGS. 2A-4 and 2B-4, the flat films (104 and 105) deposited as described above and the projecting defect 102 are etched back at the same rate (after flattening, the flattening films and an object to be etched are simultaneously etched). For example, when the carbon films 104 and 105 deposited using the pyrene gas and the above Ga focused ion beam having an acceleration voltage of 20 kV and the bump defect 102 formed by a silicon oxide film are sputter-etched by a Ga FIB at room temperature, as shown in FIG. 4, an etching rate ratio of $C/SiO_2$ is changed depending on the acceleration voltage of the Ga FIB. When the acceleration voltage is about 30 kV, the etching rate ratio of $C/SiO_2$ is 1. Therefore, a region slightly larger than the bump defect 102 is raster-scanned using a beam 106 narrowly focused under the above conditions, so that the carbon and $SiO_2$ can be simultaneously etched at the same etching rate.

When a ratio of secondary ions of carbon to those of Si generated in the above processing is measured using a mass spectrometer 107, the ratio of secondary ions of C/Si is considerably changed immediately after the carbon around the bump defect 102 in the beam-scanned region disappears. For this reason, it is determined that the bump defect 102 is etched to the same level as that of the surface of the quartz substrate 101. The end point of the processing can be detected from a ratio of secondary ions of C/O, in place of the ratio of secondary ions of C/Si. The method of determining the end point of the processing by measuring secondary ions is disclosed in Jpn. Pat. Appln. KOKAI Publication No. 58-106750. It is also possible to recognize the interface between C and $SiO_2$ by detecting the secondary ions.

However, in the sputter-processing using the Ga FIB, a damaged layer 108 having a depth of about 15 nm is left on the surface of the processed substrate 101 to decrease the transmittance to light used in exposure. For this reason, upon completion of removal of the bump defect 102, as shown in FIGS. 2A-5 and 2B-5, the damaged layer 108 is assisted-etched at room temperature using an $XeF_2$ gas and the Ga FIB. In the assisted etching using this gas, since no damaged layer is formed, the damaged layer 108 can be removed. When a sample temperature is lower than the room temperature, adsorption of the gas is enhanced, so that etching is more effectively performed. Although a recessed portion having a depth of about 15 nm is formed by the processing, the recessed portion having such a depth is not transferred to a wafer and does not adversely affect the pattern around the recessed portion. Note that, even when an electron beam is used in place of the Ga FIB, assisted etching can be performed in the same manner as described above.

Finally, as shown in FIGS. 2A-6 and 2B-6, carbon left around the bump defect after the bump defect is removed is removed by an $O_2$ plasma asher. For example, when an $O_2$ gas flows into a chamber to keep the pressure of the chamber at 0.9 Torr, and ashing is performed by applying an RF power of 500 W, the carbon can be removed without any damage. The removal of carbon can be performed by not only the $O_2$ plasma asher but also CDE (chemical dry etching) using an $O_2$ gas or an $O_2$ gas containing $CF_4$. Furthermore, the removal of carbon can be effectively performed by keeping the substrate temperature at 150° to 400° C. In addition, the removal of carbon can also be performed by laser beam irradiation and FIB irradiation in an $O_2$ or $O_3$ atmosphere.

The removal of the remaining carbon can be more efficiently performed at once after all defects are repaired. The two last steps, i.e., the step of removing carbon and the step of removing a damaged layer may be performed in a reverse order.

The step formed on the substrate surface when the bump defect is repaired using the above repairing process will be discussed below. The height of the step formed by the repair is obtained such that the thickness of a projecting or recessed step De formed by a difference of the etching rates of the flattening film and the defect is added to a sum of a recess amount y of the flattening film and a recess amount Dy of the recessed portion formed by removing the damaged layer. Therefore, the height of the step formed as described above must be naturally smaller than that of a step for generating a line width variation allowed in a transfer pattern.

An alternating aperture phase shift mask is taken as an example, and 10% of a minimum resolution size is defined as an allowance. In this case, when the wavelength is 248 nm, the minimum size is 0.25 μm, the NA of a stepper is 0.45, and a coherence factor σ representing the coherency of an exposure wavelength is 0.3, the height of the step is about 40 nm. When the wavelength is 365 nm, the minimum size is 0.35 nm, the NA of the stepper is 0.46, and the coherence factor σ representing the coherency of the exposure wavelength is 0.3, the height of the step is about 80 nm. That is, when the height of the step is smaller than 80 nm, the transfer performance of the phase shift mask is not adversely affected. In other words, processing conditions of the steps can be less strict until (y+Dy+De) reaches the height of the step. More specifically, in the wavelength of KrF, when y=10 nm and Dy=15 nm, the range of the etching rate ratio can be widened (0.94 to 1.06) until the height of the step De reaches a maximum of 15 nm.

In this manner, when a bump defect is repaired in accordance with the repairing process flow of Example 1, the following effects can be obtained.

(1) Since the bump defect 102 is covered with flattening films (the first thin film 104 and the second deposition film 105) such that the area larger than that of the bump defect 102 is covered, damage to the peripheral portion of the defect region caused by Ga beam irradiation during removal of the defect can be suppressed as much as possible.

(2) When the flattening films (104 and 105) and the bump defect 102 which consist of different materials are simultaneously processed, and secondary ions discharged from the flattening films (C) and the defect ($SiO_2$), a ratio of the secondary ions or the secondary electrons are measured, the end point of the processing can be easily detected.

(3) Since the bump defect 102 having a non-uniform thickness is flattened using the flattening films (104 and 105), a flat shape can be easily obtained after the repair.

(4) The damaged layer 108 left on the substrate 101 can be easily removed by assisted etching using an $XeF_2$ gas and a Ga FIB or electron beam.

(5) The carbon films (104 and 105) used to remove the defect can be easily removed by an $O_2$ plasma asher without any damage to other portions.

(6) Almost all process of repairing defects can be done in a Ga FIB apparatus by changing the type of a gas supplied into the apparatus. For this reason, defect repair can be considerably efficiently performed.

Although the repairing process of a projection defect has been described above, the repairing process is not limited to Example 1.

In Example 1, although a carbon film deposited from a pyrene gas is described above as a flattening material covering a defect, a carbon film deposited from another hydrocarbon gas or a tungsten film using w(CO)$_6$ may be used. The coverage property of the tungsten film is almost the same as that of a carbon film. When the above two-stage deposition was performed at room temperature using the tungsten film, a flat film having a small recessed portion on its surface could be obtained as in the carbon film. In addition, when a defect ($SiO_2$) and the tungsten film are to be simultaneously processed, a point at which an etching rate ratio is 1 falls within the range of acceleration voltages of a general FIB apparatus.

As a flattening material covering a defect, not only a film deposited by an FIB, but also a photosensitive resin or a resin crosslinked or decomposed by charged particles. Such a resin is coated on a reticle by spin coating, and a laser beam, light focused using a slit, an FIB, or an electron beam is applied to only a region including a defect using a microscope or coordinates obtained in the inspection step. The resultant structure is developed, thereby forming a flattening film. The first thin film and the second thin film are formed by repeating the above-described sequence of steps. The thickness of either film is adjusted by changing the exposure (irradiation) amount of the resist or the density of resist. It suffices to form only one flattening film in the case where the bump defect is small or in the case where a pattern is located near the defect to repair. Thereafter, it is possible to perform the same processing as that of the carbon film which is deposited by an FIB using a pyrene gas. The photosensitive resin, or the resin cross-linked or decomposed by charged particles, can be removed by suing a stripping solution such as a mixture of sulfuric acid and hydrogen peroxide.

Although carbon and $SiO_2$ are simultaneously etched by the Ga FIB in Example 1, etching can be performed by assisted etching using a gas and an FIB or electron beam. In this case, the etching rates of the deposition film and a shifter can be controlled by properly selecting a gas or combination of gases. In addition, when an $XeF_2$ gas mixture is used as the gas, no damaged layer is left on the substrate surface when the defect is removed, the step of removing a damaged layer in the above process flow can be omitted, and excessive etching need not be performed. In this case, the point at which the etching rate of $SiO_2$ is 1 is present within the general acceleration voltage range, and an absolute etching rate is higher than that in sputter etching. For this reason, a throughput can be increased.

In sputtering using a Ga FIB, a sputtering yield of, e.g., a quartz substrate, becomes saturated over time (FIG. 5) because the sputtered material is attached again to the peripheral portion of the processed region in sputtering, and the sputtering yield becomes saturated over time. On the other hand, in assisted etching using an $XeF_2$ gas and a Ga FIB or an electron beam, the etching yield of the quartz substrate is always constant (FIG. 6) because no sputtered material is attached again, and excellent controllability of processing can be advantageously obtained.

Although C left after the defect is removed is removed by the $O_2$ asher in the above description, the C may be removed by, e.g., a laser. This method utilizes evaporation of carbon caused by absorbing a laser beam. According to the method, when the laser beam is narrowly focused using a slit and then irradiated on the remaining carbon, a laser energy is absorbed by the carbon to generate heat, the carbon is sublimed and scattered. Furthermore, in this case, the laser energy is also absorbed into the damaged layer, and the damaged layer is removed together with the carbon. The two steps of removing the remaining carbon and the damaged layer are reduced to one step, and the repairing process is more efficiently performed.

As another method, C reacts with $O_2$ or $O_3$ by laser irradiation in an $O_2$ or $O_3$ atmosphere, the carbon is removed as CO and $CO_2$. In this case, since chemical reactions are used, the power of the laser can be decreased. There are conditions under which, even when the laser is irradiated on a light-shielding material near the defect, only the carbon can be removed without evaporating the light-shielding material. Therefore, degree of allowance of the diameter of the laser and degree of allowance of positional adjustment are increased, and a process margin is advantageously increased. In addition, when laser is used, pattern distortion can be suppressed because heating can be locally performed. When an FIB is used in place of the laser in the $O_2$ or $O_3$ atmosphere, the same effect as described above can be expected. In this case, in order to obtain the selection ratio of a substrate and carbon, lightweight ions or an FIB having an acceleration energy of 10 keV or less must be used.

Although deposition of carbon, simultaneous etching of C and $SiO_2$, and removal of a damaged layer are performed by a Ga FIB, an ion source is not limited to the Ga FIB. For example, it is apparent that the process in the above steps may be performed using another ion source such as Au or Si.

In addition, various changes and modifications may be effected without departing from the spirit and scope of the invention.

Example 1 is a method of repairing the defect of a phase-shifting mask utilizing a shifter edge. Nonetheless, the present invention can be used to repair the defects of any other type of a phase-shifting masks, such as an alternating aperture phase-shifting mask, an attenuated phase-shifting mask, or the like. Moreover, the present invention can be employed to repair the defects of ordinary Cr masks and X-ray masks.

EXAMPLE 2

Figure 7A:
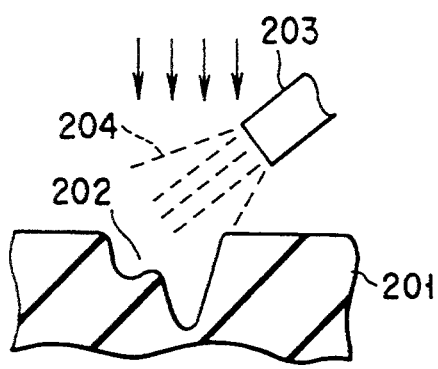
FIGS. 7A to 7G are sectional views showing a repairing process of a divot defect of a shifter according to Example 1.
Figure 7B:
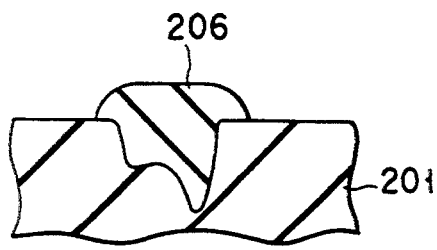

In Example 2, a method of repairing a recessed defect of a shifter will be described below in detail with reference to FIGS. 7A to 7G. A defect to be repaired is recognized using an FIB apparatus on the basis of information such as the size, shape (projection or recess), position of a defect detected using a general defect inspection system. As shown in FIG. 7A, after a divot defect 202 is recognized in a phase shifter 201, while a gas having Si-O bonds and/or Si-H bonds or a gas mixture containing the gas, i.e., a gas mixture 204 of 1,3,5,7-tetramethylcyclotetrasiloxane and oxygen (mixing ratio = 1:7) is sprayed from a nozzle 203 on the divot defect 202, an $Si^{2+}$ FIB 205 having an acceleration energy of 50 keV is irradiated on a region slightly larger than the divot defect 202. In this manner, as shown in FIG. 7B, an $SiO_2$ film 206 (buried material) projecting higher than the surface of the shifter 201 is deposited. The diameter of the nozzle used in this case was 0.2 mm, and the pressure of the capacitance manometer shown in FIG. 1 was 4 Torr. At this time, the total flow rate of the gas at the outlet port of the nozzle was 0.05 sccm.

The $SiO_2$ film deposited as described above and having a thickness of 0.4 μm has a transmittance of 100% to light having a wavelength of 436 nm, and the transmittance of a film ($SiO_x$) deposited using a conventional gas mixture of tetramethoxysilane and oxygen is 40%. When these transmittances are compared with each other, the $SiO_2$ film of Example 2 has excellent optical characteristics. In addition, the $SiO_2$ film deposited by the method of Example 2 has a transmittance of 90.6% to light (light used in an alternating aperture phase shift mask method) having a wavelength of 248 nm. This value is larger than a transmittance (80.6%) required to repair a divot defect.

Note that, when the transmittance of the deposition film must be increased, the following post-processing may be performed. After the film is deposited, UV light having a power density of 200 mW/cm$^2$ on the surface of the deposition film is irradiated on the deposition film for 1 hour. When the film is deposited while UV light is irradiated in place of the UV light processing, the deposition film having the same transmittance as described above can be obtained. In addition, when the deposition film is annealed at 350° C. in an $O_2$ atmosphere for 1 hour, the same effect as described above can be obtained.

In this case, the two types of gases may be sprayed from different nozzles, and a gas such as $N_2O$ or ozone containing oxygen atoms as a main component may be used in place of the oxygen gas. The mixing ratio of gases is not limited to 1:7, and a mixing ratio at which the divot defect is buried with a transparent deposit to have an excellent shape is selected depending on the gas species and the ion species and energy of the FIB which are used in the deposition. For example, when TEOS (tetraethoxysilane) is used, a "cavity" is formed in the deposit at room temperature. However, when a mask temperature is decreased to about $-70°$ C., the recessed defect can be buried without forming a "cavity". The energy and ion species of the FIB are not limited to the $Si^{2+}$ FIB having an acceleration energy of 50 keV, and another energy and ion species such as a $Ga^+$ FIB having an acceleration energy of 25 keV can be selected. In addition, an electron beam may be used in place of the FIB.

However, when a charge neutralizer is arranged near the gas nozzle, and radiant heat from an electron discharging filament in the neutralizer adversely affects the gas, a black contaminant consisting of carbon is attached on the mask substrate. Therefore, the charge neutralizer is preferably arranged apart from the gas nozzle.

Figure 7C:
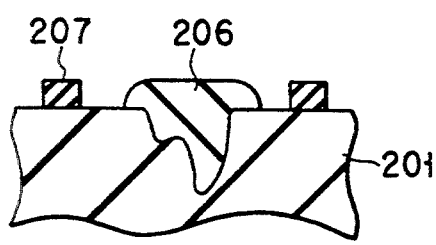

As shown in FIG. 7C, a first thin film 207 is deposited around the projecting portion of the $SiO_2$ film 206 with a small interval to have a doughnut shape at the same level as that of the $SiO_2$ film 206. For example, the first thin film 207 is formed by assisted deposition in which carbon (C) is deposited by decomposing a pyrene gas using a Ga focused ion beam accelerated to 20 keV.

Figure 7D:
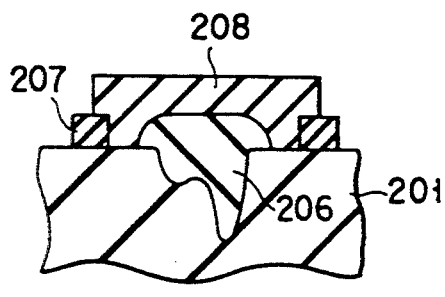

As shown in FIG. 7D, a second deposition film 208 is formed in a region covering the projecting portion of the $SiO_2$ film 206 and the first thin film 207. At this time, an interval x between the projecting portion of the $SiO_2$ film and the first thin film 207 and a depth y of a recessed portion formed in the surface of the second deposition film 208 when the second deposition film 208 is deposited to have a thickness of 1.0 μm have a relationship shown in FIG. 3. That is, the smaller the interval x is, the smaller the depth y is because of the following reason. That is, in assisted deposition using an ion beam and a gas, since deposition is enhanced by ions and secondary electrons multiple-scattered in the narrow groove, the deposition rate in the groove becomes higher than that on the projecting portion of the $SiO_2$ film 206 or the first deposition film 207 so as to decrease the depth y, thereby obtaining a flat film.

Figure 7E:
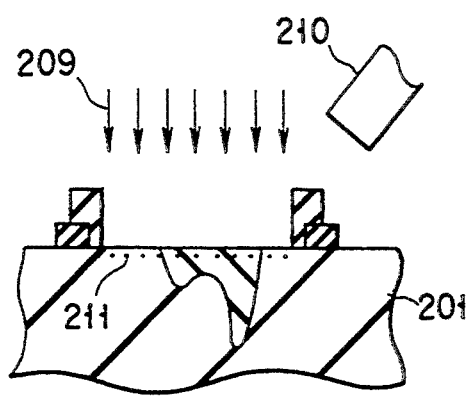

As shown in FIG. 7E, the flat films (207 and 208) deposited as described above and the projecting portion of the $SiO_2$ film 206 are simultaneously etched at the same rate. For example, when the projecting portion of the $SiO_2$ film 206 and the carbon films (207 and 208) deposited using the 20-keV Ga focused ion beam and the pyrene gas are to be sputter-etched by a Ga FIB, as shown in FIG. 4, an etching rate ratio of $C/SiO_2$ is changed depending on the acceleration voltage of the Ga FIB. When the acceleration voltage is about 30 kV, the etching rate ratio of $C/SiO_2$ becomes about 1. Therefore, a region slightly larger than the projecting portion is raster-scanned using a beam 209 narrowly focused under the above conditions, so that the carbon and $SiO_2$ can be simultaneously etched at the same etching rate.

When a ratio of secondary ions of carbon to those of Si generated in the above processing is measured using a mass spectrometer 210, the ratio of secondary ions of C/Si is considerably changed immediately after the carbon around the projecting portion of the $SiO_2$ film 206 in the beam-scanned region disappears. For this reason, it is determined that the projecting portion of the $SiO_2$ film 206 is etched to the same level as that of the surface of the shifter 201. The end point of the processing can be detected from a ratio of secondary ions of C/O in place of the ratio of secondary ions of C/Si. The method of determining the end point of the processing by measuring secondary ions is disclosed in Jpn. Pat. Appln. KOKAI Publication No. 58-106750, it is also possible to recognize the interface between C and $SiO_2$ by detecting the secondary ions.

Figure 7F:
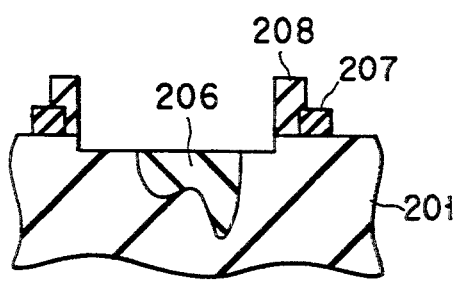

However, in the sputter-processing using the Ga FIB, a damaged layer 211 having a depth of about 15 nm is left on the surface of the processed substrate to decrease the transmittance to light used in exposure. For this reason, upon completion of removal of the projecting portion of the $SiO_2$ film 206, as shown in FIG. 7F, the damaged layer 211 is assisted-etched using, e.g., an $XeF_2$ gas and the Ga FIB. In the assisted etching using this gas, since no damaged layer 211 is left, the damaged layer 211 can be removed. Although a recessed portion having a depth of about 15 nm is formed by the processing, the recessed portion having such a depth is not transferred to a wafer and does not adversely affect the pattern around the recessed portion.

Figure 7G:
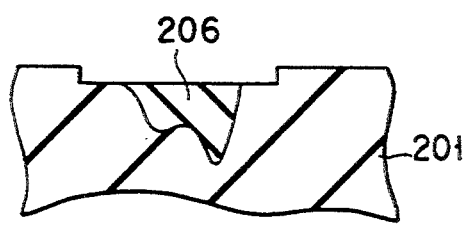

Finally, as shown in FIG. 7G, carbon left around the projecting portion after the projecting portion of the $SiO_2$ film 206 is removed is removed by an $O_2$ plasma asher. For example, when an $O_2$ gas flows into a chamber to keep the pressure of the chamber at 0.9 Torr, and ashing is performed by applying an RF power of 500 W, the carbon can be removed without any damage. The removal of carbon can be performed by not only the $O_2$ plasma asher but also CDE using an $O_2$ gas or an $O_2$ gas containing $CF_4$. Furthermore, the removal of carbon can be effectively performed by keeping the substrate temperature at 150° to 400° C. In addition, the removal of carbon can also be performed by laser beam irradiation and FIB irradiation in an $O_2$ or $O_3$ atmosphere.

The removal of remaining carbon can be more efficiently performed at once after all defects are repaired. The last two steps, i.e., the step of removing carbon and the step of removing a damaged layer may be performed in a reverse order.

In this manner, when the divot defect is repaired in accordance with the repairing process flow of Example 2, the following effects can be obtained.

(1) Since the divot defect 202 need not be buried with the $SiO_2$ film 206 depending on the shape of the recessed portion, the process is considerably simplified.

(2) Since the projecting portion formed by burying the divot defect 202 is covered with the flattening film (207 and 208) such that a region larger than that of the projecting portion is covered, when the projecting portion is removed, damage to the peripheral portion of the defect caused by Ga beam irradiation can be suppressed as much as possible.

(3) The flattening films (207 and 208) and the $SiO_2$ film 206 which consist of different materials are simultaneously processed, and secondary ions discharged from the flattening films (C) and the projecting portion (SiO$_2$) or a ratio of the secondary ions or secondary electrons are measured. For this reason, the end point of the processing of the projecting portion can be easily detected.

(4) Since the projecting portion having a non-uniform thickness is flattened using the flattening films (207 and 208), the repaired surface is easily flattened.

(5) The damaged layer 211 left on the surface of the divot defect which is repaired can be easily removed by assisted etching using an XeF$_2$ gas and a Ga FIB.

(6) The carbon films (207 and 208) used to repair the defect can be easily removed by an O$_2$ plasma asher without any damage to other portions.

(7) Almost all process of repairing defects can be done in a Ga FIB apparatus by changing the type of a gas supplied into the apparatus. For this reason, defect repair can be considerably efficiently performed.

Although the repairing process of the divot defect has been described above, the repairing process is not limited to Example 2.

In Example 2, although a carbon film deposited from a pyrene gas is described above as a a flattening material covering a projecting portion left after the divot defect is buried with SiO$_2$, a carbon film deposited from another hydrocarbon gas or a tungsten film using, e.g., W(CO)$_6$, may be used. The coverage property of the tungsten film is almost the same as that of a carbon film. When the above two-stage deposition was performed using the tungsten film, a flat film having a small recessed portion in its surface could be obtained as in the carbon film. In addition, when a projecting portion (SiO$_2$) and the tungsten film are simultaneously processed, a point at which an etching rate ratio is 1 falls within the range of acceleration voltage of a general FIB apparatus.

Furthermore, the material for converting the projection defect is not limited to a film deposited by using an FIB. Use may be made of photosensitive resin or resin which is crosslinked or decomposed by charged particles. After spin-coating the resin of either type on the reticule, a laser beam,-a light beam focused by using a slit, an FIB or an electron beam is applied to only the region including the target defect, by using either a microscope or the coordinates obtained in the inspection step. The, the resultant structure is developed, thereby forming a flattening film. The first thin film and the second thin film are formed by repeating the above-described sequence of steps. The thickness of either film is adjusted by changing the exposure (irradiation amount of the resist or the density of resist. In the case where the bump defect is small or in the case where a pattern is located near the defect to repair, it suffices to form only one flattening film. Thereafter, it is possible to perform the same processing as that of the carbon film which is deposited by an FIB using a pyrene gas. The photosensitive resin, or the resin crosslinked or decomposed by charged particles, can be removed by using stripping solution such as a mixture of sulfuric acid and hydrogen peroxide.

Simultaneous etching of C and SiO$_2$ can be modified as in Example 1. In addition, removal of flattening film left after the projecting portion is removed can be modified as in Example 1. In addition, deposition of carbon, simultaneous etching of C and SiO$_2$, and an ion source used for removing the damaged layer can be modified as in Example 1.

Figure 8A:
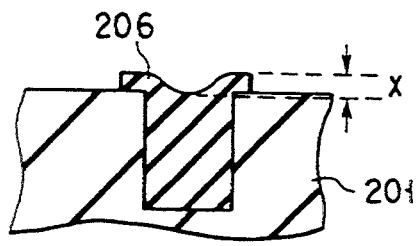
FIGS. 8A to 8C are sectional views for explaining shapes of an $SiO_2$ film buried in a divot defect.

Although the shape of the divot defect is not described in the above process, some steps of the process can be omitted depending on the shape. That is, a divot defect having a large aspect ratio is to be repaired, the deposition shape of SiO$_2$ using 1,3,5,7-tetramethylcyclotetrasiloxane is as shown in FIG. 8A. In this case, since a height x of the projecting portion falls within the range of the height of an allowable step in defect repair, the steps from FIG. 7C need not be performed.

Figure 9A:
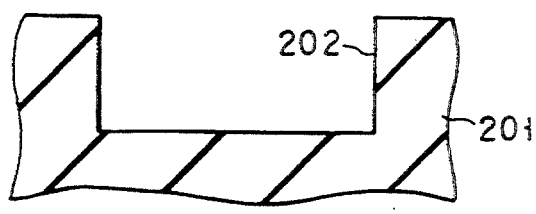
FIGS. 9A to 9C are sectional views showing another example of an $SiO_2$ film buried in a divot defect.
Figure 8B:
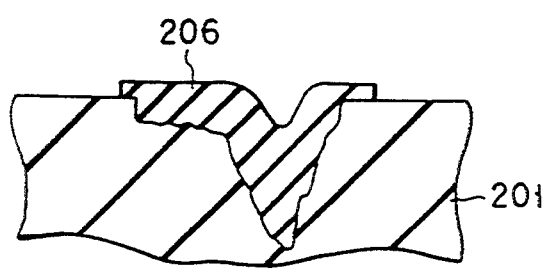
Figure 9B:
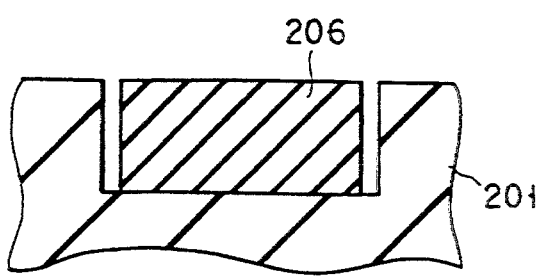
Figure 8C:
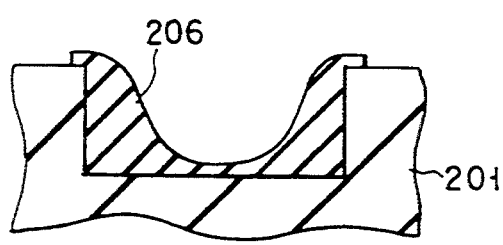
Figure 9C:
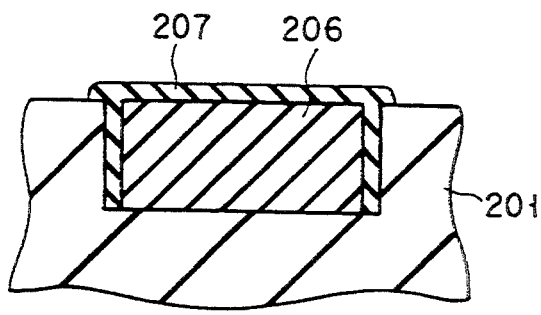

In contrast to this, when each of defects shown in FIGS. 8B and 8C is to be repaired, the depth of the recessed portion of the surface obtained after SiO$_2$ is deposited does not fall within the range of the thickness of an allowable step in defect repair. For this reason, all the steps shown in FIGS. 7A to 7G must be performed. In addition, in a case of the defect shown in FIG. 8C, as shown in FIGS. 9A to 9C, SiO$_2$ is deposited in the recessed portion with a small interval from the side wall of the recessed portion, and SiO$_2$ is deposited in a region completely covering the defect, thereby obtaining deposition having a small difference between the peak and bottom levels on the deposition surface. In this manner, as described above, the steps from FIG. 7C may not be performed.

Although the divot defect is buried with a silicon oxide film in Example 2, the buried material is not limited to the silicon oxide. The buried material must be selected depending on the material of a shifter. When silicon nitride, chromium oxide, or the like is used, the above repair can be performed in the same manner as described above.

In addition, various changes and modifications may be effected without departing from the spirit and scope of the invention.

EXAMPLE 3

In Example 3, a method of repairing a recessed defect at a shifter edge portion of a transparent phase shift mask will be described with reference to FIGS. 10A-1 to 10A-8. In this case, FIGS. 10A-1 to 10A-8 are sectional views, and FIGS. 10B-1 to 10B-8 are plan views.

A defect to be repaired is recognized using an FIB apparatus on the basis of information such as the size, shape (projection or recess), position of a defect detected using a general defect inspection system. As shown in FIGS. 10A-1 and 10B-1, after a divot defect 303 is recognized at an edge portion of a phase shifter 302 formed on an SiO$_2$ substrate 301, while a gas having Si-O bonds and/or a gas having Si-H bonds or a gas mixture containing the gas, i.e., a gas mixture 305 of 1,3,5,7-tetramethylcyclotetrasiloxane and oxygen (mixing ratio=1:7) is sprayed froth a nozzle 304 on the divot defect 303, an Si$^{2+}$ FIB 306 having an acceleration energy of 50 keV is irradiated on a region slightly larger than the divot defect. In this manner, as shown in FIGS. 10A-2 and 10B-2, projecting SiO$_2$ 307 is deposited in a region larger than that of the recessed defect 303.

In this case, the two types of gases may be sprayed from different nozzles, and a gas such as N$_2$O or ozone containing oxygen atoms as a main component may be used in place of the oxygen gas. The mixing ratio of gases is not limited to 1:7, and a mixing ratio at which the deposit is transparent is selected depending on the gas species and the ion species and energy of the FIB which are used in the deposition. The energy and ion species of the FIB are not limited to the Si$^{2+}$ FIB having an acceleration energy of 50 keV, and another energy and ion species such as a Ga$^+$ FIB having an acceleration energy of 25 keV can be selected. In addition, an electron beam may be used in place of the FIB.

Figures 1, 10A:
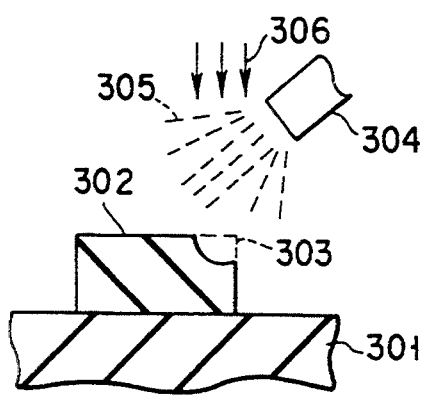
Figures 1, 10B:
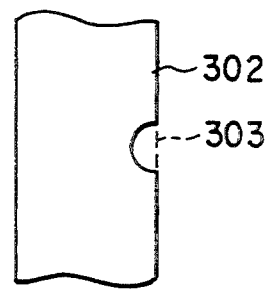
Figures 2, 10A:
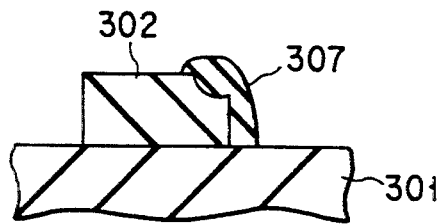
Figures 2, 10B:
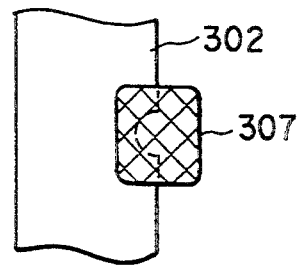
Figures 3, 10A:
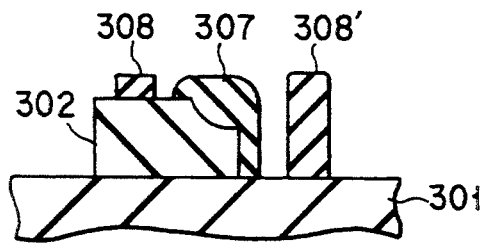
Figures 3, 10B:
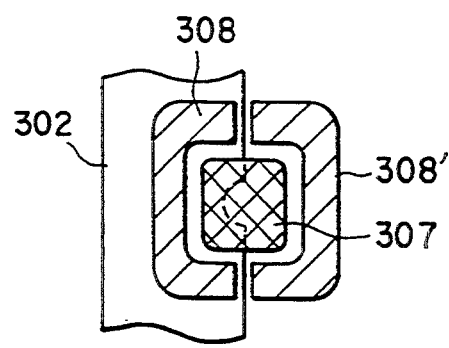
Figures 4, 10A:
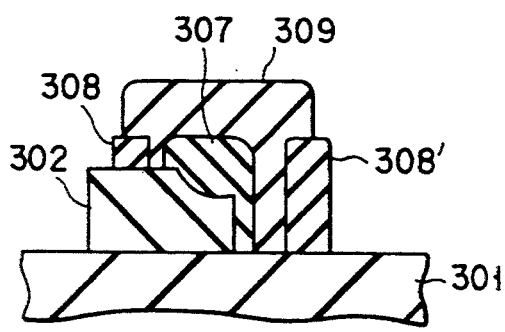
Figures 4, 10B:
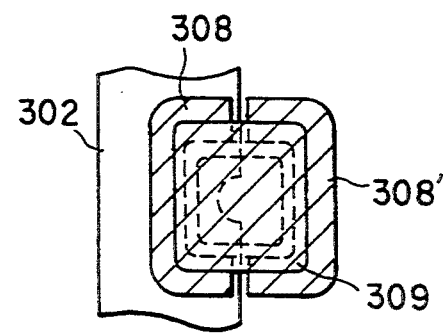
Figures 5, 10A:
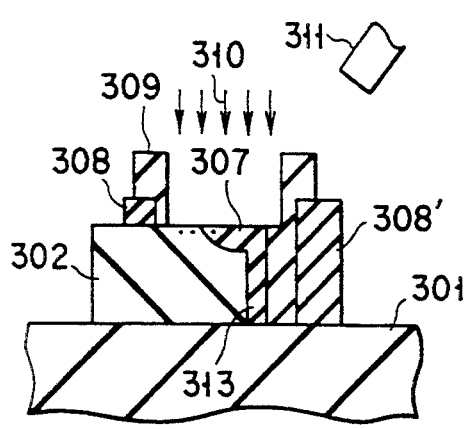
Figures 5, 10B:
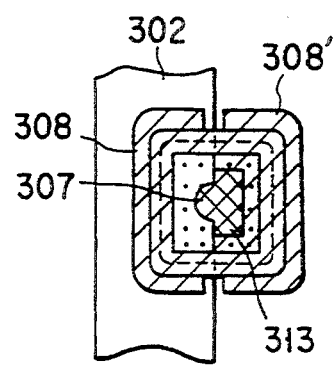
Figures 6, 10A:
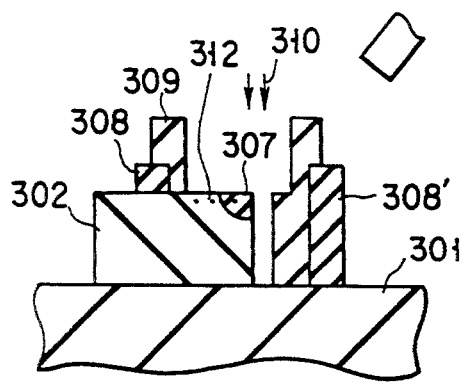
Figures 6, 10B:
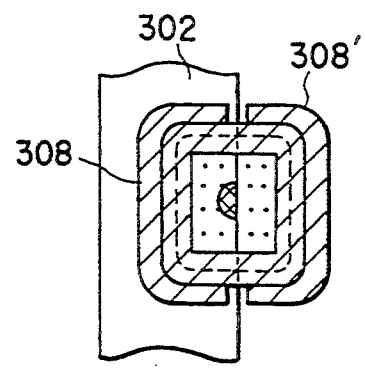
Figures 7, 10A:
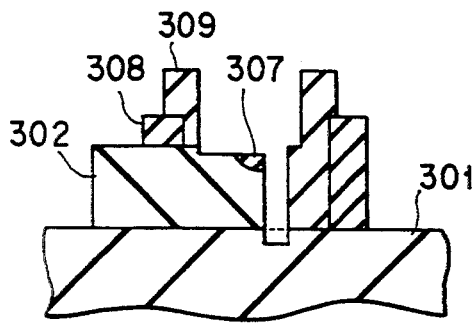
Figures 7, 10B:
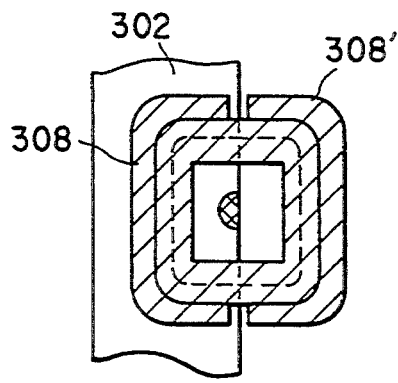
Figures 8, 10A:
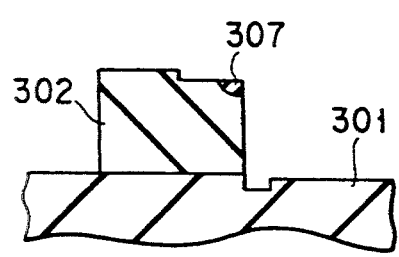
Figures 8, 10B:
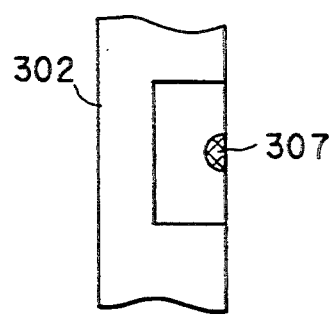

As shown in FIGS. 10A-3 and 10B-3, first thin films (carbon films) 308 and 308' are deposited by a carbon film deposition method using an FIB. At this time, each interval between the projecting SiO$_2$ 307 and the first carbon films 208 and 308' is set to be 0.4 μm or less.

As shown in FIGS. 10A-4 and 10B-4, a second thin film (carbon film) 309 is deposited on the projecting SiO$_2$ 307 and the first thin films 308 and 308' in the same manner as described above. The thickness of the carbon film 309 is about 1 μm. In this manner, the surface of the second carbon film 309 is flattened.

Figures 2, 2A, 3, 4, 5:
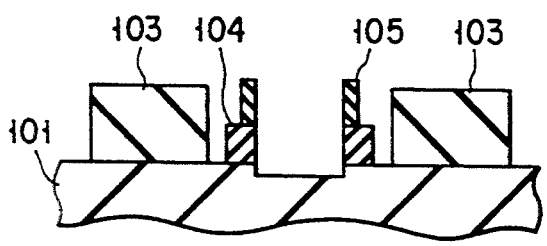
Figures 2, 2B, 3, 4, 5:
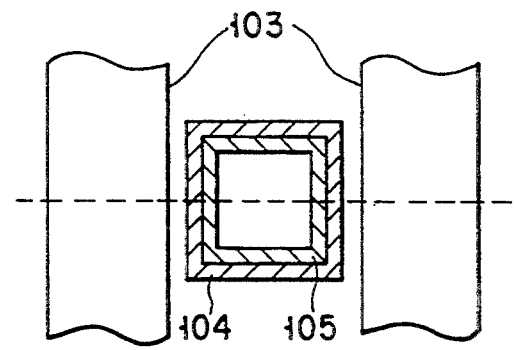
Figures 2, 2A, 3, 4, 5, 6:
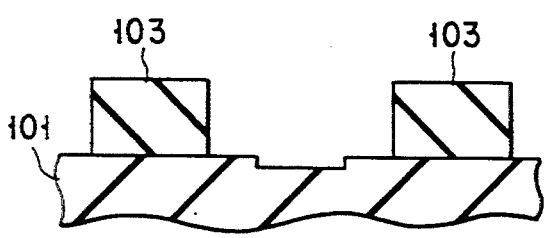
Figures 2, 2B, 3, 4, 5, 6:
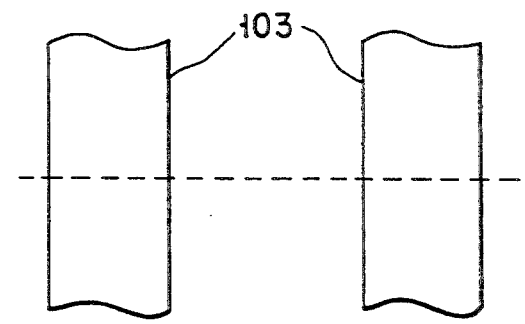

As shown in FIGS. 10A-5 and 10B-5, the flat film 309 deposited as described above and the projection 307 are simultaneously etched at the same rate. For example, when the carbon films 308, 308', and 309 deposited using the 20-keV Ga focused ion beam and a pyrene gas and the projection 307 formed by a silicon oxide film are sputter-etched by a Ga FIB, as shown in FIG. 4, an etching rate ratio of C/SiO$_2$ is changed depending on the acceleration voltage of the Ga FIB. When the acceleration voltage is about 30 kV, the etching rate ratio is about 1. Therefore, a region slightly larger than the projection 307 is raster-scanned using a beam 310 narrowly focused under the above conditions, so that the carbon and SiO$_2$ can be simultaneously etched at the same etching rate.

When a ratio of secondary ions of carbon to those of Si generated in the above processing is measured using a mass spectrometer 311, the ratio of secondary ions of C/Si is considerably changed immediately after the carbon around the bump defect in the beam-scanned region disappears. For this reason, it is determined that the projection 307 is etched at the same level as that of the surface of the shifter 302.

An unnecessary projection formed by repairing the divot defect at an edge portion must be removed conforming to the edge. An edge position is detected using an FIB. A beam-scan region is determined such that an SiO$_2$ 313 projecting from the extended line of the edge portion can be entirely removed. One side of the scan region is aligned with the edge position, and the region is raster-scanned by a narrowly focused beam, so that the projection 313, i.e., carbon and SiO$_2$ are simultaneously etched at the same etching rate. The end point of the processing of the projection 313 is determined such that the ratio of secondary ions of carbon to those of Si generated during the processing is measured using a mass spectrometer. That is, immediately after carbon around the projection 313 in the beam-scan region disappears, the ration of the secondary ions of C/Si is considerably changed. For this reason, it is determined that the projection 313 is etched at the same level as that of the surface of the quartz substrate 301. The end point of the processing can be detected from a ratio of secondary ions of C/O, in place of the ratio of secondary ions of C/Si. The method of determining the end point of the processing by measuring secondary ions is disclosed in Jpn. Pat. Appln. KOKAI Publication No. 58-106750. It is also possible to recognize the interface between C and SiO$_2$ by detecting the secondary ions.

However, in sputter-processing using a Ga FIB, a damaged layer 312 having a depth of about 15 nm is left on the processed substrate surface to decrease the transmittance for light used in exposure. For this reason, upon completion of the removal of the projections 307 and 313, the damaged layer 312 is assisted-etched using, e.g., an XeF$_2$ and a Ga FIB. In the assisted etching using the gas, since no damaged layer is left, the damaged layer 312 can be removed. Although a recessed portion having a depth of about 15 nm is formed by the processing, the recessed portion having such a depth is not transferred to a wafer and does not adversely affect the pattern around the recessed portion.

Finally, as shown in FIGS. 10A-8 and 10B-8, carbon left around the projections 307 and 31B after the projections are removed is removed by an O$_2$ plasma asher. For example, when an O$_2$ gas flows into a chamber to keep the pressure of the chamber at 0.9 Torr, and ashing is performed by applying an RF power of 500 W, the carbon can be removed without any damage. The removal of carbon can be performed by not only the O$_2$ plasma asher but also CDE using an O$_2$ gas or an O$_2$ gas containing CF$_4$. Note that the removal of remaining carbon can be more efficiently performed at once after all defects are repaired. The last two steps, i.e., the step of removing carbon and the step of removing a damaged layer may be performed in a reverse order. In addition, the removal of carbon can be more effectively performed by keeping the substrate temperature at 150° to 400° C. The removal of carbon can also be performed by laser beam irradiation and FIB irradiation in an O$_2$ or O$_3$ atmosphere.

In this manner, when a divot defect is repaired in accordance with the repairing process flow of Example 3, the following effects can be obtained.

(1) Since the divot defect 302 need not be buried with SiO$_2$ depending on the shape of the recessed portion, the process is considerably simplified.

(2) Since the projection 307 formed by burying the divot defect 302 is covered with flattening films (the first carbon film 308 and the second C film 309) such that a region larger than that of the projection is covered, when the projection is removed, damage to the peripheral portion of the defect region caused by Ga beam irradiation can be suppressed as much as possible.

(3) The flattening films (308 and 309) and the projection 307 which consist of different materials are simultaneously processed, and secondary ions discharged from the flattening films (C) and the projection (SiO$_2$) or a ratio of the secondary ions is measured. For this reason, the end point of the processing of the projection can be easily detected.

(4) Since the projection 307 having a non-uniform thickness is flattened using the flattening films (308 and 309), the repaired surface is easily flattened.

(5) The damaged layer 312 left on the surface of the divot defect which is repaired can be easily removed by assisted etching using an XeF$_2$ gas and a Ga FIB.

(6) The carbon films used to repair the defect can be easily removed by the O$_2$ plasma asher without any damage to other portions.

(7) Almost all process of repairing defects can be done in a Ga FIB apparatus by changing the type of a gas supplied into the apparatus. For this reason, defect repair can be considerably efficiently performed.

Although the repairing process of a recessed defect has been described above, the repairing process is not limited to Example 3.

In Example 3, although a carbon film deposited a pyrene gas is described above as a flattening material covering a projecting portion left after the divot defect is buried with SiO$_2$, a carbon film deposited from another hydrocarbon gas or a tungsten film using, e.g., W(CO)$_6$, may be used. The coverage property of the tungsten film is almost the same as that of a carbon film. When the above two-stage deposition was performed using the tungsten film, a flat film having a small recessed portion on its surface could be obtained as in the carbon film. In addition, when a defect (SiO$_2$) and the tungsten film are simultaneously processed, a point at which an etching rate ratio is 1 falls within the range of acceleration voltages of a general FIB apparatus.

Furthermore, the material for covering the projection defect is not limited to a film deposited by using an FIB. Use may be made of photosensitive resin or resin which is crosslinked or decomposed by charged particles. After spin-coating the resin of either type on the reticle, a laser beam, a light beam focused by using a slit, an FIB or an electron beam is applied to only the region including the target defect, by using either a microscope or the coordinates obtained in the inspection step. The, the resultant structure is developed, thereby forming a flattening film. The first thin film and the second thin film are formed by repeating the above-described sequence of steps. The thickness of either film is adjusted by changing the exposure (irradiation amount of the resist or the density of resist. In the case where the bump defect is small or in the case where a pattern is located near the defect to repair, it suffices to form only one flattening film. Thereafter, it is possible to perform the same processing as that of the carbon film which is deposited by an FIB using a pyrene gas. The photosensitive resin, or the resin crosslinked or decomposed by charged particles, can be removed by using stripping solution such as a mixture of sulfuric acid and hydrogen peroxide.

Simultaneous etching of C and SiO$_2$ can be modified as in Example 1. In addition, removal of carbon left after the projecting portion is removed can be modified as in Example 1. In addition, deposition of carbon, simultaneous etching of C and SiO$_2$, and an ion source used for removing the damaged layer can be modified as in Example 1.

Although the divot defect is buried with a silicon oxide film in Example 3, the buried material is not limited to the silicon oxide. The buried material must be selected depending on the material of a shifter. When silicon nitride, chromium oxide, or the like is used, the above repair can be performed in the same manner as described above.

In addition, various changes and modifications may be effected without departing from the spirit and scope of the invention.

EXAMPLE 4

Figure 11A:
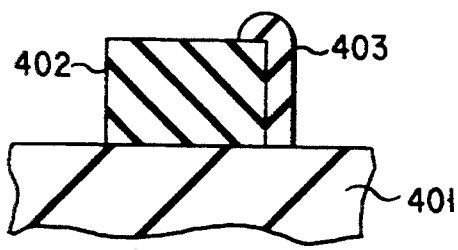
FIGS. 11A and 11B are views showing a repairing process of a bump defect at a shifter edge portion of a shifter edge type phase shift mask according to Example 4.
Figure 11B:
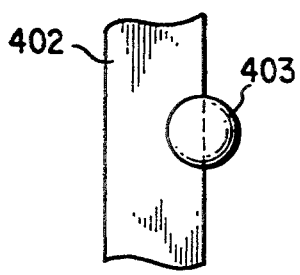

In Example 4, a method of repairing a projecting defect at a shifter edge portion of a transparent phase shift mask will be described with reference to FIGS. 11A and 11B. In this case, FIG. 11A is a sectional view, and FIG. 11B is a plan view. Reference numeral 401 denotes a substrate; 402, a phase shifter; 403, a bump defect.

A defect to be repaired is recognized using an FIB apparatus on the basis of information such as the size, shape (projection or recess), position of a defect detected using a general defect inspection system. In this case, since the defect projects from an edge, the state shown in FIGS. 11A and 11B, corresponds to the state upon completion of the step of the repair method shown in FIGS. 10A-2 and 10B-2. Therefore, when the process is performed in accordance with the steps from FIGS. 10A-2 and 10B-2, repair of the bump defect at the edge portion is completed. When the defect which projects from the edge and has a thickness smaller than that of the shifter, the steps shown in FIGS. 10A-5 and 10B-5 can be omitted of the steps sequential to the step shown in FIGS. 10A-3 and 10B-3.

EXAMPLE 5

In Example 5, a method of repairing an indefinite-shaped bump defect having no rectangular prism and consisting of a silicon oxide produced on a mask substrate of a phase shift mask will be described below. Such a defect is caused by attachment of the dust or remaining resist in etching, pin holes, or the like. A large number of defects are formed.

A bump defect repairing process has the following characteristic features. That is, a flat film is deposited on a bump defect using an FIB apparatus, the deposition film and the bump defect are simultaneously etched using an FIB at the same etching rate, and the end point of the processing is determined by detecting the inflection point of a ratio of secondary ions discharged from the deposition film to those from the bump defect during the etching. Therefore, if the film deposited on the bump defect is not flat, a surface shape obtained after the bump defect and the deposition film are simultaneously etched depends on the shape of the deposition film, so the projecting defect cannot be repaired to be flat. For this reason, it is important in the process to deposit the flattening film.

FIGS. 12A to 12F show a process flow for repairing a bump defect 502 of a phase shifter formed on a quartz substrate 501. This phase shift mask is e.g. a transparent type phase shift mask obtained by forming a phase shifter pattern consisting of a silicon oxide on the quartz substrate 501. A thickness t of the phase shifter for inverting a phase is an odd-number multiple of $t = \lambda / \{2(n-1)\}$ where $\lambda$ is the wavelength of an exposure light source and n is a refractive index. In this case, KrF is used as a light source ($\lambda = 248$ nm), and a silicon oxide film (n = 1.508) is used as a phase shifter. For this reason, t = 244 nm is set.

A defect to be repaired is recognized using the FIB apparatus on the basis of information such as the size, shape (projection or recess), and position of the defect obtained using a general defect inspection system. In this manner, assume that the bump defect 502 is recognized.

A film is deposited to cover the bump defect to be flat. For example, this deposition film is formed by assisted deposition such that a pyrene gas is decomposed at room temperature (25° C.), by a Ga focused ion beam accelerated at 20 kV to deposit carbon (C).

Figure 12A:
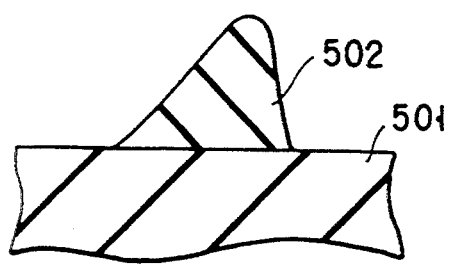
FIGS. 12A to 12F are sectional views showing a two-stage repairing process of an indefinite-shaped bump defect of a phase shifter according to Example 5.
Figure 13A:
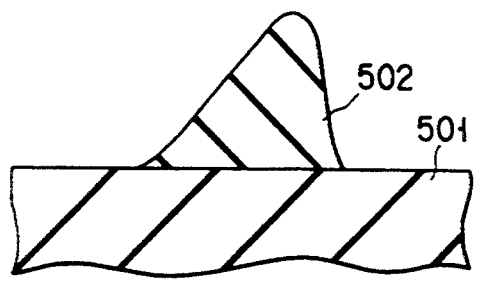
FIGS. 13A to 13C are sectional views for explaining problems in flattening the indefinite-shaped projecting defect.
Figure 13B:
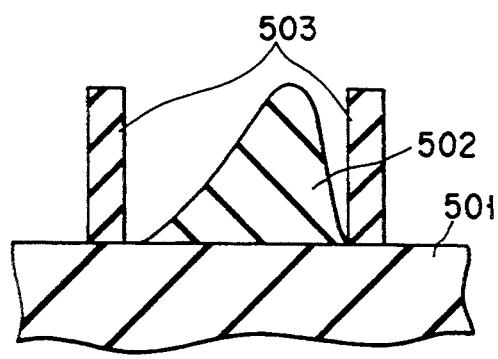
Figure 13C:
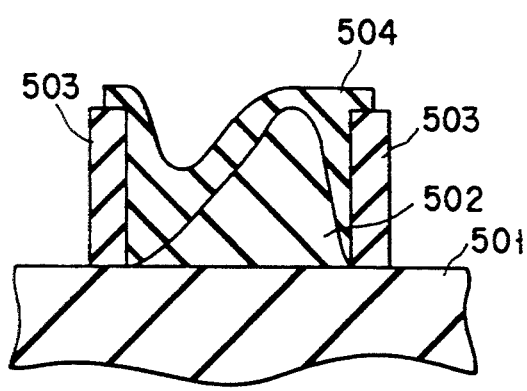

When the defect shown in FIG. 12A is to be repaired, the shape shown in FIG. 13C is obtained when only the same method as in Example 1 is used. That is, as shown in FIGS. 13A and 13B, a first deposition film 503 is deposited in a doughnut form at the same level as that of the defect 502 with a small interval around the defect 502, and a second deposition film 504 is deposited to cover the bump defect 502 and the first deposition film 503. As a result, the second deposition film 504 must be deposited to have a very large thickness to obtain a flat surface. Therefore, this method is not practical.

Figure 12B:
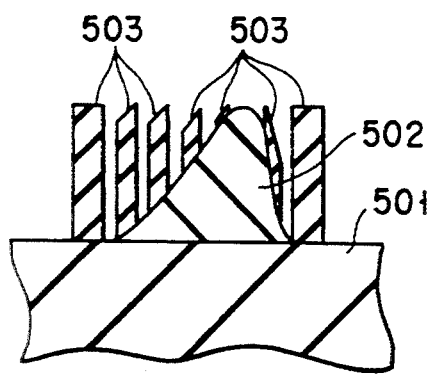
Figure 12C:
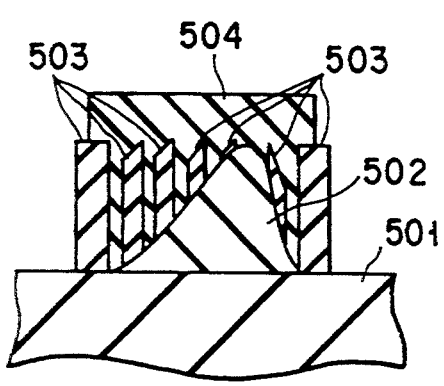

As shown in FIG. 12B, first deposition films 503 are deposited with predetermined intervals at the same level as that of the highest portion of a projecting defect 502 on the bases of information related to the shape of the defect and obtained by a general defect inspection system. As shown in FIG. 12C, a second deposition film 504 is formed in a region covering the bump defect 502 and the first deposition film 503.

A distance x between the first deposition films 503 can be determined on the basis of a relationship between the distance x and a depth y of the recessed portion of a flat surface which are obtained when the thickness of the second deposition film 504 is kept constant. For example, when the second deposition film 504 is deposited to have a thickness of 1.0 μm, the relationship shown in FIG. 3 is obtained. That is, the smaller the distance x is, the smaller the depth y is because of the following reason. That is, in assisted deposition using an ion beam and a gas, since deposition is enhanced by ions and secondary electrons multiple-scattered in the narrow groove, the deposition rate in the groove becomes higher than that on the first deposition films 503 so as to decrease the depth y, thereby obtaining a flat film.

Figure 14A:
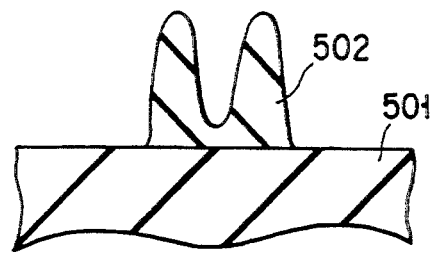
FIGS. 14A to 14D are sectional views showing a multi-stage repairing process of an indefinite-shaped bump defect of a phase shifter according to Example 5.
Figure 14B:
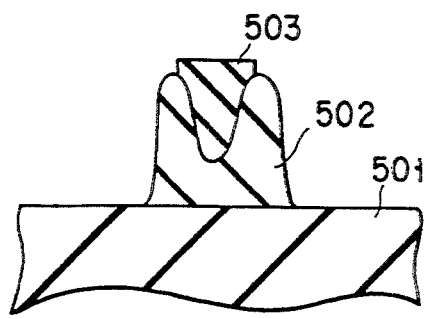
Figure 14C:
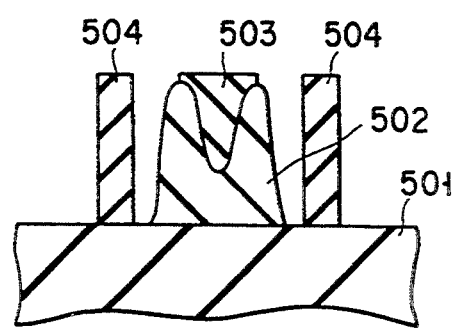
Figure 14D:
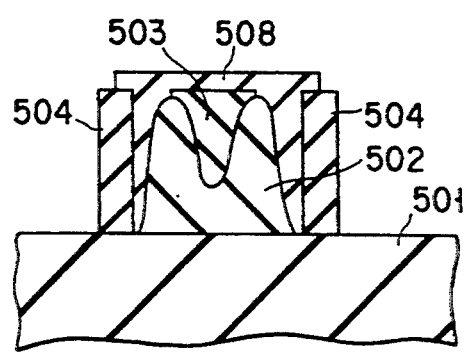

In the above description, although the projecting defect is flattened by two stages, when the difference between the peak and bottom levels of the projecting defect is large, as shown in FIG. 14A, a method of burying the bump defect with first, second and third deposition films 503, 504, and 508 using the multi-stage process shown in FIGS. 14B to 14D is effectively used.

Figure 12D:
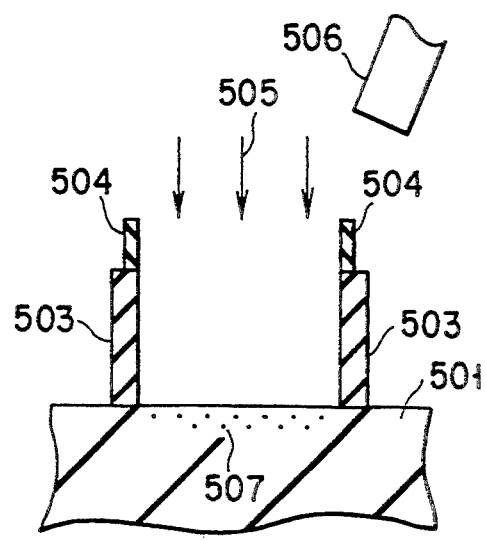

As shown in FIG. 12D, the flat films (503 and 504) deposited as described above and the bump defect 502 are etched back at the same rate. For example, when the carbon films (503 and 504) deposited using the pyrene gas and the above Ga focused ion beam having an acceleration energy of 20 keV and the bump defect 502 formed by a silicon oxide film are sputter-etched by a Ga FIB at room temperature (25° C.), as shown in FIG. 4, an etching rate ratio of $C/SiO_2$ is changed depending on the acceleration energy of the Ga FIB. When the acceleration voltage is about 30 kV, the etching rate ratio of $C/SiO_2$ is 1. Therefore, a region slightly larger than the bump defect 502 is raster-scanned using a beam 505 narrowly focused under the above conditions, so that the C and $SiO_2$ can be simultaneously etched at the same etching rate.

When a ratio of secondary ions of carbon and Si generated in the above processing is measured using a mass spectrometer 506, the ratio of secondary ions of C/Si is considerably changed immediately after the carbon around the bump defect 502 in the beam-scanned region disappears. For this reason, it is determined that the surface of the bump defect 502 is etched to the same level as that of the surface of the substrate 501. The end point of the processing can be detected from a ratio of secondary ions of C/O, in place of the ratio of secondary ions of C/Si. The method of determining the end point of the processing by measuring secondary ions is disclosed in, e.g., Jpn. Pat. Appln. KOKAI Publication No. 58-106750. It is also possible to recognize the interface between C and $SiO_2$ by detecting the secondary ions.

Figure 12E:
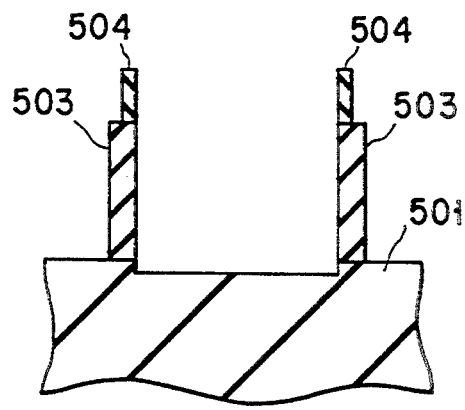

However, in the sputter-processing using the Ga FIB, a damaged layer 507 having a depth of about 15 nm is left on the surface of the processed substrate 501 to decrease the transmittance for light used in exposure. For this reason, upon completion of removal of the bump defect 502, as shown in FIG. 12E, the damaged layer 507 is assisted-etched at room temperature (25° C.) using, e.g., an $XeF_2$ gas and the Ga FIB. In the assisted etching using this gas, since no damaged layer is formed, the substrate surface can have an excellent state free from any damage. Although a recessed portion having a depth of about 15 nm is formed by the processing, the recessed portion having such a depth is not transferred to a wafer and does not adversely affect the pattern around the recessed portion.

Figure 12F:
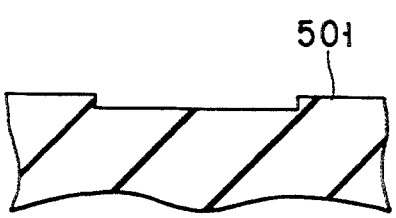

Finally, as shown in FIG. 12F, carbon left around the bump defect after the bump defect is removed is removed by an $O_2$ plasma asher. For example, when an $O_2$ gas flows into a chamber to keep the pressure of the chamber at 0.9 Torr, and ashing is performed by applying an RF power of 500 W, the carbon can be removed without any damage. The removal of carbon can be performed by not only the $O_2$ plasma asher but also CDE using an $O_2$ gas or an $O_2$ gas containing $CF_4$. Furthermore, the removal of carbon can be effectively performed by keeping the substrate temperature at 150° to 400° C. In addition, the removal of carbon can also be performed by laser beam irradiation and FIB irradiation in an $O_2$ or $O_3$ atmosphere.

The removal of remaining carbon can be more efficiently performed at once after all defects are repaired. The last two steps, i.e., the step of removing carbon and the step of removing a damaged layer may be performed in a reverse order.

The step formed on the substrate surface when the bump defect is repaired using the above repairing process will be discussed below. The height of the step formed by the repair is obtained such that the height of a projecting or recessed step De formed by a difference of the etching rates of the flattening film and the defect is added to a sum of a recess amount y of the flattening film and a recess amount Dy of the recessed portion formed by removing the damaged layer. Therefore, the height of the step formed as described above must be naturally lower than that of a step for generating a line width variation allowed in a transfer pattern.

An alternating aperture phase shift mask is taken as an example, and 10% of a minimum resolution size is defined as an allowable value. In this case, when the wavelength is 248 nm, the minimum size is 0.25 μm, the NA of a stepper is 0.45, and a coherence factor σ representing the coherence of an exposure wavelength is 0.3, the thickness of the step is about 40 nm. When the wavelength is 365 nm, the minimum size is 0.35 nm, the NA of the stepper is 0.46, and the coherence factor a representing the coherency of the exposure wavelength is 0.3, the height of the step is about 80 nm. That is, when the height of the step is smaller than 80 nm, the transferring property of the phase shift mask is not adversely affected. In other words, processing conditions of the steps can be less strict until (y+Dy+De) reaches the height of the step. More specifically, in the wavelength of KrF, when y=10 nm and Dy=15 nm, the range of the etching rate ratio can be widened (0.94 to 1.06) until the height of the step De reaches a maximum of 15 nm.

In this manner, when a bump defect is corrected in accordance with the repairing process flow of Example 5, the following effects can be obtained.

(1) Since the bump defect 502 is covered with flattening films (the first deposition film 503 and the second deposition film 504) such that the area larger than that of the bump defect 502 is covered, damage to the peripheral portion of the defect region caused by Ga beam irradiation during removal of the defect can be suppressed as much as possible.

(2) When the flattening films (503 and 504) and the bump defect which consist of different materials are simultaneously processed, and secondary ions discharged from the flattening films (C) and the defect ($SiO_2$) or a ratio of the secondary ions is measured, the end point of the process can be easily detected.

(3) Since the bump defect 502 having a non-uniform thickness is flattened using the flattening films (503 and 504), a flat shape can be easily obtained after the repair.

(4) The damaged layer 507 left on the substrate 501 can be easily removed by assisted etching using an $XeF_2$ gas and a Ga FIB.

(5) The carbon films (503 and 504) used to remove the defect can be easily removed by $O_2$ plasma asher without any damage to other portions.

(6) Only when a Ga FIB apparatus is used, and almost all process of repairing defects can be done in a Ga FIB apparatus by changing the type of a gas supplied into the apparatus. For this reason, defect repair can be considerably efficiently performed.

Although the repairing process of a projecting defect has been described above, the repairing process is not limited to Example 5.

In Example 5, although a carbon film deposited from a pyrene gas is described above as a flattening material covering a defect, a carbon film deposited from another hydrocarbon gas or a tungsten film using $w(CO)_6$ may be used. The coverage property of the tungsten film is almost the same as that of a carbon film. When the above two-stage deposition was performed at room temperature (25° C.) using the tungsten film, a flat film having a small recessed portion on its surface could be obtained as in the carbon film. In addition, when a defect ($SiO_2$) and the tungsten film are simultaneously processed, a point at which an etching rate ratio is 1 falls within the range of acceleration voltages of a general FIB apparatus.

As a flattening material covering a projecting defect, not only a film deposited by an FIB, but also a photosensitive resin or a resin crosslinked or decomposed by charged particles. Such a resin is coated on a reticle by spin coating, and a laser beam, light focused using a slit, an FIB, or an electron beam is irradiated on only a region including a defect using a microscope or coordinates obtained in the inspection step. The resultant structure is developed, thereby forming a flattening film. The first thin film and the second thin film are formed by repeating the above-described sequence of steps. The thickness of either film is adjusted by changing the exposure (irradiation) amount of the resist or the density of resist. It suffices to form only one flattening film in the case where the bump defect is small or in the case where a pattern is located near the defect to repair. Thereafter, it is possible to perform the same processing as that of the carbon film which is deposited by an FIB using a pyrene gas. The photosensitive resin, or the resin crosslinked or decomposed by charged particles, can be removed by using a stripping solution such as a mixture of sulfuric acid and hydrogen peroxide.

Although carbon and $SiO_2$ are simultaneously etched by the Ga FIB in Example 5, the etching can be performed by FIB assisted etching using a gas. In this case, the etching rates of the deposition film and a shifter can be controlled by selecting a gas or combination of gases. In addition, when an $XeF_2$ gas mixture is used as the gas, no damaged layer is left on the substrate surface when the defect is removed, the step of removing a damaged layer in the above process flow can be omitted, and excessive etching need not be performed. In this case, the point at which the etching rate of $SiO_2$ is 1 is present within the general acceleration voltage range, and an absolute etching rate is higher than that in sputter etching. For this reason, a throughput can be increased.

In sputter processing using a Ga FIB, a sputtering yield of, e.g., a quartz substrate, becomes saturated over time (FIG. 5) because the sputtered material is attached again to the peripheral portion of the processed region in sputtering, and because the sputtering yield becomes saturated over time. On the other hand, in assisted etching using an $XeF_2$ gas and a Ga FIB or an electron beam, the etching yield of the quartz substrate is always constant (FIG. 6) because no sputtered material is attached again, and excellent controllability of the processing can be advantageously obtained.

Although carbon left after the defect is removed is removed by the $O_2$ asher in the above description, the carbon may be removed by, e.g., a laser. This method utilizes evaporation of carbon caused by absorbing a laser beam. According to the method, when the laser beam is narrowly focused using a slit and then irradiated on the remaining carbon, a laser energy is absorbed by the carbon to generate heat, the carbon is sublimed and scattered. In this case, the laser energy is also absorbed by the damaged layer, and the damaged layer is removed together with the carbon. The two steps of removing the remaining carbon and the damage layer are reduced to one step, and the repairing process is more efficiently performed.

As another method, carbon reacts with $O_2$ or $O_3$ by a laser irradiation in an $O_2$ or $O_3$ atmosphere, the carbon is removed as CO and $CO_2$. In this case, since chemical reactions are used, the power of the laser can be decreased. There are conditions under which, even when the laser is irradiated on a light-shielding material near the defect, only the carbon can be removed without evaporating the light-shielding material. Therefore, the allowable density of the diameter of the laser and the degree of allowance of positional adjustment are increased, and a process margin is advantageously increased. In addition, when laser is used, pattern distortion can be suppressed because heating can be locally performed. when an FIB is used in place of the laser in the $O_2$ or $O_3$ atmosphere, the same effect as described above can be expected. In this case, in order to obtain the selection ratio of a substrate and carbon, lightweight ions or an FIB having an acceleration energy of 10 keV or less must be used.

Although deposition of carbon, simultaneous etching of C and $SiO_2$, and removal of a damaged layer are performed by a Ga FIB, an ion source is not limited to the Ga FIB. For example, it is apparent that the process in the above steps may be performed using other ions such as Au or Si.

Various changes and modifications may be effected, without departing from the spirit and scope of the present invention.

The examples described above are methods of repairing the defects of shifters made of silicon oxide. Nevertheless, the present invention can be used to repair the defects of any other type of a shifter, such as a shifter made of organic material such as resist, a shifter made of silicon, a shifter made of silicon nitride, or the like. Moreover, the invention can be employed to repair the defects of ordinary Cr masks and x-ray masks.

EXAMPLE 6

In Example 6, a method of repairing an indefinite-shaped divot defect having no rectangular prism by reducing the difference between the peak and bottom levels of a surface will be described below in detail with reference to FIGS. 15A to 15H.

A defect to be repaired is recognized using the FIB apparatus on the basis of information such as the size, shape (projection or recess), height or depth, and the position of the defect obtained using a general defect inspection system. After a divot defect 602 is recognized in a phase shifter 601, a silicon oxide film is deposited using a focused ion beam and a gas sprayed from a nozzle to slightly project from the surface of the phase shifter 601.

In this case, when the focused ion beam is irradiated to entirely cover the divot defect, in order to bury a divot defect having a complicated shape shown in FIG. 15A, a film must be deposited to largely project from the shifter surface. For this reason, a time required for the sequential steps is prolonged, and a practical throughput cannot be obtained. Therefore, the difference between the peak and bottom levels of the surface is reduced by multi-stage deposition. As shown in FIG. 15B, first silicon oxide films are deposited with predetermined intervals at the same level as that of the substrate surface on the basis of information related to the shape of the defect and obtained by a defect inspection system.

As shown in FIG. 15C, a second silicon oxide film 604 is formed in a region covering the divot defect 602 and the first silicon oxide films 603. In assisted deposition using an ion beam and a gas, since deposition is enhanced by ions and secondary electrons multiple-scattered in the narrow groove, the deposition rate in the groove becomes higher than that on the first deposition films 603 so as to decrease the difference between the peak and bottom levels of the surface, thereby obtaining flat film.

Figure 16A:
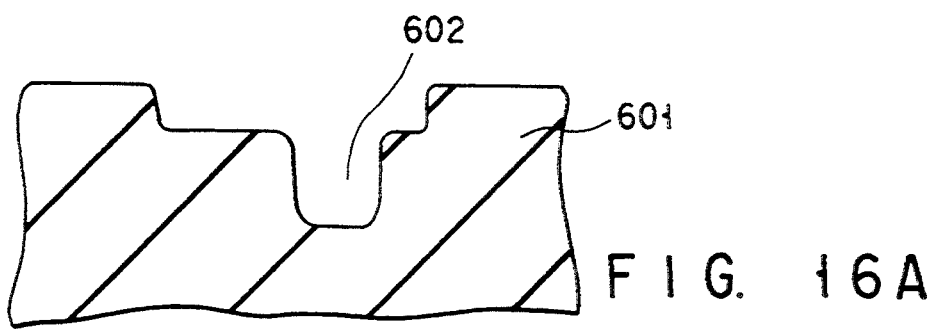
FIGS. 16A to 16D are sectional views showing a multi-stage repairing process of an indefinite-shaped divot defect of a phase shifter according to Example 6.
Figure 16B:
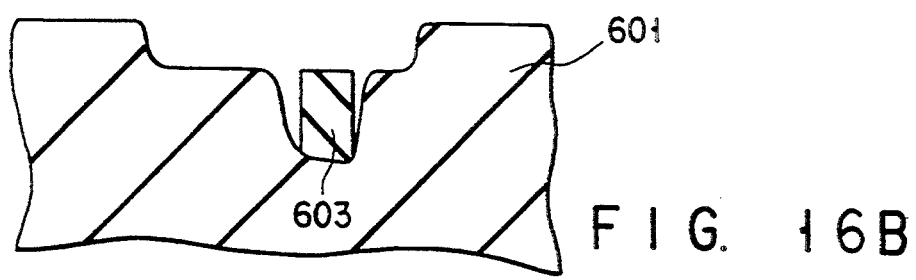
Figure 16C:
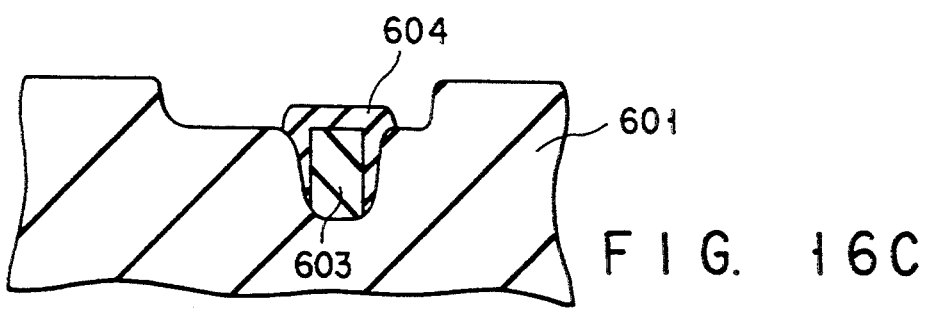
Figure 16D:
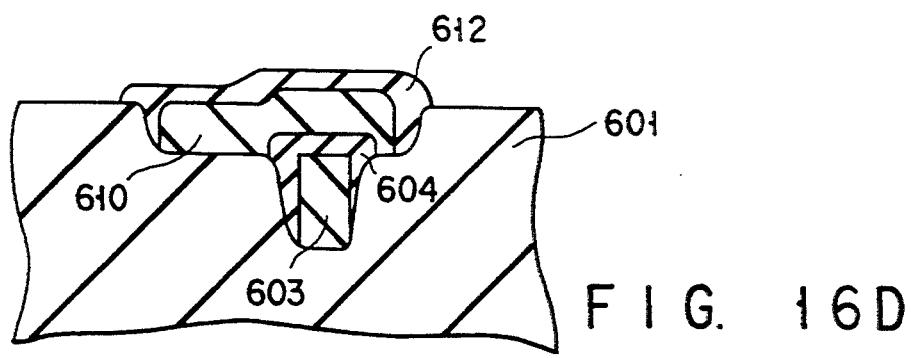

In the above description, although the recessed defect is buried with the silicon oxide film in two stages, when the difference between the peak and bottom levels of a divot defect is large as shown in FIG. 16A, a method of burying the divot defect with first and second deposition films (deposition films) 603 and 604 and third and fourth silicon oxide films (deposition films) 610 and 612 using the multi-stage process shown in FIGS. 16B to 16D is effectively used.

The silicon oxide films are deposited by irradiating a 50-keV $Si^{2+}$ FIB at room temperature (25° C.) while a gas having Si-O bonds and/or Si-H bonds or a gas mixture containing the gas, i.e., a gas mixture of 1,3,5,7-tetramethylcyclotetrasiloxane and oxygen (mixing ratio=1:7) is sprayed. The diameter of the nozzle used in this case was 0.2 mm, and the pressure of the capacitance manometer shown in FIG. 1 was 4 Torr. At this time, the total flow rate of the gas at the outlet port of the nozzle was 0.05 sccm.

Each of the $SiO_2$ films deposited as described above and having a thickness of 0.4 μm has a transmittance of 100% for light having a wavelength of 436 nm, and the transmittance of a film ($SiO_x$) deposited using a conventional gas mixture of tetramethoxysilane and oxygen is 40%. when these transmittances are compared with each other, the $SiO_2$ film of Example 6 has excellent optical characteristics. In addition, the $SiO_2$ film deposited by the method of Example 6 has a transmittance of 90.6% for light (light used in an alternating aperture phase shift mask method) having a wavelength of 248 nm. This value is larger than a transmittance (80.6%) required to repair a divot defect.

Note that, when the transmittance of each of the deposition film must be increased, the following postprocessing may be performed. After the film is deposited, UV light having a power density of 200 mW/cm² on the surface of the deposition film is irradiated on the deposition film for 1 hour. When the film is deposited while UV light is irradiated in place of the UV light processing, the deposition film having the same transmittance as described above can be obtained. In addition, when the deposition film is annealed at 350° C. in an $O_2$ atmosphere for 1 hour, the same effect as described above can be obtained.

In this case, the two types of gases may be sprayed from different nozzles, and a gas such as $N_2O$ or ozone containing oxygen as a main component may be used in place of the oxygen gas. The mixing ratio of gases is not limited to 1:7, and a mixing ratio at which the divot defect is buried with a transparent deposit not to form a cavity inside the deposit is selected depending on the gas species and the ion species and energy of the FIB which are used in the deposition. For example, when TEOS is used, a "cavity" is formed in the deposit at room temperature. However, when a mask temperature is decreased to about −70° C., the divot defect can be buried without forming a "cavity". The energy and ion species of the FIB are not limited to the 50-keV $Si^{2+}$ FIB, and another energy and ion species such as a 25-keV $Ga^+$ FIB can be selected. In addition, an electron beam may be used in place of the FIB.

However, when a charge neutralizer is arranged near the gas nozzle, and radiant heat from an electron discharging filament in the neutralizer adversely affects the gas, a black contaminant consisting of carbon is attached on the mask substrate. Therefore, the charge neutralizer is preferably arranged apart from the gas nozzle.

As shown in FIG. 15D, a first flattening film 605 is deposited around the projecting portion of the $SiO_2$ films (603 and 604) with a small interval to have a doughnut shape at the same level as that of the silicon oxide films (603 and 604). For example, the flattening film 605 is formed by assisted deposition in which carbon (C) is deposited by decomposing a pyrene gas using a Ga focused ion beam accelerated to 20 keV.

As shown in FIG. 15E, a second flattening film 606 is formed in a region covering the silicon oxide films (603 and 604) and the first flattening film 605. At this time, an interval x between the projecting portion of the silicon oxide film and the first flattening film 605 and a depth y of a recessed portion formed in the surface of the second flattening film 606 when the second deposition film 606 is deposited to have a thickness of 1.0 μm have a relationship shown in FIG. 3. That is, the smaller the interval x is, the smaller the depth y is because of the following reason, That is, in assisted deposition using an ion beam and a gas, since deposition is enhanced by ions and secondary electrons multiple-scattered in the narrow groove, the deposition rate in the groove becomes higher than that on the projecting portion of the silicon oxide films (603 and 604) or the first flattening film 605 so as to decrease the depth y, thereby obtaining a flat film.

In the above description, although the recessed defect portion is flattened by two steps, when the difference between the peak and bottom levels of the divot defect is large, after the divot defect is buried by the first and second steps, the divot defect portion may be tungsten film is almost the same as that of a carbon film. When the above two-stage deposition was performed using the tungsten film, a flat film having a small recessed portion on its surface could be obtained as in the carbon film. In addition, when a defect ($SiO_2$) and the tungsten film are simultaneously processed, a point at which an etching rate ratio is 1 falls within the range of acceleration voltages of a general FIB apparatus.

Furthermore, the material for covering the projection defect is not limited to a film deposited by using an FIB. Use may be made of photosensitive resin or resin which is crosslinked or decomposed by charged particles. After spin-coating the resin of either type on the reticule, a laser beam, a light beam focused by using a slit, an FIB or an electron beam is applied to only the region including the target defect, by using either a microscope or the coordinates obtained in the inspection step. The, the resultant structure is developed, thereby forming a flattening film. The first thin film and the second thin film are formed by repeating the above-described sequence of steps. The thickness of either film is adjusted by changing the exposure (irradiation amount of the resist or the density of resist. In the case where the bump defect is small or in the case where a pattern is located near the defect to repair, it suffices to form only one flattening film. Thereafter, it is possible to perform the same processing as that of the carbon film which is deposited by an FIB using a pyrene gas. The photosensitive resin, or the resin crosslinked or decomposed by charged particles, can be removed by using stripping solution such as a mixture of sulfuric acid and hydrogen peroxide.

Simultaneous etching of C and $SiO_2$ can be modified as in Example 1. In addition, removal of carbon left after the projecting portion is removed can be modified as in Example 1. In addition, deposition of carbon, simultaneous etching of C and $SiO_2$, and an ion source used for removing the damaged layer can be modified as in Example 1.

Although the divot defect is buried with a silicon oxide film in Example 3, the buried material is not limited to the silicon oxide. The buried material must be selected depending on the material of a shifter. When silicon nitride, chromium oxide, or the like is used, the above repair can be performed in the same manner as described above.

In addition, various changes and modifications may be effected without departing from the spirit and scope of the invention.

EXAMPLE 4

In Example 4, a method of repairing a projecting defect at a shifter edge portion of a transparent phase shift mask will be described with reference to FIGS. 11A and 11B. In this case, FIG. 11A is a sectional view, and FIG. 11B is a plan view. Reference numeral 401 denotes a substrate; 402, a phase shifter; 403, a bump defect.

A defect to be repaired is recognized using an FIB apparatus on the basis of information such as the size, shape (projection or recess), position of a defect detected using a general defect inspection system. In this case, since the defect projects from an edge, the state shown in FIGS. 11A and 11B, corresponds to the state upon completion of the step of the repair method shown in FIGS. 10A-2 and 10B-2. Therefore, when the process is performed in accordance with the steps from FIGS. 10A-2 and 10B-2, repair of the bump defect at the edge portion is completed. When the defect which projects from the edge and has a thickness smaller than that of the shifter, the steps shown in FIGS. 10A-5 and 10B-5 can be omitted of the steps sequential to the step shown in FIGS. 10A-3 and 10B-3.

EXAMPLE 5

In Example 5, a method of repairing an indefinite-shaped bump defect having no rectangular prism and consisting of a silicon oxide produced on a mask substrate of a phase shift mask will be described below. Such a defect is caused by attachment of the dust or remaining resist in etching, pin holes, or the like. A large number of defects are formed.

A bump defect repairing process has the following characteristic features. That is, a flat film is deposited on a bump defect using an FIB apparatus, the deposition film and the bump defect are simultaneously etched using an FIB at the same etching rate, and the end point of the processing is determined by detecting the inflection point of a ratio of secondary ions discharged from the deposition film to those from the bump defect during the etching. Therefore, if the film deposited on the bump defect is not flat, a surface shape obtained after the bump defect and the deposition film are simultaneously etched depends on the shape of the deposition film, so the projecting defect cannot be repaired to be flat. For this reason, it is important in the process to deposit the flattening film.

FIGS. 12A to 12F show a process flow for repairing a bump defect 502 of a phase shifter formed on a quartz substrate 501. This phase shift mask is e.g. a transparent type phase shift mask obtained by forming a phase shifter pattern consisting of a silicon oxide on the quartz substrate 501. A thickness t of the phase shifter for inverting a phase is an odd-number multiple of $t = \lambda/\{2(n-1)\}$ where $\lambda$ is the wavelength of an exposure light source and n is a refractive index. In this case, KrF is used as a light source ($\lambda = 248$ nm), and a silicon oxide film (n = 1.508) is used as a phase shifter. For this reason, t = 244 nm is set.

A defect to be repaired is recognized using the FIB apparatus on the basis of information such as the size, shape (projection or recess), and position of the defect obtained using a general defect inspection system. In this manner, assume that the bump defect 502 is recognized.

A film is deposited to cover the bump defect to be flat. For example, this deposition film is formed by assisted deposition such that a pyrene gas is decomposed at room temperature (25° C.), by a Ga focused ion beam accelerated at 20 kV to deposit carbon (C).

When the defect shown in FIG. 12A is to be repaired, the shape shown in FIG. 13C is obtained when only the same method as in Example 1 is used. That is, as shown in FIGS. 13A and 13B, a first deposition film 503 is deposited in a doughnut form at the same level as that of the defect 502 with a small interval around the defect 502, and a second deposition film 504 is deposited to cover the bump defect 502 and the first deposition film 503. As a result, the second deposition film 504 must be deposited to have a very large thickness to obtain a flat surface. Therefore, this method is not practical.

As shown in FIG. 12B, first deposition films 503 are deposited with predetermined intervals at the same level as that of the highest portion of a projecting defect 502 on the bases of information related to the shape of the defect and obtained by a general defect inspection system. As shown in FIG. 12C, a second deposition film 504 is formed in a region covering the bump defect 502 and the first deposition film 503.

A distance x between the first deposition films 503 can be determined on the basis of a relationship between the distance x and a depth y of the recessed portion of a flat surface which are obtained when the thickness of the second deposition film 504 is kept constant. For example, when the second deposition film 504 is deposited to have a thickness of 1.0 μm, the relationship shown in FIG. 3 is obtained. That is, the smaller the distance x is, the smaller the depth y is because of the following reason. That is, in assisted deposition using an ion beam and a gas, since deposition is enhanced by ions and secondary electrons multiple-scattered in the narrow groove, the deposition rate in the groove becomes higher than that on the first deposition films 503 so as to decrease the depth y, thereby obtaining a flat film.

In the above description, although the projecting defect is flattened by two stages, when the difference between the peak and bottom levels of the projecting defect is large, as shown in FIG. 14A, a method of burying the bump defect with first, second and third deposition films 503, 504, and 508 using the multi-stage process shown in FIGS. 14B to 14D is effectively used.

As shown in FIG. 12D, the flat films (503 and 504) deposited as described above and the bump defect 502 are etched back at the same rate. For example, when the carbon films (503 and 504) deposited using the pyrene gas and the above Ga focused ion beam having an acceleration energy of 20 keV and the bump defect 502 formed by a silicon oxide film are sputter-etched by a Ga FIB at room temperature (25° C.), as shown in FIG. 4, an etching rate ratio of C/SiO$_2$ is changed depending on the acceleration energy of the Ga FIB. When the acceleration voltage is about 30 kV, the etching rate ratio of C/SiO$_2$ is 1. Therefore, a region slightly larger than the bump defect 502 is raster-scanned using a beam 505 narrowly focused under the above conditions, so that the C and SiO$_2$ can be simultaneously etched at the same etching rate.

When a ratio of secondary ions of carbon and Si generated in the above processing is measured using a mass spectrometer 506, the ratio of secondary ions of C/Si is considerably changed immediately after the carbon around the bump defect 502 in the beam-scanned region disappears. For this reason, it is determined that the surface of the bump defect 502 is etched to the same level as that of the surface of the substrate 501. The end point of the processing can be detected from a ratio of secondary ions of C/O, in place of the ratio of secondary ions of C/Si. The method of determining the end point of the processing by measuring secondary ions is disclosed in, e.g., Jpn. Pat. Appln. KOKAI Publication No. 58-106750. It is also possible to recognize the interface between C and SiO$_2$ by detecting the secondary ions.

However, in the sputter-processing using the Ga FIB, a damaged layer 507 having a depth of about 15 nm is left on the surface of the processed substrate 501 to decrease the transmittance for light used in exposure. For this reason, upon completion of removal of the bump defect 502, as shown in FIG. 12E, the damaged layer 507 is assisted-etched at room temperature (25° C.) using, e.g., an XeF$_2$ gas and the Ga FIB. In the assisted etching using this gas, since no damaged layer is formed, the substrate surface can have an excellent state free from any damage. Although a recessed portion having a depth of about 15 nm is formed by the processing, the recessed portion having such a depth is not transferred to a wafer and does not adversely affect the pattern around the recessed portion.

Finally, as shown in FIG. 12F, carbon left around the bump defect after the bump defect is removed is removed by an O$_2$ plasma asher. For example, when an O$_2$ gas flows into a chamber to keep the pressure of the chamber at 0.9 Torr, and ashing is performed by applying an RF power of 500 W, the carbon can be removed without any damage. The removal of carbon can be performed by not only the O$_2$ plasma asher but also CDE using an O$_2$ gas or an O$_2$ gas containing CF$_4$. Furthermore, the removal of carbon can be effectively performed by keeping the substrate temperature at 150° to 400° C. In addition, the removal of carbon can also be performed by laser beam irradiation and FIB irradiation in an O$_2$ or O$_3$ atmosphere.

The removal of remaining carbon can be more efficiently performed at once after all defects are repaired. The last two steps, i.e., the step of removing carbon and the step of removing a damaged layer may be performed in a reverse order.

The step formed on the substrate surface when the bump defect is repaired using the above repairing process will be discussed below. The height of the step formed by the repair is obtained such that the height of a projecting or recessed step De formed by a difference of the etching rates of the flattening film and the defect is added to a sum of a recess amount y of the flattening film and a recess amount Dy of the recessed portion formed by removing the damaged layer. Therefore, the height of the step formed as described above must be naturally lower than that of a step for generating a line width variation allowed in a transfer pattern.

An alternating aperture phase shift mask is taken as an example, and 10% of a minimum resolution size is defined as an allowable value. In this case, when the wavelength is 248 nm, the minimum size is 0.25 μm, the NA of a stepper is 0.45, and a coherence factor σ representing the coherence of an exposure wavelength is 0.3, the thickness of the step is about 40 nm. When the wavelength is 365 nm, the minimum size is 0.35 nm, the NA of the stepper is 0.46, and the coherence factor a representing the coherency of the exposure wavelength is 0.3, the height of the step is about 80 nm. That is, when the height of the step is smaller than 80 nm, the transferring property of the phase shift mask is not adversely affected. In other words, processing conditions of the steps can be less strict until (y+Dy+De) reaches the height of the step. More specifically, in the wavelength of KrF, when y=10 nm and Dy=15 nm, the range of the etching rate ratio can be widened (0.94 to 1.06) until the height of the step De reaches a maximum of 15 nm.

In this manner, when a bump defect is corrected in accordance with the repairing process flow of Example 5, the following effects can be obtained.

(1) Since the bump defect 502 is covered with flattening films (the first deposition film 503 and the second deposition film 504) such that the area larger than that of the bump defect 502 is covered, damage to the peripheral portion of the defect region caused by Ga beam irradiation during removal of the defect can be suppressed as much as possible.

(2) When the flattening films (503 and 504) and the bump defect which consist of different materials are simultaneously processed, and secondary ions discharged from the flattening films (C) and the defect ($SiO_2$) or a ratio of the secondary ions is measured, the end point of the process can be easily detected.

(3) Since the bump defect 502 having a non-uniform thickness is flattened using the flattening films (503 and 504), a flat shape can be easily obtained after the repair.

(4) The damaged layer 507 left on the substrate 501 can be easily removed by assisted etching using an $XeF_2$ gas and a Ga FIB.

(5) The carbon films (503 and 504) used to remove the defect can be easily removed by $O_2$ plasma asher without any damage to other portions.

(6) Only when a Ga FIB apparatus is used, and almost all process of repairing defects can be done in a Ga FIB apparatus by changing the type of a gas supplied into the apparatus. For this reason, defect repair can be considerably efficiently performed.

Although the repairing process of a projecting defect has been described above, the repairing process is not limited to Example 5.

In Example 5, although a carbon film deposited from a pyrene gas is described above as a flattening material covering a defect, a carbon film deposited from another hydrocarbon gas or a tungsten film using $w(CO)_6$ may be used. The coverage property of the tungsten film is almost the same as that of a carbon film. When the above two-stage deposition was performed at room temperature (25° C.) using the tungsten film, a flat film having a small recessed portion on its surface could be obtained as in the carbon film. In addition, when a defect ($SiO_2$) and the tungsten film are simultaneously processed, a point at which an etching rate ratio is 1 falls within the range of acceleration voltages of a general FIB apparatus.

As a flattening material covering a projecting defect, not only a film deposited by an FIB, but also a photosensitive resin or a resin crosslinked or decomposed by charged particles. Such a resin is coated on a reticle by spin coating, and a laser beam, light focused using a slit, an FIB, or an electron beam is irradiated on only a region including a defect using a microscope or coordinates obtained in the inspection step. The resultant structure is developed, thereby forming a flattening film. The first thin film and the second thin film are formed by repeating the above-described sequence of steps. The thickness of either film is adjusted by changing the exposure (irradiation) amount of the resist or the density of resist. It suffices to form only one flattening film in the case where the bump defect is small or in the case where a pattern is located near the defect to repair. Thereafter, it is possible to perform the same processing as that of the carbon film which is deposited by an FIB using a pyrene gas. The photosensitive resin, or the resin crosslinked or decomposed by charged particles, can be removed by using a stripping solution such as a mixture of sulfuric acid and hydrogen peroxide.

Although carbon and $SiO_2$ are simultaneously etched by the Ga FIB in Example 5, the etching can be performed by FIB assisted etching using a gas. In this case, the etching rates of the deposition film and a shifter can be controlled by selecting a gas or combination of gases. In addition, when an $XeF_2$ gas mixture is used as the gas, no damaged layer is left on the substrate surface when the defect is removed, the step of removing a damaged layer in the above process flow can be omitted, and excessive etching need not be performed. In this case, the point at which the etching rate of $SiO_2$ is 1 is present within the general acceleration voltage range, and an absolute etching rate is higher than that in sputter etching. For this reason, a throughput can be increased.

In sputter processing using a Ga FIB, a sputtering yield of, e.g., a quartz substrate, becomes saturated over time (FIG. 5) because the sputtered material is attached again to the peripheral portion of the processed region in sputtering, and because the sputtering yield becomes saturated over time. On the other hand, in assisted etching using an $XeF_2$ gas and a Ga FIB or an electron beam, the etching yield of the quartz substrate is always constant (FIG. 6) because no sputtered material is attached again, and excellent controllability of the processing can be advantageously obtained.

Although carbon left after the defect is removed is removed by the $O_2$ asher in the above description, the carbon may be removed by, e.g., a laser. This method utilizes evaporation of carbon caused by absorbing a laser beam. According to the method, when the laser beam is narrowly focused using a slit and then irradiated on the remaining carbon, a laser energy is absorbed by the carbon to generate heat, the carbon is sublimed and scattered. In this case, the laser energy is also absorbed by the damaged layer, and the damaged layer is removed together with the carbon. The two steps of removing the remaining carbon and the damage layer are reduced to one step, and the repairing process is more efficiently performed.

As another method, carbon reacts with $O_2$ or $O_3$ by a laser irradiation in an $O_2$ or $O_3$ atmosphere, the carbon is removed as CO and $CO_2$. In this case, since chemical reactions are used, the power of the laser can be decreased. There are conditions under which, even when the laser is irradiated on a light-shielding material near the defect, only the carbon can be removed without evaporating the light-shielding material. Therefore, the allowable density of the diameter of the laser and the degree of allowance of positional adjustment are increased, and a process margin is advantageously increased. In addition, when laser is used, pattern distortion can be suppressed because heating can be locally performed. when an FIB is used in place of the laser in the $O_2$ or $O_3$ atmosphere, the same effect as described above can be expected. In this case, in order to obtain the selection ratio of a substrate and carbon, lightweight ions or an FIB having an acceleration energy of 10 keV or less must be used.

Although deposition of carbon, simultaneous etching of C and $SiO_2$, and removal of a damaged layer are performed by a Ga FIB, an ion source is not limited to the Ga FIB. For example, it is apparent that the process in the above steps may be performed using other ions such as Au or Si.

Various changes and modifications may be effected, without departing from the spirit and scope of the present invention.

The examples described above are methods of repairing the defects of shifters made of silicon oxide. Nevertheless, the present invention can be used to repair the defects of any other type of a shifter, such as a shifter made of organic material such as resist, a shifter made of silicon, a shifter made of silicon nitride, or the like. Moreover, the invention can be employed to repair the defects of ordinary Cr masks and x-ray masks.

EXAMPLE 6

In Example 6, a method of repairing an indefinite-shaped divot defect having no rectangular prism by reducing the difference between the peak and bottom levels of a surface will be described below in detail with reference to FIGS. 15A to 15H.

A defect to be repaired is recognized using the FIB apparatus on the basis of information such as the size, shape (projection or recess), height or depth, and the position of the defect obtained using a general defect inspection system. After a divot defect 602 is recognized in a phase shifter 601, a silicon oxide film is deposited using a focused ion beam and a gas sprayed from a nozzle to slightly project from the surface of the phase shifter 601.

In this case, when the focused ion beam is irradiated to entirely cover the divot defect, in order to bury a divot defect having a complicated shape shown in FIG. 15A, a film must be deposited to largely project from the shifter surface. For this reason, a time required for the sequential steps is prolonged, and a practical throughput cannot be obtained. Therefore, the difference between the peak and bottom levels of the surface is reduced by multi-stage deposition. As shown in FIG. 15B, first silicon oxide films are deposited with predetermined intervals at the same level as that of the substrate surface on the basis of information related to the shape of the defect and obtained by a defect inspection system.

As shown in FIG. 15C, a second silicon oxide film 604 is formed in a region covering the divot defect 602 and the first silicon oxide films 603. In assisted deposition using an ion beam and a gas, since deposition is enhanced by ions and secondary electrons multiple-scattered in the narrow groove, the deposition rate in the groove becomes higher than that on the first deposition films 603 so as to decrease the difference between the peak and bottom levels of the surface, thereby obtaining flat film.

In the above description, although the recessed defect is buried with the silicon oxide film in two stages, when the difference between the peak and bottom levels of a divot defect is large as shown in FIG. 16A, a method of burying the divot defect with first and second deposition films (deposition films) 603 and 604 and third and fourth silicon oxide films (deposition films) 610 and 612 using the multi-stage process shown in FIGS. 16B to 16D is effectively used.

The silicon oxide films are deposited by irradiating a 50-keV $Si^{2+}$ FIB at room temperature (25° C.) while a gas having Si-O bonds and/or Si-H bonds or a gas mixture containing the gas, i.e., a gas mixture of 1,3,5,7-tetramethylcyclotetrasiloxane and oxygen (mixing ratio=1:7) is sprayed. The diameter of the nozzle used in this case was 0.2 mm, and the pressure of the capacitance manometer shown in FIG. 1 was 4 Torr. At this time, the total flow rate of the gas at the outlet port of the nozzle was 0.05 sccm.

Each of the $SiO_2$ films deposited as described above and having a thickness of 0.4 μm has a transmittance of 100% for light having a wavelength of 436 nm, and the transmittance of a film ($SiO_x$) deposited using a conventional gas mixture of tetramethoxysilane and oxygen is 40%. when these transmittances are compared with each other, the $SiO_2$ film of Example 6 has excellent optical characteristics. In addition, the $SiO_2$ film deposited by the method of Example 6 has a transmittance of 90.6% for light (light used in an alternating aperture phase shift mask method) having a wavelength of 248 nm. This value is larger than a transmittance (80.6%) required to repair a divot defect.

Note that, when the transmittance of each of the deposition film must be increased, the following post-processing may be performed. After the film is deposited, UV light having a power density of 200 $mW/cm^2$ on the surface of the deposition film is irradiated on the deposition film for 1 hour. When the film is deposited while UV light is irradiated in place of the UV light processing, the deposition film having the same transmittance as described above can be obtained. In addition, when the deposition film is annealed at 350° C. in an $O_2$ atmosphere for 1 hour, the same effect as described above can be obtained.

In this case, the two types of gases may be sprayed from different nozzles, and a gas such as $N_2O$ or ozone containing oxygen as a main component may be used in place of the oxygen gas. The mixing ratio of gases is not limited to 1:7, and a mixing ratio at which the divot defect is buried with a transparent deposit not to form a cavity inside the deposit is selected depending on the gas species and the ion species and energy of the FIB which are used in the deposition. For example, when TEOS is used, a "cavity" is formed in the deposit at room temperature. However, when a mask temperature is decreased to about −70° C., the divot defect can be buried without forming a "cavity". The energy and ion species of the FIB are not limited to the 50-keV $Si^{2+}$ FIB, and another energy and ion species such as a 25-keV $Ga^+$ FIB can be selected. In addition, an electron beam may be used in place of the FIB.

However, when a charge neutralizer is arranged near the gas nozzle, and radiant heat from an electron discharging filament in the neutralizer adversely affects the gas, a black contaminant consisting of carbon is attached on the mask substrate. Therefore, the charge neutralizer is preferably arranged apart from the gas nozzle.

As shown in FIG. 15D, a first flattening film 605 is deposited around the projecting portion of the $SiO_2$ films (603 and 604) with a small interval to have a doughnut shape at the same level as that of the silicon oxide films (603 and 604). For example, the flattening film 605 is formed by assisted deposition in which carbon (C) is deposited by decomposing a pyrene gas using a Ga focused ion beam accelerated to 20 keV.

As shown in FIG. 15E, a second flattening film 606 is formed in a region covering the silicon oxide films (603 and 604) and the first flattening film 605. At this time, an interval x between the projecting portion of the silicon oxide film and the first flattening film 605 and a depth y of a recessed portion formed in the surface of the second flattening film 606 when the second deposition film 606 is deposited to have a thickness of 1.0 μm have a relationship shown in FIG. 3. That is, the smaller the interval x is, the smaller the depth y is because of the following reason, That is, in assisted deposition using an ion beam and a gas, since deposition is enhanced by ions and secondary electrons multiple-scattered in the narrow groove, the deposition rate in the groove becomes higher than that on the projecting portion of the silicon oxide films (603 and 604) or the first flattening film 605 so as to decrease the depth y, thereby obtaining a flat film.

In the above description, although the recessed defect portion is flattened by two steps, when the difference between the peak and bottom levels of the divot defect is large, after the divot defect is buried by the first and second steps, the divot defect portion may be effectively flattened using the multi-step process shown in FIGS. 14A to 14D.

As shown in FIG. 15F, the flat films (605 and 606) deposited as described above and the silicon oxide films (603 and 604) are simultaneously etched back at the same rate. For example, when the projecting portion (603 and 604) formed by the silicon oxide films and the carbon films (605 and 606) deposited using the 20-keV Ga focused ion beam and the pyrene gas are to be sputter-etched by a Ga FIB, as shown in FIG. 4, an etching rate ratio of $C/SiO_2$ is changed depending on the acceleration voltage of the Ga FIB. When the acceleration voltage is about 30 kV, the etching rate ratio of $C/SiO_2$ becomes about 1. Therefore, a region slightly larger than the projecting portion is raster-scanned using a beam 607 narrowly focused under the above conditions, so that the carbon and silicon oxide films can be simultaneously etched at the same etching rate.

When a ratio of secondary ions of carbon to those of Si generated in the above processing is measured using a mass spectrometer 608, the ratio of secondary ions of C/Si is considerably changed immediately after the carbon around the projecting portion of the silicon oxide films (603 and 604) in the beam-scanned region disappears. For this reason, it is determined that the silicon oxide films are etched to the same level as that of the surface of the shifter 601. The end point of the processing can be detected from a ratio of secondary ions of C/O in place of the ratio of secondary ions of C/Si. The method of determining the end point of the processing by measuring secondary ions is disclosed in, e.g., Jpn. Pat. Appln. KOKAI Publication No. 58-106750.

It is also possible to recognize the interface between C and $SiO_2$ by detecting the secondary ions.

However, in the sputter-processing using the Ga FIB, a damaged layer 609 having a depth of about 15 nm is left on the substrate surface to decrease the transmittance to light used in exposure. For this reason, upon completion of removal of the projecting part of the silicon oxide films (603 and 604), as shown in FIG. 15G, the damaged layer 609 is assisted-etched using, e.g., an $XeF_2$ gas and the Ga FIB. In the assisted etching using this gas, since no damaged layer is left, the substrate surface can have an excellent state free from any damage. Although a recessed portion having a depth of about 15 nm is formed by the processing, the recessed portion having such a depth is not transferred to a wafer and does not adversely affect the pattern around the recessed portion.

Finally, as shown in FIG. 15H, carbon left after the projecting part of the silicon oxide films (603 and 604) are removed is removed by an $O_2$ plasma asher. For example, when an $O_2$ gas flows into a chamber to keep the pressure of the chamber at 0.9 Torr, and ashing is performed by applying an RF power of 500 W, the carbon can be removed without any damage. The removal of carbon can be performed by not only the $O_2$ plasma asher but also CDE using an $O_2$ gas or an $O_2$ gas containing $CF_4$. Furthermore, the removal of carbon can be effectively performed by keeping the substrate temperature at 150° to 400° C. In addition, the removal of carbon can also be performed by laser beam irradiation and FIB irradiation in an $O_2$ or $O_3$ atmosphere.

The removal of remaining carbon can be more efficiently performed at once after all defects are repaired. The last two steps, i.e., the step of removing carbon and the step of removing a damaged layer may be performed in a reverse order.

As described above, when the divot defect is repaired in accordance with the repairing process flow of Example 6, the following effects can be obtained.

(1) Since the divot defect 602 need not be buried with the silicon oxide films (603 and 604) depending on the shape of the recessed portion, the process is considerably simplified.

(2) Since the projecting portion formed by burying the divot defect 602 is covered with flattening films (605 and 606) such that a region larger than that of the projecting portion is covered, when the projecting portion is removed, damage to the peripheral portion of the defect region caused by Ga beam irradiation can be suppressed as much as possible.

(3) The flattening films (605 and 606) and the silicon oxide films (603 and 604) which consist of different materials are simultaneously processed, and secondary ions discharged from the flattening films (C) and the projecting portion (silicon oxide films) or a ratio of the secondary ions or secondary electrons are measured. For this reason, the end point of the processing of the projecting portion can be easily detected.

(4) Since the projecting portion having a non-uniform thickness is flattened using the flattening films (605 and 606), the repaired surface is easily flattened.

(5) The damaged layer 609 left on the surface of the divot defect which is repaired can be easily removed by assisted etching using an $XeF_2$ and a Ga FIB.

(6) The carbon films used to repair the defect can be easily removed by an $O_2$ plasma asher without any damage to other portions.

(7) Almost all process of repairing defects can be done in a Ga FIB apparatus by changing the type of a gas supplied into the apparatus. For this reason, defect repair can be considerably efficiently performed.

Although the repairing process of the recessed defect has been described above, the repairing process is not limited to Example 6.

In Example 6, although a carbon film deposited from a pyrene gas is described above as a flattening material covering a projecting portion left after the divot defect is buried with the silicon oxide films, the same modification as described in Example 1 can be effected.

In addition, simultaneous etching of carbon and $SiO_2$ can be modified as in Example 1, and removal of carbon left after the projecting portion is removed can be modified as in Example 1. Deposition of carbon, the simultaneous etching of C and $SiO_2$, and an ion source used for removing the damaged layer can be modified as in Example 1.

Some steps of the process can be omitted depending on the shape of a divot defect. That is, after the silicon oxide films are deposited by the large number of steps shown in FIGS. 15A to 15C, depending on the shape of a divot defect, the difference between the peak and bottom levels of the surface falls within the range of the depth of an allowable step in defect repair. For this reason, the steps from FIG. 15D need not be performed.

Although the divot defect is buried with silicon oxide films in Example 6, the buried material is not limited to the silicon oxide. The buried material must be selected depending on the material of a shifter. When silicon nitride, chromium oxide, or the like is used, the above repair can be performed in the same manner as described above.

EXAMPLE 7

In Example 7, a method of repairing a recessed defect of a shifter, especially including a film-quality improving effect of a buried material deposited in the divot defect, will be described.

Figure 17:
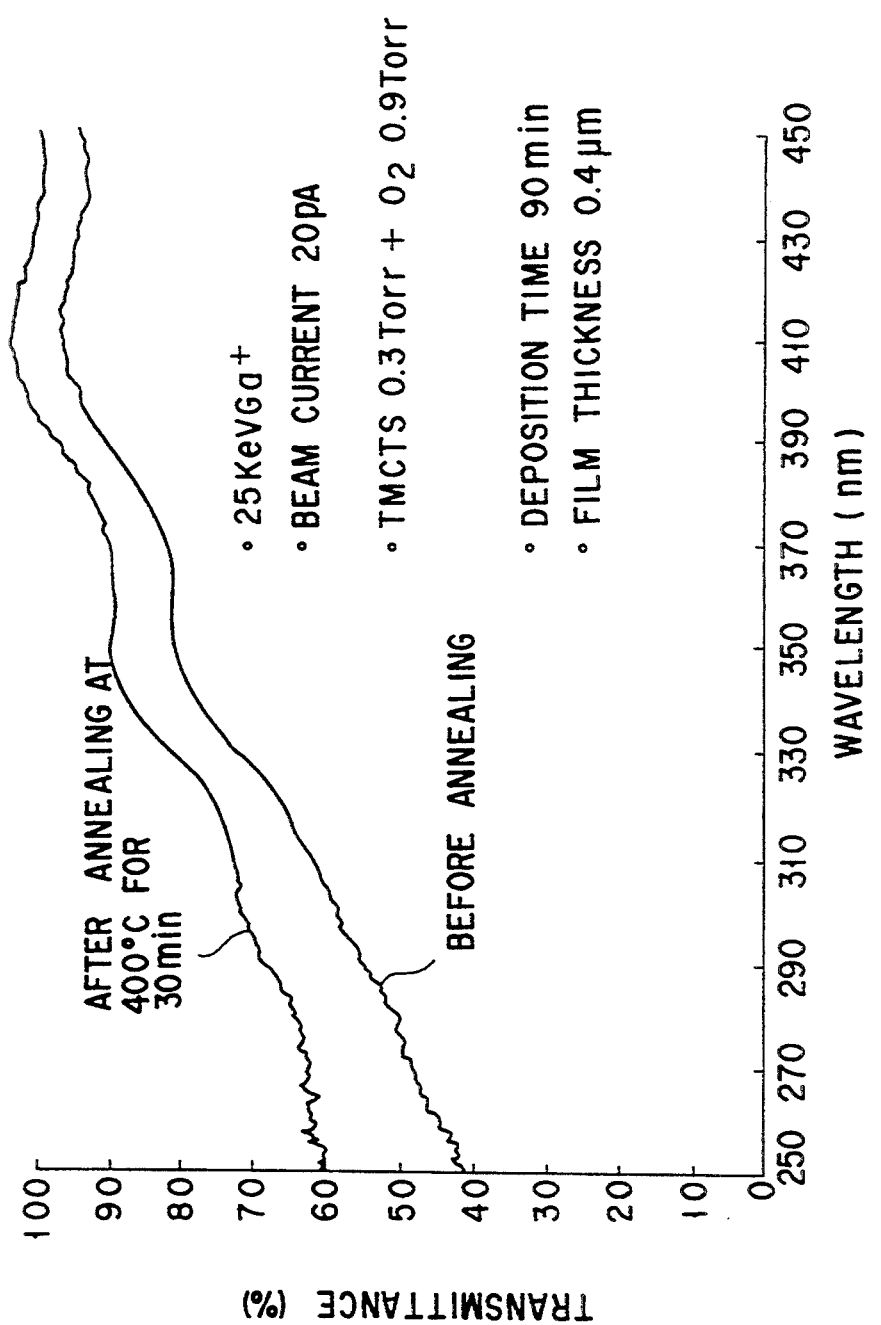
FIG. 17 is a graph for explaining Example 7, showing a change in transmittance of an $SiO_2$ film after and before annealing.

Example 7 is basically the same as Example 2. As in the steps shown in FIGS. 18A to 18D, an $SiO_2$ film 706 is formed, and first and second deposition films 707 and 708 are formed. Thereafter, a laser beam is irradiated on a region covered with the first and second deposition films 708, the $SiO_2$ film 706 under the deposition films 707 and 708 is locally heated by heat generated by energy absorption of a carbon film. In the $SiO_2$ film 706, a defect having an $SiO_x$ structure is improved by an annealing effect caused by heating, thereby increasing the transmittance of the $SiO_2$ film. In this manner, an increase in transmittance shown in FIG. 17 is observed. The sequential steps are performed in the same manner as in the steps shown in FIGS. 7E to 7G, the $SiO_2$ film 706 and the deposition films 707 and 708 are etched back, and a damaged layer 211 is removed.

In this manner, when the divot defect is repaired in accordance with the repairing process flow of Example 7, in addition to the effects (1) to (7) described in Example 2, the following effect can be obtained. That is, the structural defect of the $SiO_2$ film 706 is improved by laser annealing so as to increase the transmittance of the $SiO_2$ film 706.

EXAMPLE 8

In Example 8, a method of repairing a recessed defect of a shifter will be described in detail with reference to FIG. 18. Example 8 is basically the same as Example 2. However, Example 8 is different from Example 2 in that the transmittance of a deposition film is increased by decreasing the energy of an FIB irradiated during deposition of the film.

Figure 18A:
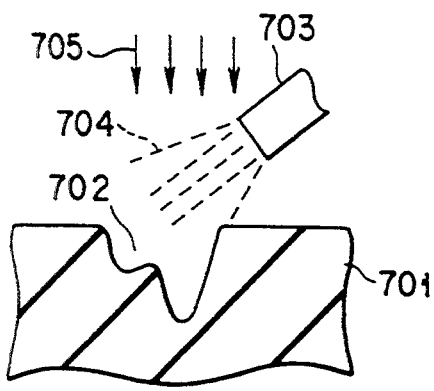
FIGS. 18A to 18G are sectional views showing a repairing process of a divot defect of a shifter according to Example 8.
Figure 18B:
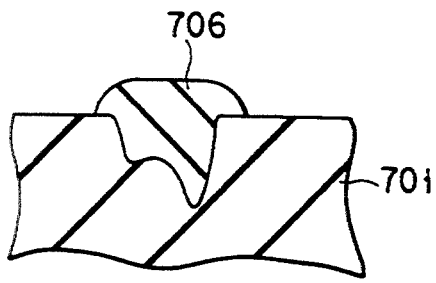

A defect to be repaired is recognized using the FIB apparatus on the basis of information such as the size, shape (projection or recess), and position of the defect obtained using a general defect inspection system. As shown in FIG. 18A, after a divot defect 702 is recognized in a phase shifter 701, a Ga FIB 705 is irradiated in a region slightly larger than the divot defect 702 while a gas having Si-O bonds and/or Si-H bonds or a gas mixture containing the gas, i.e., a gas mixture 704 of 1,3,5,7-tetramethylcyclotetrasiloxane and oxygen (mixing ratio=1:7) is sprayed from a nozzle 703 on the divot defect 702 at room temperature. In this manner, as shown in FIG. 18B, an $SiO_2$ film (buried material) slightly projecting from the surface of the shifter 701 is deposited. Note that the diameter of the nozzle used in this case was 0.2 mm, and the pressure of the capacitance manometer shown in FIG. 1 was 4 Torr. At this time, the total flow rate of the gas at the outlet port of the nozzle was 0.05 sccm.

Figure 21:
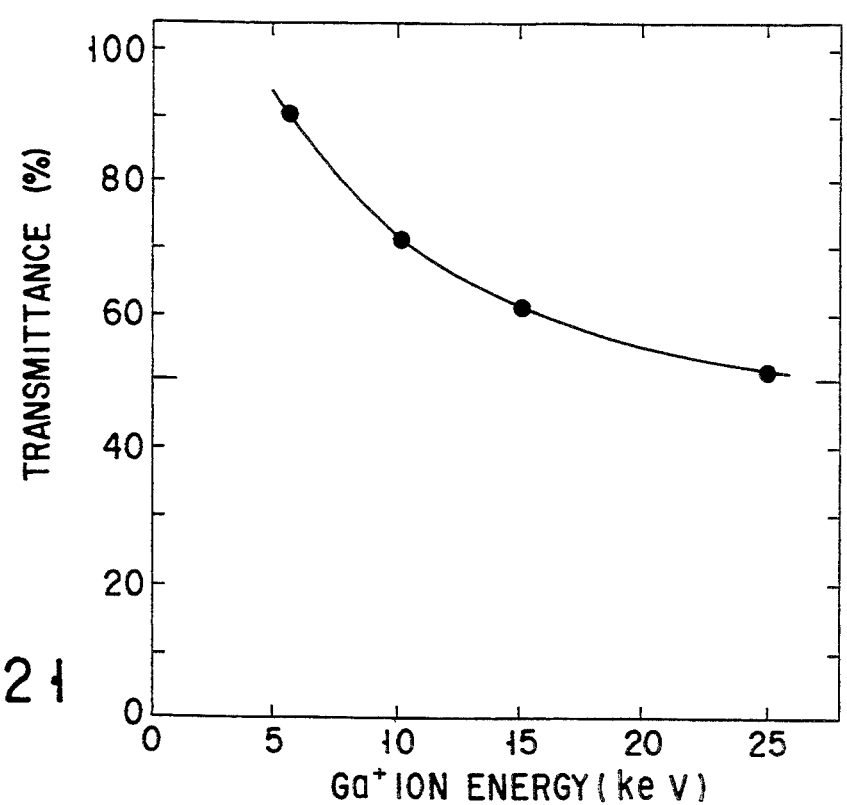
FIG. 21 is a graph showing a $Ga^+$-ion energy dependency of the transmittance of an $SiO_2$ deposition film on light having a wavelength of 248 nm.

A relationship between the energy of the irradiated Ga FIB and the transmittance of the deposited $SiO_2$ film (thickness: 0.3 μm) for light (light used in an alternating aperture phase shift mask) having a wavelength of 248 nm is shown in FIG. 21. As the energy of the Ga FIB is decreased, the transmittance is increased because of the following reason. That is, although defects causing the decrease in transmittance occur in the deposition film by implanting $Ga^+$ ions into the deposition film, when the energy of $Ga^+$ ions is low, the number of defects formed per ion is decreased. In this case, since the energy of the Ga FIB is set to be 5.5 keV, the transmittance of the deposition film is 91%, and the value is larger than a transmittance (80.6%) required to repair a divot defect. In addition, the beam current of the Ga FIB was 20 pA. In this case, since an FIB apparatus in a retarding mode, i.e., an apparatus having an acceleration voltage of 25 kV and capable of setting a voltage of a sample table at 19.5 kV, is used, even when the irradiation energy of $G^+$ ions:

[(acceleration voltage)−(sample table voltage)]×e (elementary charge)

is set to be 5.5 keV, the beam diameter is 0.05 μm, so that a film can be deposited in a fine region. In a normal FIB apparatus which is not in a retarding mode, the acceleration voltage must be set to be 5.5 kV. In this case, since the beam diameter is 1 μm or more, a film cannot be easily deposited in a fine region.

Although the 5.5-keV $Ga^+$ FIB is used in this case, an FIB having another energy can be selected in consideration of the relationship between the $Ga^+$ ion energy and the transmittance shown in FIG. 21, and an FIB using another ion species can also be selected. In addition, the two types of gases may be sprayed from different nozzles, respectively, and a gas such as ozone or $N_2O$ having oxygen as a main component may be used in place of the oxygen gas. The mixing ratio of the gases is not limited to 1:7, and a mixing ratio at which a recessed defect is buried with a transparent deposit to have an excellent shape is preferably used in accordance with the gas species and the ion species and energy of the FIB.

When a charge neutralizer is arranged near the gas nozzle, and radiant heat from an electron discharging filament in the neutralizer adversely affects the gas, a black contaminant consisting of carbon is attached on the mask substrate. Therefore, the charge neutralizer is preferably arranged apart from the gas nozzle.

Figure 18C:
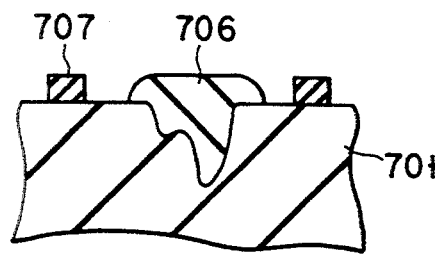

As shown in FIG. 18C, a first thin film 707 is deposited around the bump defect of the $SiO_2$ film 706 with a small interval to have a doughnut shape at the same level as that of the $SiO_2$ film 706. The first thin film 707 is formed by assisted deposition such that a pyrene gas is decomposed by a Ga FIB accelerated at, e.g., 20 keV to deposit carbon (C).

Figure 18D:
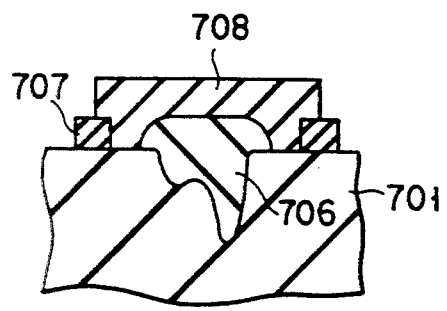

As shown in FIG. 18D, a second deposition film 708 is formed in a region covering the projecting portion of the $SiO_2$ film 706 and the first deposition film 707. In this case, an interval x between the projecting portion of the $SiO_2$ film and the first deposition film 707 and a depth y of a recessed portion formed in the surface of the second deposition film 708 when the second deposition film 708 is deposited to have a thickness of 1.0 μm have the relationship shown in FIG. 3. That is, the smaller the interval x is, the smaller the depth y is because of the following reason. In assisted deposition using an ion beam and a gas, since deposition is enhanced by ions and secondary electrons multiple-scattered in the narrow groove, the deposition rate in the groove becomes higher than that on the projecting portion of the $SiO_2$ film 706 or the first deposition film 707. As a result, the depth y is decreased, and a flat film can be obtained.

Figure 18E:
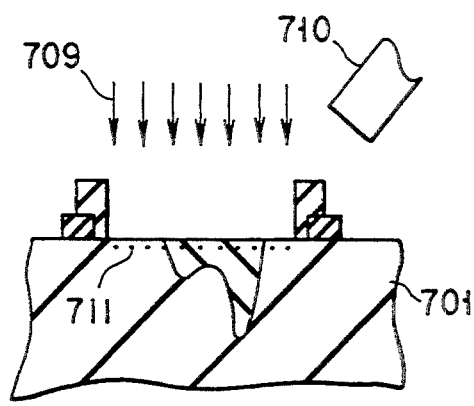

As shown in FIG. 18E, the flat films (707 and 708) deposited as described above and the projecting portion of the $SiO_2$ film 706 are simultaneously etched at the same rate. For example, when the carbon films (707 and 708) deposited using the pyrene gas and the 20-keV Ga focused ion beam and the projecting portion of the SiO$_2$ film 706 are sputter-etched by a Ga FIB, shown in FIG. 4, an etching rate ratio of C/SiO$_2$ is changed depending on the acceleration voltage of the Ga FIB. When the acceleration voltage is about 30 kV, the etching rate ratio of C/SiO$_2$ is about 1. Therefore, a region slightly larger than the projecting portion is raster-scanned using a beam 709 narrowly focused under the above conditions, so that the C and SiO$_2$ can be simultaneously etched at the same etching rate.

When a ratio of secondary ions of carbon to those of Si generated in the above processing is measured using a mass spectrometer 710, the ratio of secondary ions of C/Si is considerably changed immediately after the carbon around the projecting portion of the SiO$_2$ film 706 in the beam-scanned region disappears. For this reason, it is determined that the surface of the projecting portion of the SiO$_2$ film 706 is etched to the same level as that of the surface of the shifter 701. The end point of the processing can be detected from a ratio of secondary ions of C/O, in place of the ratio of secondary ions of C/Si. The method of determining the end point of the processing by measuring secondary ions is disclosed in Jpn. Pat. Appln. KOKAI Publication No. 58-106750.

It is also possible to recognize the interface between C and SiO$_2$ by detecting the secondary ions.

Figure 18F:
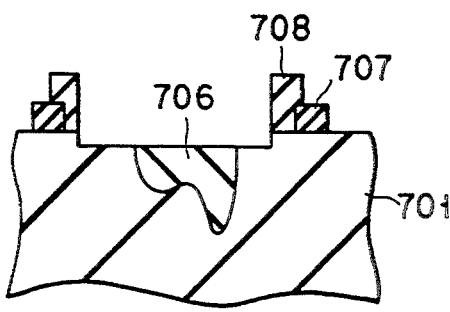

However, in the sputter-processing using the Ga FIB, a damaged layer 711 having a depth of about 15 nm is left on the surface of the processed substrate to decrease the transmittance to light used in exposure. For this reason, upon completion of removal of the projecting portion of the SiO$_2$ film 706, as shown in FIG. 18F, the damaged layer 711 is assisted-etched using, e.g., an XeF$_2$ gas and the Ga FIB. In the assisted etching using this gas, since no damaged layer 711 is left, the damaged layer 711 can be removed. Although a recessed portion having a depth of about 15 nm is formed by the processing, the recessed portion having such a depth is not transferred to a wafer and does not adversely affect the pattern around the recessed portion.

Figure 18G:
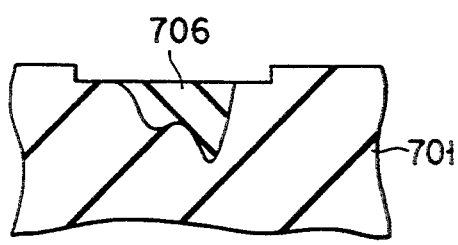

Finally, as shown in FIGS. 18G, carbon left around the projecting portion of the SiO$_2$ film 706 after the projecting portion is removed is removed by an O$_2$ plasma asher. For example, when an O$_2$ gas flows into a chamber to keep the pressure of the chamber at 0.9 Torr, and ashing is performed by applying an RF power of 500 W, the carbon can be removed without any damage. The removal of carbon can be performed by not only the O$_2$ plasma asher but also CDE using an O$_2$ gas or an O$_2$ gas containing CF$_4$. Furthermore, the removal of carbon can be effectively performed by keeping the substrate temperature at 150° to 400° C. In addition, the removal of carbon can also be performed by laser beam irradiation and FIB irradiation in an O$_2$ or O$_3$ atmosphere.

The removal of remaining carbon can be more efficiently performed at once after all defects are repaired. The last two steps, i.e., the step of removing carbon and the step of removing a damaged layer may be performed in a reverse order.

In this manner, when a divot defect is repaired in accordance with the repairing process flow of Example 8, the following effects can be obtained.

(1) Since the divot defect 702 need not be buried with the SiO$_2$ film 706 depending on the shape of the recessed portion, the process is considerably simplified.

(2) Since the projecting portion formed by burying the divot defect 702 is covered with the flattening films (the first and second deposition films 707 and 708) such that a region larger than that of the projecting portion is covered, when the projecting portion is removed, damage to the peripheral portion of the defect caused by Ga beam irradiation can be suppressed as much as possible.

(3) The flattening films (707 and 708) and the SiO$_2$ film 706 which consist of different materials are simultaneously processed, and secondary ions discharged from the flattening films (C) and the projecting portion (SiO$_2$) or a ratio of the secondary ions or secondary electrons are measured. For this reason, the end point of the processing of the projecting portion can be easily detected.

(4) Since the projecting portion having a non-uniform thickness is flattened using the flattening films (707 and 708), the repaired surface is easily flattened.

(5) The damaged layer 711 left on the surface of the divot defect which is repaired can be easily removed by assisted etching using an XeF$_2$ and a Ga FIB.

(6) The carbon films (707 and 708) used to repair the defect can be easily removed by an O$_2$ plasma asher without any damage to other portions.

(7) Almost all process of repairing defects can be done in a Ga FIB apparatus by changing the type of a gas supplied into the apparatus. For this reason, defect repair can be considerably efficiently performed.

(8) Since the acceleration energy of Ga$^+$ is kept low, the transmittance of the SiO$_2$ film 706 for light having a small wavelength (248 nm) can be sufficiently increased, and the repairing process flow can be applied to repair of an alternating aperture phase shifting mask used in a region having the wavelength.

Although the repairing process of the recessed defect has been described above, the repairing process is not limited to Example 8.

In Example 8, although a carbon film deposited from a pyrene gas is described above as a flattening material covering a projecting portion left after the divot defect is buried with SiO$_2$, a carbon film deposited from another hydrocarbon gas or a tungsten film using, e.g., W(CO)$_6$, may be used. The coverage property of the tungsten film is almost the same as that of a carbon film. When the above two-stage deposition was performed using the tungsten film, a flat film having a small recessed portion in its surface could be obtained as in the carbon film. In addition, when a projecting portion (SiO$_2$) and the tungsten film are simultaneously processed, a point at which an etching rate ratio is 1 falls within the range of acceleration voltages of a general FIB apparatus.

Furthermore, the material for covering the projection defect is not limited to a film deposited by using an FIB. Use may be made of photosensitive resin or resin which is crosslinked or decomposed by charged particles. After spin-coating the resin of either type on the reticle, a laser beam, a light beam focused by using a slit, an FIB or an electron beam is applied to only the region including the target defect, by using either a microscope or the coordinates obtained in the inspection step. The, the resultant structure is developed, thereby forming a flattening film. The first thin film and the second thin film are formed by repeating the above-described sequence of steps. The thickness of either film is adjusted by changing the exposure (irradiation amount of the resist or the density of resist. In the case where the bump defect is small or in the case where a pattern is located near the defect to repair, it suffices to form only one flattening film. Thereafter, it is possible to perform the same processing as that of the carbon film which is deposited by an FIB using a pyrene gas. The photosensitive resin, or the resin crosslinked or decomposed by charged particles, can be removed by using stripping solution such as a mixture of sulfuric acid and hydrogen peroxide.

Simultaneous etching of C and $SiO_2$ can be modified as in Example 1. In addition, removal of carbon left after the projecting portion is removed can be modified as in Example 1. In addition, deposition of carbon, simultaneous etching of C and $SiO_2$, and an ion source used for removing the damaged layer can be modified as in Example 1.

Figure 19A:
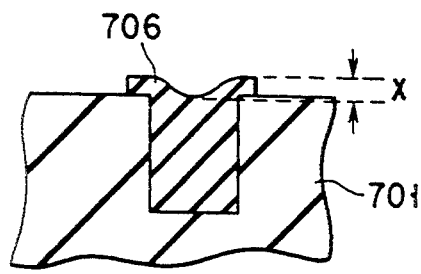
FIGS. 19A to 19C are sectional views for explaining the shapes of an $SiO_2$ film buried in a divot defect.

Although the shape of the divot defect is not described in the above process, some steps of the process can be omitted depending on the shape. That is, a divot defect having a large aspect ratio is to be repaired, the deposition shape of $SiO_2$ using 1,3,5,7-tetramethylcyclotetrasiloxane is as shown in FIG. 19A. In this case, since the difference x of the peak and bottom levels of the surface falls within the range of the depth of an allowable step in defect repair, the steps from FIG. 18C need not be performed.

Figure 20A:
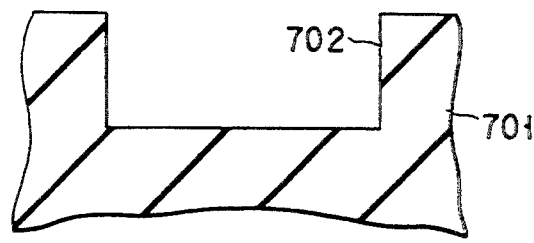
FIGS. 20A to 20C are sectional views showing another example of an $SiO_2$ film buried in a recessed defect.
Figure 19B:
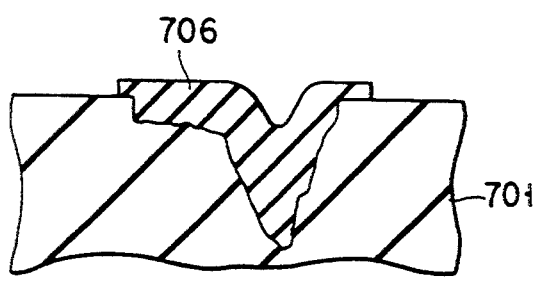
Figure 20B:
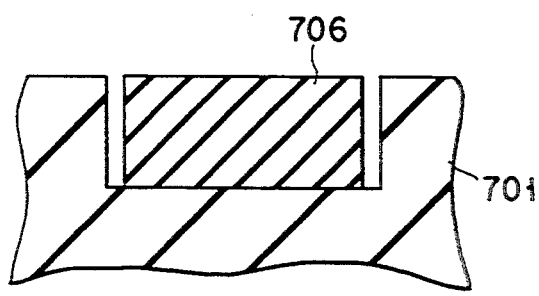
Figure 19C:
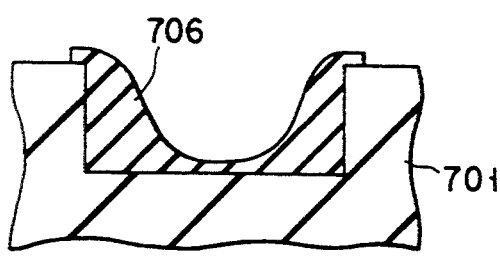
Figure 20C:
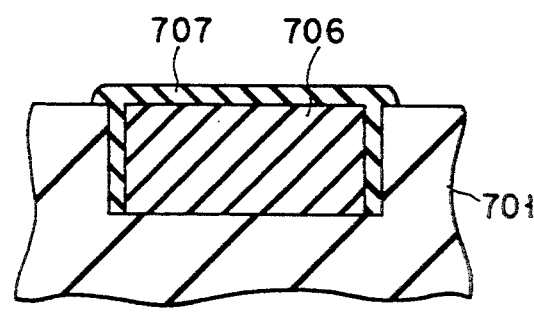

In contrast to this, when each of defects shown in FIGS. 19B and 19C are to be repaired, the difference between the peak and bottom levels of the surface obtained after $SiO_2$ is deposited does not fall within the range of the depth of an allowable step in defect repair. For this reason, all the steps shown in FIGS. 18A to 18G must be performed. In addition, in a case of the defect shown in FIG. 19C, as shown in FIGS. 20A to 20C, $SiO_2$ is deposited in the recessed portion with a small interval from the side wall of the recessed portion, and $SiO_2$ is deposited in a region completely covering the defect, thereby obtaining deposition having a small difference between the peak and bottom levels of the surface. In this manner, as described above, the steps from FIG. 18C may need not be performed.

Although silicon oxide deposition is described in Example 8. This technique can be applied to other material. Silicon nitride, chromium oxide or the like can be deposited without the transmittance reduction due to the application of ions, merely by decreasing the energy of the FIB.

In addition, various changes and modifications may be effected without departing from the spirit and scope of the invention.

In each of the above examples, although a repair method has been described using a phase shift mask, the present invention is not applied to only the phase shift mask. The present invention can also be applied to repair of a normal Cr mask or an X-ray mask. In addition, the present invention can be applied to repair of a Fresnel zone plate or other optical parts.

EXAMPLE 9

In Example 9, a method of repairing a recessed defect and of a shifter, more particularly, deposition of an $SiO_2$ film serving as a buried material deposited in a divot defect will be described.

Example 9 is basically the same as Example 2 in the specification of Japanese Patent Application No. 4-294536. A defect to be repaired is recognized using an FIB apparatus on the basis of information such as the size, shape (projection or recess), position of a defect detected by a general defect inspection system. After a divot defect is recognized in a phase shifter, a Ga+ FIB is irradiated on a region slightly larger than the divot defect while a gas having Si-O bonds and/or Si-H bonds or a gas mixture containing the gas, i.e., a gas mixture of 1,3,5,7-tetramethylcyclotetrasiloxane and oxygen is sprayed from a nozzle at room temperature. In this manner, an $SiO_2$ film (buried material) projecting slightly higher than the shifter surface is deposited. The diameter of the nozzle used in this case was 0.2 mm, and the total flow rate of the nozzle at the outlet port was 0.05 sccm.

According to the specification of Japanese Patent Application No. 4-294536, in order to increase the transmittance of the $SiO_2$ film serving as the buried material, UV irradiation on the deposition film, film deposition while UV irradiation is performed, annealing of the deposition film in an $O_2$ atmosphere, or deposition by low-energy ions is to be performed. In a case of using an $SiO_2$ film deposited using a 50-keV $Si^{2+}$ FIB, the transmittance of the $SiO_2$ film is increased by annealing in the $O_2$ atmosphere. However, in case of using an $SiO_2$ film deposited using a 25-keV Ga+ FIB, the transmittance of the $SiO_2$ film is not increased by annealing in the $O_2$ atmosphere. In addition, annealing in the step of repairing an alternating aperture phase shifting mask may cause distortion of a mask pattern.

On the other hand, in deposition using low-energy ions, when an FIB apparatus in a retarding mode is used, even when the ion energy is set to be 5.5 keV, film deposition in a fine region can be performed because the beam diameter is 0.05 μm. However, in case of using the normal FIB apparatus, when the ion energy is set to be 5.5 keV, the beam diameter is 1 μm or more, and the film deposition in a fine region cannot be easily performed. Furthermore, since a deposition efficiency is low when the ion energy is set to be 5.5 keV, the above deposition using the low-energy ions is not practical. In Example 9, an example in which an $SiO_2$ film having a transmittance capable of being used to repair a phase shifter is deposited using a Ga+ FIB and an energy except for an ion energy of 5.5 keV without using post-processing such as annealing or UV irradiation is exemplified.

According to Example 9, an $SiO_2$ film was deposited by irradiating a Ga+ FIB using a gas mixture of 1,3,5,7-tetramethylcyclotetrasiloxane (TMCTS) and oxygen as a source gas for depositing a film. The relationship between a beam current density obtained when an ion energy is set to be 25 keV and the transmittance of the deposited $SiO_2$ film for KrF light (wavelength: 248 nm) is shown in FIG. 22.

Figure 22:
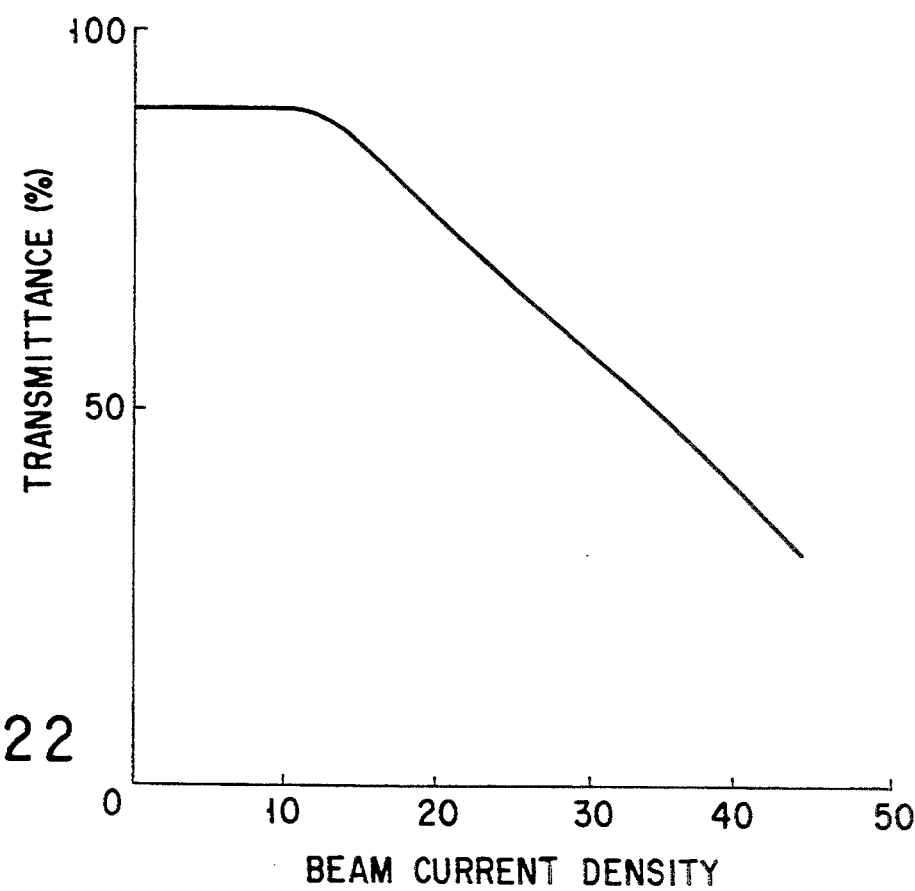
FIG. 22 is a graph showing a relationship between a beam current density and a transmittance of the deposited $SiO_2$ film for KrF light (wavelength: 248 nm)

As is apparent from FIG. 22, as a beam current density is decreased, the transmittance tends to be increased. However, when the beam current density is 11 $mA/cm^2$ or less, the transmittance is saturated. This tendency to saturation does not depend on the ion energy. Therefore, in each ion energy, film deposition was performed using a beam having a beam current density at which the transmittance was saturated.

The transmittance, for KrF light (wavelength: 248 nm), of an $SiO_2$ film (thickness: 250 nm) deposited while an ion energy and an $O_2$ partial pressure ratio are changed is shown in FIG. 23. Referring to FIG. 23, as the ratio of an $O_2$ partial pressure to a TMCTS partial pressure is high, and/or the ion energy is low, the transmittance tends to be high.

In an alternating aperture phase shifting mask for KrF light, a thickness t of a phase shifter for inverting a phase is an odd-number multiple of $t=\lambda/\{2(n-1)\}$ where $\lambda$ is the wavelength of an exposure light source and n is a refractive index. In this case, KrF is used as a light source (λ=248 nm), and a silicon oxide film (n=1.508) is used as a phase shifter. For this reason, t=244 nm is set. In addition, according to a simulation, it is known that the satisfactory transmittance of the alternating aperture phase shifting mask for KrF light required for repairing a divot defect of the shifter is 80% or more. For this reason, the $SiO_2$ film may be deposited at a partial pressure ratio higher than partial pressure ratios plotted along a curve (in FIG. 23) indicating that the transmittance for the KrF light is 80%.

According to this method, an $SiO_2$ film having a high transmittance can be deposited by a normal FIB apparatus using ions having any energy. Note that, when the transmittance may be 70%, deposition may be performed at an $O_2$ partial pressure ratio higher than a curve (in FIG. 23) indicating that the transmittance is 70%. When another transmittance is set, an $SiO_2$ film may be deposited in a region having an $O_2$ partial pressure ratio higher than that calculated on the basis of the relationship between an $O_2$ partial pressure and an ion energy which correspond to the transmittance.

The sequential steps are performed in the same manner as described in the steps described in Example 2 in the specification of Japanese Patent Application No. 4-294536, thereby etching back the $SiO_2$ film and the first and second thin films.

In this manner, when a divot defect is repaired in the repairing process flow of Example 9, in addition to the effects (1) to (7) described in example 2 in Japanese Patent Application No. 4-294536, the following effect can be obtained. That is, $SiO_2$ film having a high transmittance and capable of being used for correcting a phase shifter divot defect of a phase shift mask can be efficiently deposited without post-processing.

TMCTS used in Example 9 will be described below. First, it should be noted that TMCTS is molecule having -Si-O-Si- bond as shown in FIG. 25A. This bond is cyclic and, therefore, stable. Thanks to the stable -Si-O-Si- bond, TMCTS can readily form an $SiO_2$ film having an -Si-O-Si network as shown in FIG. 24. TMCTS greatly differs from TEOS wherein Si bonds to O of ethoxy group which is relatively reactive and likely to dissociate as ethanol.

Second, TMCTS has, as shown in FIG. 25A, in addition to Si-O and Si-C bonds, an Si-H bond. TMCTS is different from OMCTS (octamethylcyclotetrasiloxane) constituted by only Si-O and Si-C bonds as shown in FIG. 25B. When a film is formed using TMCTS, since stearic hindrance caused by bulky $CH_3$ groups is small, O atoms easily react with Si atoms, thereby easily producing Si-O bonds. In this manner, the $SiO_2$ film obtained using TMCTS has a light transmittance higher than that of an $SiO_2$ film obtained using OMCTS.

Third, the film deposition yield of an $SiO_2$ film using a Ga FIB is 7 atoms/ion when TMSTS is used, and is 2 atoms/ion when TEOS is used. Therefore, since the number of ions implanted until the thickness of a film reaches a specific thickness is smaller in use of TMCTS than in use of the TEOS, damage caused by implanted ions is small during film formation, and the light transmittance of the obtained $SiO_2$ film is increased.

EXAMPLE 10

In Example 10, deposition of a flattening film covering a bump defect and removal of the flattening film and a remaining flattening film left after etching of the bump defect will be described below. According to the specification of Japanese Patent Application No. 4-294536, first and second flattening films are to be a carbon film assisted-deposited using an FIB. In Example 10, an example wherein Au assisted-deposited by the FIB is used as a flattening film to perform removal of a remaining flattening film using wet etching will be described.

A defect to be repaired is recognized using an FIB apparatus on the basis of information such as the size, shape (projection or recess), position of a defect detected by a general defect inspection system. After a bump defect is recognized, Au is deposited by assisted deposition using a 15-keV $Ga^+$ FIB and a source gas, e.g., dimethylgoldhexafluoroacetyl acetonate ($C_7H_7F_6O_2Au$), for depositing an Au film to flatten the upper portion of a bump defect. At this time, as described in the specification of Japanese Patent Application No. 4-294536, a flattening operation is performed by two- or multi-stage deposition in accordance with the shape and the position of the defect.

After the flattening film is deposited, as in the steps described in the specification of Japanese Patent Application No. 4-294536, a flat deposited region of the Au film including the bump defect is removed using a 30-keV Ga FIB and an $XeF_2$ gas. In this case, the Au is removed by physical sputtering using the Ga FIB, and the bump defect ($SiO_2$) is removed by assist etching using the Ga FIB and the $XeF_2$ gas without decreasing the transmittance. At this time, adjustment of the gas pressure of the $XeF_2$ gas can causes the etching rates of Au and $SiO_2$ to be equal to each other.

An unnecessary Au film left after the etching is removed by wet etching using aqua regia. Although Au is dissolved in aqua regia, $SiO_2$ serving as the material of the shifter of the mask and chromium or chromium oxide serving as a light-shielding material are not dissolved in aqua regia. For this reason, only Au can be removed without any damage to the light-shielding material and shifter.

In addition to Au, Pt is also dissolved in aqua regia. For this reason, in place of the Au film, as a flattening film covering the bump defect, a Pt film deposited using an FIB and a source gas, i.e., (methylcyclopentadimethyl)trimethylplatinum [(MeCp)PtMe₃], for depositing a Pt film may be used. In addition, a material which is dissolved in the chemical solution which does not dissolve light-shielding material and shifter of the mask can be used as a flattening film. It is apparent that the method of Example 10 can be used in the step of flattening an $SiO_2$ film (buried material) deposited on a divot defect to project slightly higher than a shifter surface.

EXAMPLE 11

In Example 11, removal of a flattening film covering a bump defect will be described. More particularly, a case wherein a gas mixture of a hydrocarbon gas and a hydrogen gas is used as a source gas of a flattening material will be described below.

Although in the specification of Japanese Patent Application No. 4-294536, it is described that a hydrocarbon gas such as pyrene, styrene, methyl methacrylate, 2,4,4-trimethyl-1-pentene, or isoprene can be used as the source gas of a flattening material covering a bump defect and consisting of carbon, a gas mixture of a hydrocarbon gas and a hydrogen gas can be also used as the source gas. A hydrogen content in the carbon film is increased by mixing the hydrogen gas in the hydrocarbon gas to enhance the conversion from the carbon film into a polymer. For this reason, the carbon film can be easily removed. This is understood because a resist which is a polymer can be easily removed by an asher, CDE, laser, or the like compared with a carbon film formed by sputtering.

For example, a case wherein a 2,4,4-trimethyl-1-pentene gas serving as a hydrocarbon gas and a hydrogen gas are used will be described below. In the apparatus shown in FIG. 1, the 2,4,4-trimethyl-1-pentene gas and the hydrogen gas were stored in gas bombs 11, a 1.0-Torr 2,4,4-trimethyl-1-pentene gas and a 1.0-Torr hydrogen gas were mixed with each other in a gas supply system, and the gas mixture was sprayed from a nozzle 13 on the surface of a sample 8. An FIB drawn from a Ga ion source and having a beam current of 10 pA and an acceleration voltage of 25 keV was irradiated on this surface to deposit a carbon film. The deposition efficiency of the carbon film deposited as described above was 18 atoms/ion. This value was 1.6 times as high as the value obtained when only 2,4,4-trimethyl-1-pentene gas was used. In addition, when the carbon film was removed by CDE having a power of 100 W using 20 sccm of water and 200 sccm of an oxygen gas, the removal rate of the carbon film was increased to 5 times as high as that of a carbon film formed by using only 2,4,4-trimethyl-1-pentene gas. In this case, although the mixing ratio of the 2,4,4-trimethyl-1-pentene gas to a hydrogen gas is set to be 1:1, when the total pressure is kept constant, the removal rate of the deposited carbon film is increased by increasing a hydrogen gas partial pressure. On the other hand, since the deposition efficiency is decreased when the hydrogen gas partial pressure is excessively high, it is preferable that the hydrogen gas pressure is properly selected.

EXAMPLE 12

In Example 12, removal of a flattening film covering a bump defect will be described. More particularly, the step of removing Ga will be described below.

In the step of removing a carbon film in the specification of Japanese Patent Application No. 4-294536, while carbon is removed by CDE using only $O_2$, only $O_3$, or a gas mixture of $O_2$ and $N_2$, $H_2O$, $CF_4$, $H_2$, $N_2O$, or NO to oxidize carbon, laser irradiation in an $O_2$ or $O_3$ atmosphere, or the like, the step of removing Ga is preferably performed.

A carbon film deposited by FIB assisted deposition contains not only carbon but also Ga or O. For this reason, in the method in which carbon is oxidized to be removed, although carbon is removed as CO and $CO_2$, Ga is not removed by oxidation, and Ga is left on the surface as gallium oxide. For this reason, as the carbon film is further etched, the Ga content in the surface of carbon film is increased, thereby reducing the etching rate of the carbon film. The carbon film having the reduced etching rate is left in a 1N nitric acid aqueous solution for 5 minutes, the gallium oxide left on the surface of the carbon film is removed. Thereafter, when CDE or laser irradiation using oxidation of carbon is performed, etching can be preferably performed. In this case, the quartz substrate is not dissolved in the nitric acid aqueous solution, and Cr serving as a light-shielding material and $CrO_x$ serving as an anti-reflection film react with the nitric acid to be set in a passive state. For this reason, Cr and $CrO_x$ are not dissolved in the nitric acid aqueous solution, and the reticle is not damaged. Gallium oxide can be removed by wet etching using not only a nitric acid aqueous solution but also a high-concentration sulfuric acid aqueous solution or an alkali solution such as a KOH or NaOH aqueous solution.

EXAMPLE 13

In Example 13, deposition of a flattening film covering a bump defect and removal of the flattening film left after an etch-back operation will be described. In Example 13, the following example will be described. That is, a thin film which can be dissolved by a solution is deposited and a carbon film is deposited on the thin film to form a flattening film having a two-layered structure, and the remaining carbon film is removed together with the lower film by a solution after an etch-back operation.

A PIBM (polyisobutyl methacrylate) LB (Langmuir-Blodgett) film (18 layers; thickness: 200 Å) is formed in a region including a bump defect on information such as the size, shape (recess or projection), position of a defect detected using a general defect inspection system. The defect to be repaired is recognized using an FIB apparatus on the basis of the information of the defect. After a bump defect is recognized, a carbon film having a thickness of 200 Å is deposited, by a 5-keV Ga FIB using a pyrene gas, on the LB film including a region in which a flattening film is to be deposited. In order to accurately deposit the flattening film, as described in the specification of Japanese Patent Application No. 4-294536, two- or multi-stage deposition is performed by a 20-keV Ga FIB using a pyrene gas in accordance with the shape and position of the defect, thereby flattening the defect. In this case, since the range of 5-keV Ga ions in the LB film is less than 100 Å, the structure of the LB film is not entirely broken by the 5-keV Ga FIB. In addition, since the carbon film is deposited by the 5-keV Ga FIB, the structure of the LB film is not entirely broken by the Ga ions used in the carbon film deposition performed by the 20-keV Ga FIB in the subsequent process.

After the flattening film is deposited, as in the steps described in the specification of Japanese Patent Application No. 4-294536, the flat deposited region of the carbon film including the bump defect is removed. After the etch-back operation, the LB film is dissolved by dichloromethane to remove a remaining carbon film on the LB film. Since $SiO_2$ serving as the substrate of the mask and a shifter material and Cr serving as a light-shielding film material cannot be dissolved by dichloromethane, only the carbon film and the LB film can be removed without damaging the light-shielding material and the shifter.

The flattening film having a two-layered structure is not limited to the film obtained by combining the PIBM LB film with the carbon film. That is, a film which can be dissolved by a solution which cannot dissolve $SiO_2$ and Cr may be used as the lower film, and a film which can be used in an etch back method to remove a bump defect may be used as the upper film. In addition, a film which can be mechanically removed by a brush or the like or a film which can be removed by a method which does not damage the $SiO_2$ and Cr films may be used as the lower film.

The flattening film is not limited to the flattening film having the two-layered structure. That is, it is apparent that a flattening film having a multilayered structure including the lowermost film consisting of a film which can be easily removed as described above may be used as the flattening film.

EXAMPLE 14

In Example 14, a case wherein the projecting portion of a bump defect and a flattening film are removed while a damaged layer is prevented from being formed in an FIB irradiation region of a substrate will be described.

When styrene is used as a source gas of the flattening film, a deposition efficiency is low, and a long time is required to repair a defect upon formation. In addition, an ion dose during film formation is increased due to the low deposition efficiency, and chemical dry etching must be performed at a high temperature for a long time when the flattening film is removed by chemical dry etching using an $O_2$ gas after the step of simultaneously removing the projecting portion and the flattening film.

When the projecting portion of the projecting defect and the flattening film are removed by sputter etching at the same etching rate, a damaged layer is formed in the FIB irradiation region of the substrate. When assisted etching using a gas containing $XeF_2$ or thermal etching using a laser beam is performed to remove the damaged layer, an unnecessary groove is formed, and a margin for processing is decreased.

In order to solve the above problem, according to Example 14, the following means are employed.

First, when a projecting or divot defect is to be repaired, first and second thin films consisting of a material containing carbon are formed by FIB deposition using a methyl methacrylate gas or a 2,4,4-trimethyl-1-pentene gas or an isoprene gas as source gases.

In this manner, the formation efficiency of the flattening film can be increased, and a time required for repair can be shortened. In addition, since an ion dose during the film formation can be decreased, the flattening film left after the step of simultaneously removing the flattening film and the projecting portion can be easily removed.

Second, when a projecting or divot defect is to be repaired, the projecting portion and first and second thin films are simultaneously removed FIB assisted etching using an $XeF_2$ gas and an $O_2$ gas or an $O_3$ gas.

In this manner, the etching rates of the flattening film and a shifter can be equalized, and repair can be performed without leaving damage to the substrate surface. For this reason, the step of removing a damaged layer can be omitted. Therefore, an unnecessary groove to be formed during the step of removing a damaged layer is not formed.

Third, when a projecting and divot defect is to be repaired, first and second thin films left after the step of simultaneously removing the projecting portion and the flattening film are removed by chemical dry etching using a gas mixture obtained by adding at least one of $CF_4$, $H_2$, $H_2O$, $N_2$, $N_2O$ and $NO$ gases to an $O_2$ gas.

In this manner, when a high-frequency power is applied, an amount of discharged atomic oxygen is increased, thereby increasing a rate of removing carbon. In addition, since carbon begins to be removed at a low temperature, a throughput can be increased.

An application of the present invention will be described below.

FIB assisted deposition using methyl methacrylate (monomer) $(CH_2:C(CH_3)COOCH_3)$, 2,4,4-trimethyl-1-pentene $((CH_3)_3CCH_2C(CH_3):CH_2)$, and isoprene $(CH_2:C(CH_3)CH:CH_2)$ which are in a liquid state at room temperature will be described below with reference to FIG. 1.

Methyl methacrylate, 2,4,4-trimethyl-1-pentene, or isoprene were stored in gas bombs 11, a gas from each bomb 11 upon its evacuation was sprayed from a nozzle 13 onto a sample 8. At this time, the gas pressure in the nozzle 13 was 1 Torr. A 25-keV Ga FIB extracted from an ion source 1 and having a beam current of 10 pA was irradiated on the sample onto which the gas was sprayed, thereby forming a carbon film on the sample 8.

The formation efficiency of the carbon film formed as described above was examined. When the methyl methacrylate was used, the film formation efficiency was 7.5 atoms/ion; when 2,4,4-trimethyl-1-pentene was used, 11 atoms/ion; and when isoprene was used, 9 atoms/ion.

The specification of Japanese Patent Application No. 4-294536 describes that a flattening film and a quartz substrate can be simultaneously etched by FIB assisted etching using a gas. In this case, a filament constituting a charge neutralizer may react with the gas used. For example, when a gas serving as an oxidizer is used, a tungsten filament reacts with the gas to form a tungsten oxide, and the tungsten oxide is attached to the sample to be repaired, thereby decreasing the light transmittance of the sample. In order to avoid this, a cover must be arranged on the tungsten filament to cause the tungsten oxide to be attached on the cover surface and to cause only electrons to reach the sample surface. In addition, in order to extend the service life of the filament by suppressing production of the tungsten oxide, differential evacuation is preferably performed to reduce the pressure of a gas near the filament.

The specification of Japanese Patent Application No. 4-294536 describes that, when a gas mixture containing $XeF_2$ is used as a gas used for simultaneously etching a flattening film and a quartz substrate, a defect can be removed without damaging a surface substrate. Although depending on the film material of the used flattening film, the etching rate of quartz is higher than that of most of carbon films formed by FIB assisted deposition which is used as the flattening film in an $XeF_2$ gas atmosphere. When a gas functioning as an oxidizer is added to the $XeF_2$ gas, the etching rate of the flattening film and the shifter can be equalized.

Figure 26:
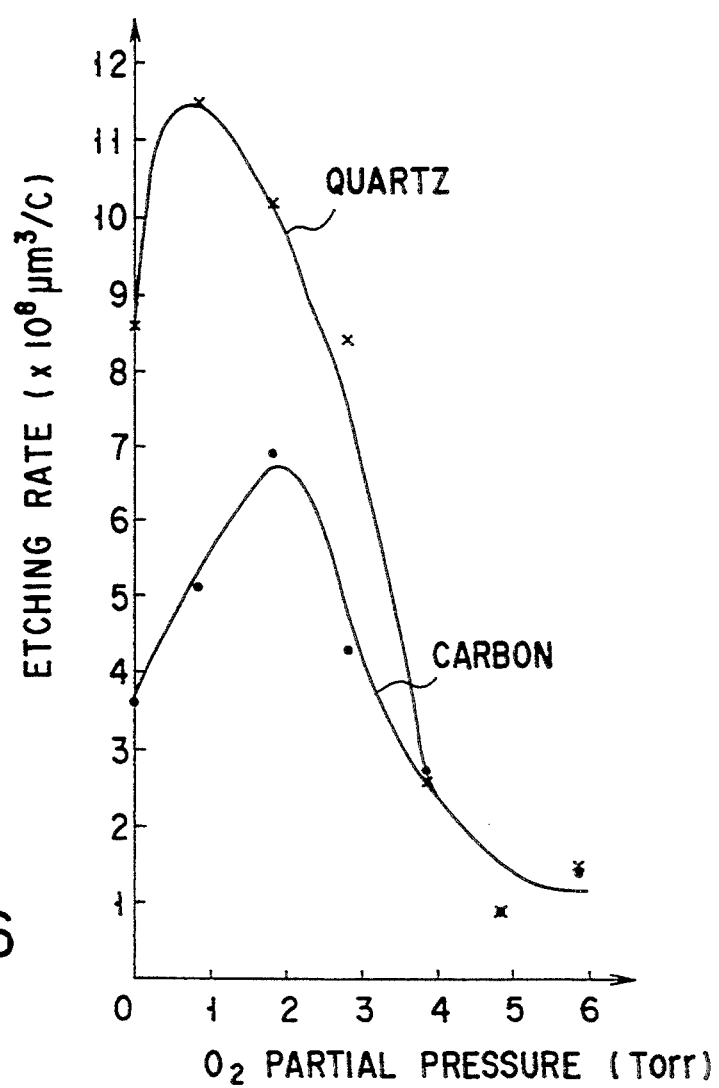
FIGS. 26 and 28 are graphs each showing a relationship between an etching rate and an $O_2$ partial pressure.
Figure 27:
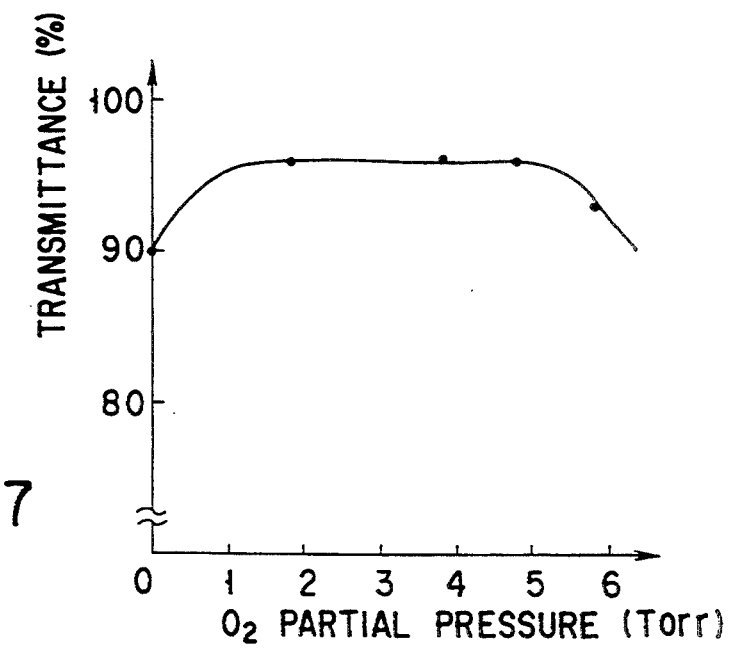
FIGS. 27 and 29 are graphs each showing a relationship between a light transmittance and an $O_2$ partial pressure.

For example, a case wherein FIB assisted deposition is performed using a gas mixture of an $XeF_2$ gas and an $O_2$ gas will be described below. FIG. 26 shows an etching rate obtained when an $O_2$ gas is added to an $XeF_2$ gas having a gas partial pressure of 0.15 Torr. When the $O_2$ gas partial pressure is about 4 Torr or more, the etching rates of carbon and quartz are equal to each other. A change in light transmittance at this time is shown in FIG. 27. As is apparent from FIG. 27, as the $O_2$ partial pressure is close to 5 Torr, the light transmittance begins to be decreased. However, even when the $O_2$ partial pressure is about 6 Torr, the transmittance is 93% or more. When an exposure experiment using a KrF excimer stepper was actually performed, even when conditions such as an exposure amount, a focal depth, and development were changed, repair did not adversely affect a transfer result.

In this manner, when the gas mixture of the $XeF_2$ gas and the $O_2$ gas is used, repair can be performed without leaving damage to the substrate surface. Therefore, the step of removing a damaged layer can be omitted, and an unnecessary groove will not be formed.

In this case, since the allowable value of a difference between the etching rates of carbon and quartz depends on conditions for the use of the mask, the allowable value must be properly determined on the basis of the conditions for the use of the mask.

When an $XeF_2$ gas having a gas partial pressure of 0.15 Torr is used, the difference between etching rates of carbon and quartz falls within the allowable value. That is, although the range of the allowable $O_2$ gas partial pressure is wide, an etching yield is decreased to lower than two times an etching yield obtained when etching is performed by sputtering, and a throughput is not much increased.

Figure 28:
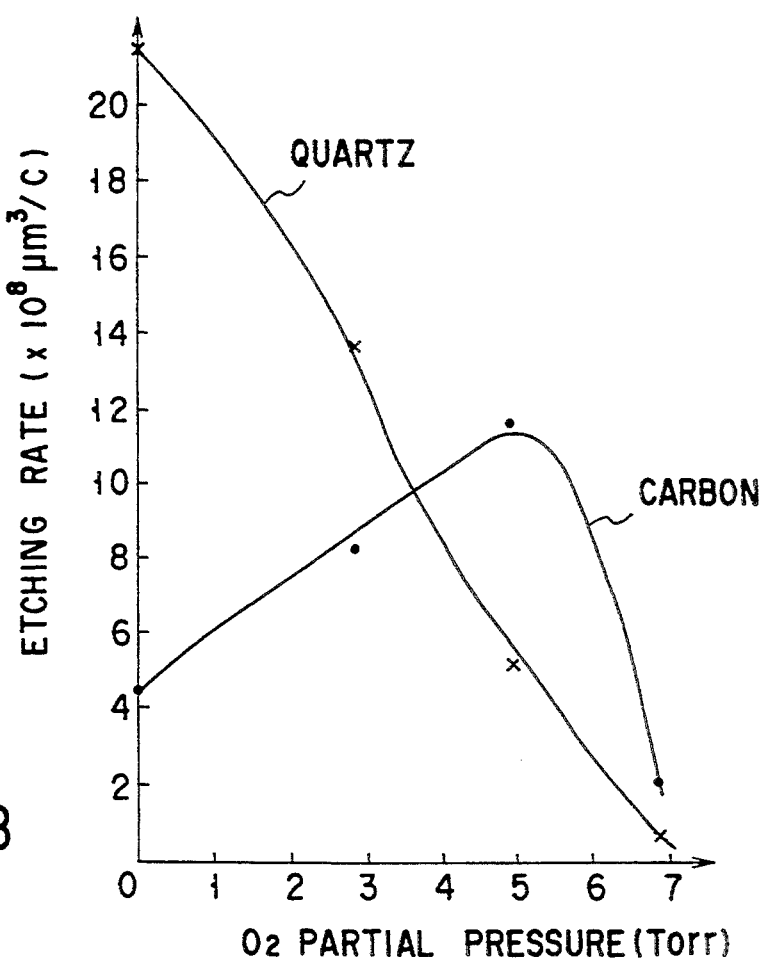
Figure 29:
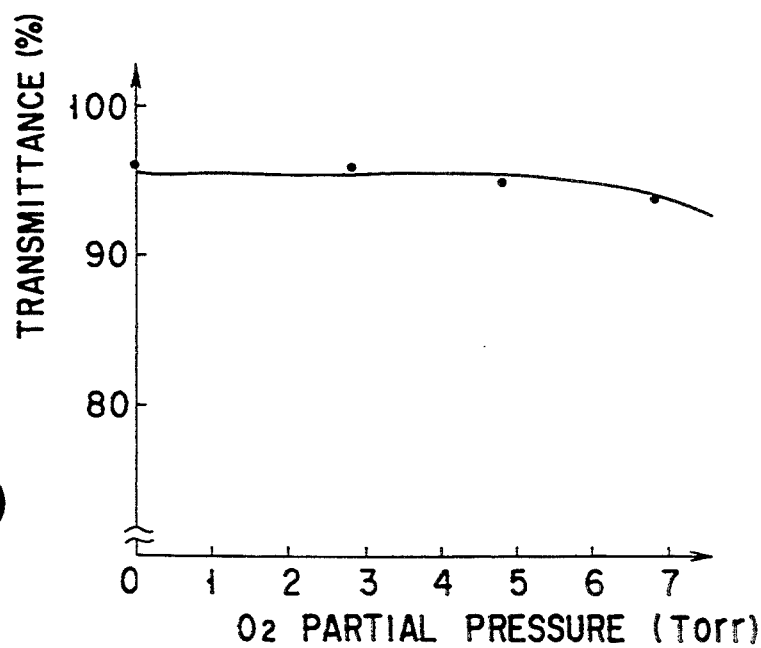

When the throughput is to be further increased, the pressure of the $XeF_2$ gas must be increased. For example, FIG. 28 shows a case wherein an $XeF_2$ gas having a gas partial pressure of 0.30 Torr is used. In this case, at a point where a curve indicating the etching rate of quartz crosses a curve indicating the etching rate of carbon, the etching rates are equal to each other. At this time, the etching yield of carbon is 7.3 times as high as that obtained when etching is performed by sputtering, and the etching yield of quartz is 5.6 times as high as that obtained when etching is performed by sputtering. For this reason, an increase in throughput can be expected. A change in light transmittance in this case is shown in FIG. 29. As is apparent from FIG. 29, the light transmittance is kept at about 95%. When an exposure experiment using a KrF excimer stepper was actually performed, even when conditions such as an exposure amount, a focal depth, and development were changed, repair did not adversely affect a transfer result.

In this case, when the gas mixture of the $XeF_2$ gas and the $O_2$ gas is used, repair can be performed without leaving damage to the substrate surface. Therefore, the step of removing a damaged layer can be omitted, and an unnecessary groove will not be formed.

In this case, since the allowable value of a difference between the etching rates of carbon and quartz depends on conditions for the use of the mask, the allowable value must be properly determined on the basis of the conditions for the use of the mask.

In this case, since the allowable range of the $O_2$ gas partial pressure in which the difference between the etching rates of carbon and quartz falls within the range of an allowable value, is narrow, the partial and total pressures of the gases must be accurately controlled, and a feedback control mechanism such as a mass-flow controller is required.

When not only an $O_2$ gas but also an $O_3$ gas is used as a gas functioning as an oxidizer, the etching rates of carbon and quartz can be equalized without leaving any damage. FIG. 30 shows a case wherein an $O_3$ gas + the $O_2$ gas are added to an $XeF_2$ gas having a gas partial pressure of 0.15 Torr. The concentration of an $O_3$ gas, normally generated by an ozonizer for a high concentration, is about 10%. An $O_3$ concentration at the outlet port of the ozonizer used in this experiment was 10%. When the $O_3$ gas + the $O_2$ gas are added to the $XeF_2$ gas at a gas partial pressure of 2.1 Torr, the etching rates of carbon and quartz are equalized. A change in light transmittance at this time is shown in FIG. 31. As is apparent from FIG. 31, at this gas partial pressure, a transmittance of about 95% is obtained. In addition, when an exposure experiment using a KrF excimer stepper was actually performed, even when conditions such as an exposure amount, a focal depth, and development were changed, repair did not adversely affect a transfer result.

In this manner, when the gas mixture of the $XeF_2$ gas and the $O_3$ gas + the $O_2$ gas is used, repair can be performed without leaving damage to the substrate surface. Therefore, the step of removing a damaged layer can be omitted, and an unnecessary groove will not be formed.

In this case, since the allowable value of a difference between the etching rates of carbon and quartz depends on conditions for the use of the mask, the allowable value must be properly determined on the basis of the conditions for the use of the mask.

In this case, since the allowable range of the $O_2$ gas partial pressure in which the difference between the etching rates of carbon and quartz falls within the range of an allowable value is narrow, the partial and total pressures of the gases must be accurately controlled, and a feedback control mechanism such as a mass-flow controller is required.

When the $O_3$ gas is used as a gas functioning as an oxidizer, since the $O_3$ is easily thermally decomposed at a low temperature ($O_3$ is instantaneously decomposed into $O_2$ at a temperature of 250° C. or more), a manometer such as a Pirani gauge including a heat source in its interior cannot be used. Although a capacitance manometer is used in the above example, a pressure measurement means including no heat source in its interior must be used.

The specification of Japanese Patent Application No. 4-294536 describes that, when a bump defect is removed, carbon left around the bump defect can be removed CDE. As a gas used in this case, an $O_2$ gas mixture can be used. More particularly, one of $CF_4$, $H_2O$, $H_2$, $N_2$, $N_2O$, and NO gases or a combination of them is added to an $O_2$ gas, and a high-frequency power is applied to the gas or gas mixture to electrically discharge the gas or gases, thereby increasing an amount of atomic oxygen. Therefore, a removal rate of carbon is increased, and carbon can be removed at a further lower temperature, thereby obtaining a more enhanced effect.

For example, when $H_2O$ is added to an $O_2$ gas, although depending on the material of a carbon film, when the $O_2$ gas is singly used, etching is started at a temperature of about 100° C. However, when $H_2O$ is added to the $O_2$ gas, the etching is started at room temperature. In addition, although depending on a substrate temperature, when $H_2O$ is added at the same substrate temperature, an etching rate is ten times as high as that before $H_2O$ is not added. The effect of increasing the etching rate obtained by adding $H_2O$ acts on only carbon, and the etching rate of Cr or quartz cannot be increased. For this reason, the mask is not adversely affected by adding $H_2O$.

Although deposition of carbon, simultaneous etching of carbon and $SiO_2$, and removal of a damaged layer are performed by a Ga FIB, the ion is not limited to the Ga FIB. For example, it is apparent that the process of each of the above steps may be performed using another ion such as Au or Si.

EXAMPLE 15

In Example 15, a case wherein a gas containing hydrogen atoms in its molecules is used for removing a carbon film will be described.

In the present invention, a carbon film can be removed using a gas containing a hydrogen gas or hydrogen atoms in its molecules.

For example, when a 200-W high-frequency power was applied at a hydrogen gas flow rate of 20 sccm and a pressure of 0.5 Torr, and a flatting film formed by an FIB using a pyrene gas as a source gas was removed by a parallel-plate RIE apparatus, only the flattening film could be removed without etching Cr and quartz. In addition, the flattening film was removed, damage to the mask such as a decrease in light transmittance of a quartz substrate or reduction of the anti-reflection film of a light-shielding material surface was not observed, and any problem was not posed in a pattern transfer experiment using a mask which had been repaired.

In Example 15, dry etching was performed using an RIE apparatus. A method of performing dry etching is not limited to Example 15. A carbon film can be removed by an etching method such as CDE, ECR etching, or magnetron RIE using discharge of a gas containing a hydrogen gas or hydrogen atoms in its molecules. In addition, the removing method is not limited to the dry etching method. The carbon film can be removed by laser beam irradiation in a gas atmosphere including a hydrogen gas or hydrogen atoms in its molecules.

Although a case wherein a carbon film formed by an FIB using a pyrene gas as a source gas is used as a flattening film is described above, the present invention can be applied to a carbon film formed by the FIB singly using, as a source gas, a hydrocarbon-based gas such as a styrene gas, a methyl methacrylate gas, a 2,4,4-trimethyl-1-pentene gas, or an isoprene gas or using a gas mixture of a hydrocarbon-based gas and a hydrogen gas as a source gas, or a film such as a resist film containing carbon.

As has been described above, according to the present invention, a film can be deposited flat on a bump defect, and the defect can processed to be flat by sputter etching using an FIB or assisted etching using a charged particle beam. Damage to a quartz substrate can be removed by an assisted etching using the charged particle beam, and a remaining deposition film can be removed by an $O_2$ asher or the like, thereby repairing the bump defect. In addition, a divot defect can be buried by the assisted deposition using the charged particle beam. Therefore, when this method is combined with the method of repairing a bump defect, the divot defect can be repaired to be flat.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of repairing a bump defect of a structure obtained by forming a predetermined pattern on a substrate, comprising the steps of:
   flattening the bump defect by depositing a flattening film, formed of a plurality of thin films, on the substrate such that the flattening film surrounds the bump defect or located close to the bump defect or on an upper surface of the bump defect;
   simultaneously removing the bump defect and those portions of the flattening film which are located on and around the bump defect by use of a charged particle beam, said bump defect and said portions of the flattening film being removed at a substantially identical processing rate, with processing conditions being controlled; and
   removing those portions of the flattening film which remain after the simultaneous removing step.

2. A method according to claim 1, wherein said flattening film is made of a material containing carbon which is assisted-deposited by an FIBS using a gas selected from the group consisting of a pyrene gas, a styrene gas, a methyl methacrylate gas, a 2,4,4-trimethyl-1-pentene gas, and isoprene gas.

3. A method according to claim 1, wherein said flattening film is made of a material containing gold which is assisted-deposited by an FIB using dimethylgoldhexafluoroacetyl acetonate as a source gas, or platinum which is assisted-deposited by an FIB using (methylcyclopentadimethyl)trimethylplatinum as a source gas.

4. A method according to claim 1, wherein said bump defect and said flattening film are removed by FIB sputter etching wherein an accelerating voltage is controlled.

5. A method according to claim 1, wherein said bump defect and said flattening film are removed by FIB assisted etching wherein at least one of FIB energy, a gas selection, a gas combination, a gas pressure and a ratio of partial gas pressures is controlled.

6. A method according to claim 5, wherein said FIB assisted etching is executed by use of at least one selected from the group consisting of an $XeF_2$ gas and an oxygen element-containing gas.

7. A method according to claim 6, wherein said oxygen element-containing gas is a gas selected from the group consisting of an $O_2$ gas, an $O_3$ gas, and an $N_2O$ gas.

8. A method according to claim 1, further comprising the step of determining an end point of processing of said bump defect and said flattening film by measuring secondary particles generated by said bump defect and flattening film.

9. A method according to claim 1, wherein said portions of the flattening film which remain after the simultaneous removing step are removed by a method selected from the group consisting of: thermal etching using a laser beam; reactive etching using a laser beam in an $O_3$ or $O_2$ atmosphere; an $O_2$ plasma asher; chemical dry etching using a gas which is a mixture of an $O_2$ gas and at least one of a $CF_4$ gas, an $H_2$ gas, an $H_2O$ gas, an $N_2$ gas, an $N_2O$ gas, and an NO gas; either chemical dry etching or RIE using a hydrogen gas or an intramolecular hydrogen element-containing gas; and FIB assisted etching using an $O_3$ gas or an $O_2$ gas.

10. A method according to claim 9, further comprising the step of removing Ga by use of an acid or alkali.

11. A method according to claim 1, wherein said portions of the flattening film which remain after the simultaneous removing step are removed by wet etching.

12. A method according to claim 1, wherein said wet etching is executed by use of an aqua regia.

13. A method according to claim 1, further comprising the step of removing a damaged layer from a surface of the substrate after said bump defect and said flattening film are simultaneously removed.

14. A method according to claim 13, wherein said damaged layer is removed by assisted etching using a gas containing at least $XeF_2$ or by thermal etching using a laser beam.

15. A method of repairing a bump defect of a structure obtained by forming a predetermined pattern on a substrate, comprising the steps of:
   flattening an upper portion of the bump defect by providing a coating formed of a photosensitive resin or a resin which cross-links or decomposes in the presence of charged particles;

forming a flattening film locally in a region where the bump defect is present, by irradiating only said region with light or charged particles and developing;

simultaneously removing the bump defect and those portions of the flattening film which are located on and around the bump defect by FIB assisted etching wherein at least one of FIB energy, a gas selection, a gas combination, a gas pressure and a ratio of partial gas pressures is controlled, said bump defect and said portions of the flattening film being simultaneously removed at a substantially identical processing rate; and removing those portions of the flattening film which remain after the simultaneous removing step.

16. A method according to claim 15, wherein said FIB assisted etching is executed by use of at least one selected from the group consisting of an $XeF_2$ gas and an oxygen element-containing gas.

17. A method according to claim 16, wherein said oxygen element-containing gas is a gas selected from the group consisting of an $O_2$ gas, an $O_3$ gas, and an $N_2O$ gas.

18. A method according to claim 15, further comprising the step of determining an end point of processing of said bump defect and said flattening film by measuring secondary particles generated by said bump defect and flattening film.

19. A method according to claim 15, wherein said portions of the flattening film which remain after the simultaneous removing step are removed by a method selected from the group consisting of: thermal etching using a laser beam; reactive etching using a laser beam in an $O_3$ or $O_2$ atmosphere; an $O_2$ plasma asher; chemical dry etching using a gas which is a mixture of an $O_2$ gas and at least one of a $CF_4$ gas, an $H_2$ gas, an $H_2O$ gas, an $N_2$ gas, an $N_2O$ gas, and NO; either chemical dry etching or RIE using a hydrogen gas or intramolecular hydrogen element-containing gas; and FIB assisted etching using an $O_3$ gas or an $O_2$ gas.

20. A method according to claim 15, further comprising the step of removing Ga by use of an acid or alkali.

21. A method according to claim 15, wherein said portions of the flattening film which remain after the simultaneous removing step are removed by wet etching.

22. A method according to claim 21, wherein said wet etching is executed by use of a stripping agent of a photosensitive resin or a resin which cross-links or decomposes in the presence of charged particles.

23. A method of repairing a divot defect of a structure obtained by forming a predetermined pattern on a substrate, comprising the steps of:

filling the divot defect with a filling material and forming a projection protruding from a surface of the substrate;

covering a region where the projection is present with flattening film which is formed of a material different from a material of the substrate, so as to flatten an upper portion of the projection;

simultaneously removing the projection and those portions of the flattening film which are located on and around the projection by use of a charged particle beam; and removing those portions of the flattening film which remain after the simultaneous removing step.

24. A method according to claim 23, wherein said filling material is substantially equivalent to the material of the substrate.

25. A method according to claim 23, wherein said filling material has a light transmittance and a refractive index which are substantially equal to those of the material of the substrate.

26. A method according to claim 23, wherein said filling material is a silicon oxide obtained by FIB assisted deposition executed by use of a gas which contains a material having an Si-O-Si bond and an Si-H bond.

27. A method according to claim 26, wherein said material having an Si-O-Si bond and an Si-H bond has an ring structure.

28. A method according to claim 26, wherein said material having an Si-O-Si bond and an Si-H bond is a 1,3,5,7-tetramethylcyclotetrasiloxane.

29. A method according to claim 26, wherein a Ga beam or a Si beam is used as said FIB.

30. A method according to claim 26, wherein said FIB assisted deposition is executed by controlling at least one of an FIB energy, an FIB current density, a ratio of gas partial pressure, and a gas pressure.

31. A method according to claim 26, wherein said FIB assisted deposition is executed by supplying a gas including an oxygen element-containing material to the surface of the structure, in addition to the gas containing the material having an Si-O-Si bond and an Si-H bond.

32. A method according to claim 31, wherein said oxygen element-containing material is a material selected from the group consisting of $O_2$, $O_3$ and $N_2O$.

33. A method according to claim 26, wherein said silicon oxide is obtained by using an oxygen gas and a 1,3,5,7-tetramethylcyclotetrasiloxane gas.

34. A method according to claim 23, wherein said divot defect is filled with the filling material in at least two steps.

35. A method according to claim 23, wherein said flattening film is heated before the flattening film is removed, by irradiating the flattening film with a laser beam, for local heating.

36. A method according to claim 23, wherein said step of filling the divot defect with the filling material is executed by depositing a silicon nitride film by FIB assisted deposition which uses: a gas including a silicon element-containing material; and a gas including a nitrogen element-containing material.

37. A method according to claim 36, wherein said silicon element-containing material is a material having at least one bond selected from the group consisting of an Si-N bond and an Si-H bond.

38. A method according to claim 36, wherein said nitrogen element-containing material is nitrogen or ammonia.

39. A method according to claim 23, wherein said flattening film is made of a material containing carbon which is assisted-deposited by an FIB using a gas selected from the group consisting of a pyrene gas, a styrene gas, a methyl methacrylate gas, a 2,4,4-trimethyl-1-pentene gas, and isoprene gas.

40. A method according to claim 23, wherein said flattening film is made of a material containing gold which is assisted-deposited by an FIB using dimethylgoldhexafluoroacetyl acetonate as a source gas, lot platinum which is assisted-deposited by an FIB using (methylcyclopentadimethyl)trimethylplatinum as a source gas.

41. A method according to claim 23, wherein said material different from the material of the substrate is either a photosensitive resin or a resin which cross-links or decomposes in the presence of charged particles.

42. A method according to claim 23, wherein said projection and said flattening film are removed at a substantially identical processing rate, with processing conditions controlled.

43. A method according to claim 23, wherein said projection and said flattening film are removed by FIB sputter etching wherein an accelerating voltage is controlled.

44. A method according to claim 23, wherein said projection and said flattening film are removed by FIB assisted etching wherein at least one of FIB energy, a gas selection, a gas combination, a gas pressure and a ratio of partial gas pressures is controlled.

45. A method according to claim 44, wherein said FIB assisted etching is executed by use of at least one selected from the group consisting of an $XeF_2$ gas and an oxygen element-containing gas.

46. A method according to claim 45, wherein said oxygen element-containing gas is a gas selected from the group consisting of an $O_2$ gas, an $O_3$ gas, and a $N_2O$ gas.

47. A method according to claim 23, further comprising the step of determining an end point of processing of said projection and said flattening film by measuring secondary particles generated by said projection and flattening film.

48. A method according to claim 23, wherein said portions of the flattening film which remain after the simultaneous removing step are removed by a method selected from the group consisting of: thermal etching using a laser beam; reactive etching using a laser beam in an $O_3$ or $O_2$ atmosphere; an $O_2$ plasma asher; chemical dry etching using a gas which is a mixture of an $O_2$ gas and at least one of a $CF_4$ gas, an $H_2$ gas, an $H_2O$ gas, an $N_2$ gas, an $N_2O$ gas, and an $NO$ gas; either chemical dry etching or RIE using a hydrogen gas element-containing gas; and FIB assisted etching gas or an $O_2$ gas.

49. A method according to claim 48, further comprising removing Ga by use of an acid or alkali.

50. A method according to claim 23, wherein said the flattening film which remain after the simultaneous removing step are removed by wet etching.

51. A method according to claim 50, wherein said wet etching is executed by use of a stripping agent of a photosensitive resin or a resin which cross-links or decomposes in the presence of charged particles.

52. A method according to claim 50, wherein said wet etching is executed by use of an aqua regia.

53. A method according to claim 23, further comprising the step of removing a damaged layer from a surface of the substrate after said projection and said flattening film are simultaneously removed.

54. A method according to claim 53, wherein said damaged layer is removed by assisted etching using a gas containing at least $XeF_2$ or by thermal etching using a laser beam.

* * * * *